US011600988B2

(12) United States Patent
Frampton et al.

(10) Patent No.: US 11,600,988 B2
(45) Date of Patent: Mar. 7, 2023

(54) GROUND FAULT MINIMIZATION

(71) Applicant: Kohler Co., Kohler, WI (US)

(72) Inventors: Isaac S. Frampton, Strattanville, PA (US); Adam Larson, Mequon, WI (US)

(73) Assignee: Kohler Co., Kohler, WI (US)

(*) Notice: Subject to any disclaimer, the term of this patent is extended or adjusted under 35 U.S.C. 154(b) by 223 days.

(21) Appl. No.: 16/925,251

(22) Filed: Jul. 9, 2020

(65) Prior Publication Data

US 2020/0343716 A1 Oct. 29, 2020

Related U.S. Application Data

(63) Continuation of application No. 16/503,786, filed on Jul. 5, 2019, now Pat. No. 10,756,532.

(Continued)

(51) Int. Cl.
*H02H 7/122* (2006.01)
*G01R 31/50* (2020.01)
*H02M 7/00* (2006.01)
*H02M 7/72* (2006.01)
*H02M 1/32* (2007.01)
*H02M 7/5387* (2007.01)

(Continued)

(52) U.S. Cl.
CPC .......... *H02H 7/1227* (2013.01); *G01R 31/50* (2020.01); *H02H 7/1225* (2013.01); *H02M 1/32* (2013.01); *H02M 7/003* (2013.01); *H02M 7/53871* (2013.01); *H02M 7/72* (2013.01); *H02H 9/08* (2013.01); *H02M 1/12* (2013.01)

(58) Field of Classification Search
None
See application file for complete search history.

(56) References Cited

U.S. PATENT DOCUMENTS 3,857,070 A 12/1974 Smith
5,214,575 A 5/1993 Sugishima
(Continued)

FOREIGN PATENT DOCUMENTS

CN 201541127 U 8/2010
CN 109787203 A 5/2019
(Continued)

OTHER PUBLICATIONS

Second Office Action in Chinese Patent Application No. 201910630146.7, dated Nov. 19, 2021, 5 pages (including English translation).
(Continued)

*Primary Examiner* — Matthew V Nguyen
(74) *Attorney, Agent, or Firm* — Lempia Summerfield Katz LLC

(57) ABSTRACT

A circuit for minimizing energy provided to a ground fault includes a source, a multiple switches, an output filter, and a controller. The switches include a first side pair of switches and a second side pair of switches configured to provide an output signal based on the source. The output filter includes one or more energy storage elements coupled to the first side pair of switches or the second side pair of switches. The controller is configured to receive a ground fault signal that indicates a fault has occurred and configured to generate a switch signal for the switches for a minimum energy state of the output filter and in response to the ground fault signal.

20 Claims, 39 Drawing Sheets

Related U.S. Application Data

(60) Provisional application No. 62/697,697, filed on Jul. 13, 2018.

(51) Int. Cl.
*H02M 1/12* (2006.01)
*H02H 9/08* (2006.01)

(56) References Cited

U.S. PATENT DOCUMENTS

| | | | |
|---|---|---|---|
| 5,396,117 | A | 3/1995 | Housen |
| 5,483,167 | A | 1/1996 | Mikami |
| 6,320,769 | B2 | 11/2001 | Kurokami |
| 6,633,473 | B1 | 10/2003 | Tomomatsu |
| 6,927,955 | B2 | 8/2005 | Suzui |
| 7,068,037 | B2 | 6/2006 | Kim |
| 7,079,406 | B2 | 7/2006 | Kurokami |
| 7,167,007 | B2 | 1/2007 | Coffeen |
| 7,233,465 | B2 | 6/2007 | Lee |
| 7,593,209 | B2 | 9/2009 | Ioannou |
| 8,004,806 | B2 | 8/2011 | Li |
| 8,035,946 | B2 | 10/2011 | Eriksson |
| 8,164,298 | B2 | 4/2012 | Anwar |
| 8,310,242 | B2 | 11/2012 | Itten |
| 8,743,523 | B2 | 6/2014 | Acharya |
| 8,897,040 | B2 * | 11/2014 | Holliday ............ H02H 9/04 363/56.02 |
| 9,046,560 | B2 | 6/2015 | Li |
| 9,091,742 | B2 | 7/2015 | Wei |
| 9,322,852 | B2 | 4/2016 | Chen |
| 9,606,163 | B2 | 3/2017 | Ando |
| 9,784,785 | B2 | 10/2017 | Farquhar, III |
| 10,004,123 | B1 | 6/2018 | Yang |
| 10,116,247 | B2 | 10/2018 | Yamada |
| 2011/0141774 | A1 | 6/2011 | Kane |
| 2015/0084654 | A1 * | 3/2015 | Mueller ............ G01R 27/16 324/713 |
| 2015/0130379 | A1 | 5/2015 | Ando |
| 2016/0313389 | A1 | 10/2016 | Wilson |
| 2017/0279269 | A1 | 9/2017 | Durth |
| 2017/0279374 | A1 | 9/2017 | Friebe |
| 2017/0288396 | A1 | 10/2017 | Fraiman |
| 2017/0302165 | A1 | 10/2017 | Marcinkiewicz |
| 2017/0317500 | A1 | 11/2017 | Kumar |
| 2018/0205372 | A1 | 7/2018 | Sasaki |
| 2019/0149145 | A1 | 5/2019 | Yang |
| 2020/0014309 | A1 | 1/2020 | Mortensen |
| 2020/0182934 | A1 * | 6/2020 | Chai ............ G01R 31/2632 |

FOREIGN PATENT DOCUMENTS

| | | | |
|---|---|---|---|
| DE | 102013212698 A1 * | 3/2014 | ............ H02H 7/09 |
| DE | 102018116032 A1 | 1/2020 | |
| JP | 2002218656 A | 8/2002 | |
| JP | 2010187513 A | 8/2010 | |
| KR | 100455434 B1 | 11/2004 | |
| KR | 100608208 B1 | 7/2006 | |
| KR | 1020160118693 A | 10/2016 | |
| WO | WO2014126357 A1 | 8/2014 | |

OTHER PUBLICATIONS

Chinese Office Action for Chinese Application No. 201910630146.7 dated Apr. 25, 2021.
European Search Report for European Patent Application No. 19185778.8—1202 dated Nov. 29, 2019.
Masrur, Abul M, et al. "Intelligent Diagnosis of Open and Short Circuit Faults in Electric Drive Inverters for Real-Time Applications." IET Power Electronics 3.2. Mar. 3, 2009. (pp. 1-21).
Murray, David, et al. "High Resistance Grounding—Avoiding Unnecessary Pitfalls." IEEE Transactions on Industry Applications vol. 45, No. 3. May/Jun. 2009. (pp. 1146-1154).
Plet, Cornelis A., et al. "Fault Response of Grid-Connected Inverter Dominated Networks." IEEE PES General Meeting. IEEE. 2010. (pp. 1-7).
Wang, Wen, et al. "Principle and Design of a Single-Phase Inverter-Based Grounding System for Neutral-to-Ground Voltage Compensation in Distribution Networks." IEEE Transactions on Industrial Electronics vol. 64, No. 2. Feb. 2017. (pp. 1204-1213).

* cited by examiner

GROUND FAULT MINIMIZATION

CROSS REFERENCE TO PRIOR APPLICATIONS

This application is a continuation under 35 U.S.C § 120 and 37 C.F.R. § 1.53(b) of U.S. patent application Ser. No. 16/503,786 filed Jul. 5, 2019, which claims the benefit of U.S. Provisional Application Ser. No. 62/697,697 filed Jul. 13, 2018, and each of which is hereby incorporated by reference in its entirety.

FIELD

This application relates to the field of inverters, and more specifically, to grid-tied inverters where efficiency of conversion and robustness are high-priority considerations. This application relates to the field of ground fault detection and management. More specifically, circuitry and techniques are provided that minimize the amount of energy dissipated through a ground fault.

BACKGROUND

An inverter device may convert direct-current electrical power into alternating current electrical power. An inverter may be uni-directional, converting direct current (DC) power from a source to alternating current (AC) power out, or bi-directional, converting DC power from a source to AC power out as well as converting AC power from a source to DC power out to a load or storage device.

A grid-tie or grid-tied inverter is an inverter that is specifically designed to have the AC portion of the inverter connected to the power grid. A grid-tied inverter may be designed to operate within a window of operation for the utility voltage. A grid-tied inverter may be uni-directional or bi-directional. A uni-directional inverter may be used to convert a direct current input from a source, like a solar array, fuel cell or battery, to alternating current at the appropriate frequency and voltage to be received by the power grid. A bi-directional inverter may be used to convert alternating current from the power grid to a direct current to be received by a DC load or an energy storage device, such as an electrochemical element like a fuel cell or battery or an electromagnetic storage element, such as an ultracapacitor.

A ground fault occurs when a current carrying electrical path in a circuit comes into electrical contact with a ground path. The ground path may be a wire (e.g., ground wire) or a portion of a grounded part of an appliance or device. Example grounded parts may include a chassis or frame of the appliance or device.

Ground faults may occur in a variety of scenarios. Damage to the appliance or device may result in the ground fault. In other examples, a human or animal may become the electrical path between the current carrying path and the grounded parts.

The response time in the detection of a ground fault and isolating the ground fault from additional electrical current is vital in preventing damage. Especially in the case of a ground fault caused by a human or animal, the risk of electrical shock is reduced when the ground fault is quickly detected and/or current is prevented from traveling to the ground fault.

BRIEF DESCRIPTION OF THE DRAWINGS

Exemplary embodiments are described herein with reference to the following drawings.

DETAILED DESCRIPTION

Figure 1:
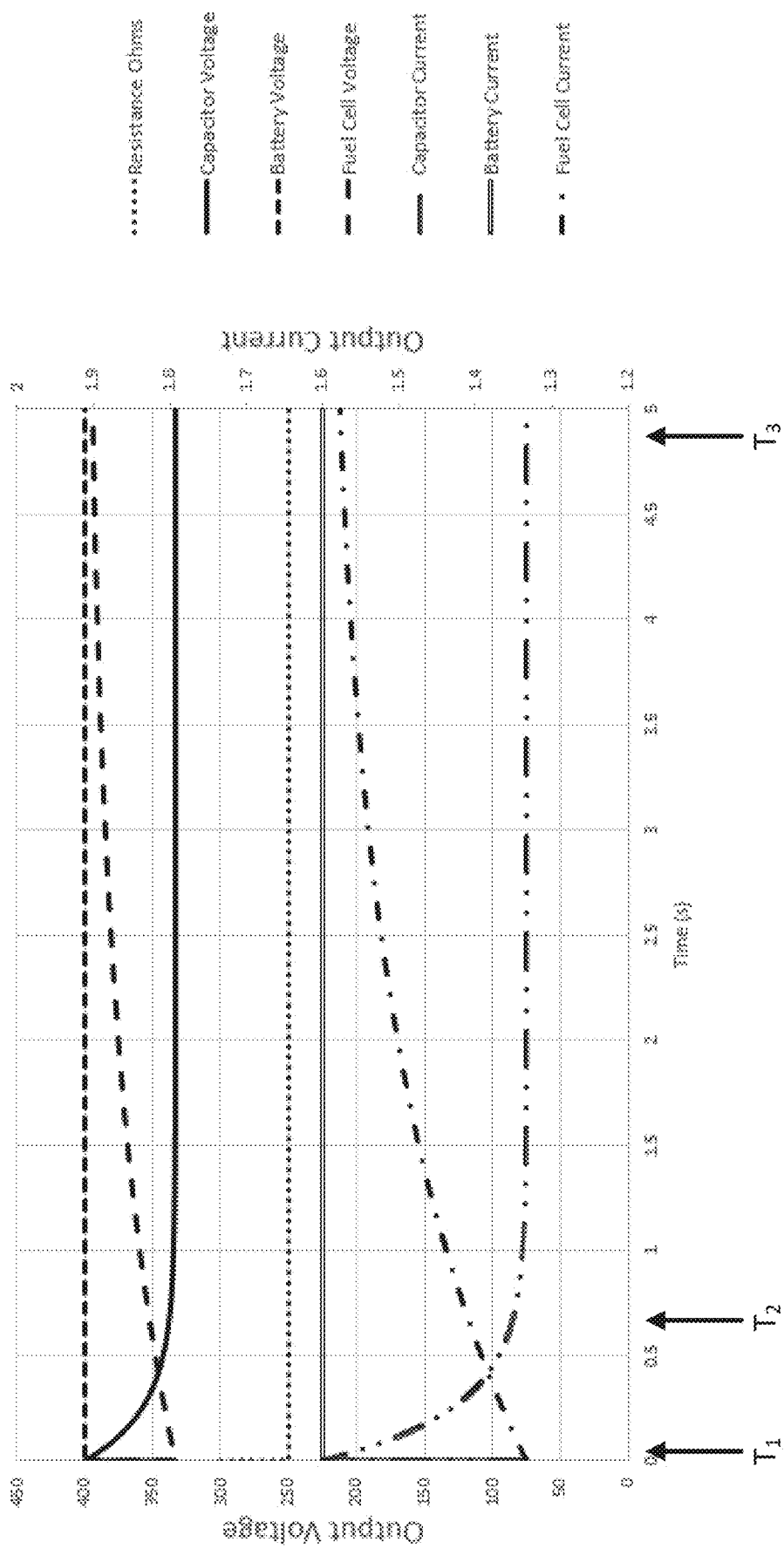
FIG. 1 illustrates 5 seconds of response characteristics of three example DC energy sources with capability to produce or absorb energy.

An inverter system that allows for operation with a variety of sources, loads, and other devices in parallel operation, where the inverter contains discrete surge suppression modules which can detect an inability to protect the system and are replaceable during operation of the inverter. The inverter automatically detects source characteristics, load characteristics or devices in parallel with the output and selects a mode of operation based on a variety of factors, including user configuration and user input. The inverter discerns different devices in parallel and chooses a mode of operation suitable for the detected operational mode. The inverter determines internal system characteristics and provides predictive estimates allowing tighter output control.

A bi-directional inverter may be coupled to a power source which is capable of absorbing and sourcing power, such as a battery, ultracapacitor or fuel cell. This power source may be able to absorb energy at a high rate, a low rate, or a rate which is limited relative to the previous operating rate. As an example, an ultracapacitor may be able to absorb all the energy it can store in a second without damage. As another example, a battery may not be able to absorb energy faster than a rate which would fully charge it in a second. As yet another example, a fuel cell may be able to absorb up to its rated output power of energy, but not be able to change the rate more quickly than 1%/second from the previous energy production or absorption rate.

A grid tied inverter may be subjected to external voltage surges from the utility caused by environmental factors, such as a lightning strike, equipment malfunction, such as incorrect switching of a multi-tap voltage regulator on the line or lightning arrestor failure, or human error, such as a collision with a power pole. These surges are applied to the output of the inverter, potentially damaging components within the inverter.

While a transformer, commonly used by utilities for transmission and distribution of power, may provide an impedance that allows the output voltage amplitude to vary with changes in the load current amplitude, an inverter may provide a nearly constant voltage throughout an allowable operating range of the inverter.

As an example, an inverter may contain large, low impedances switches and a highly-efficient output filter, causing minimal variation in voltage with increasing load. An inverter may also have an output amplitude correction mechanism to adjust for varying load on the output, further decreasing the voltage amplitude variation relative to the current amplitude. Other techniques to correct output, such as capacitor current feedback, modeled filter offset, and output current correction or feed-forward will provide similar correction with variation in the reaction time to a load transient.

As another example, an inverter may also operate in a closed-loop manner, where the output voltage of the inverter is actively controlled to a sinusoid or some other signal. An inverter operating in closed-loop may correct for any load-related fluctuations in the output signal quickly enough that no variations are detectible in the measured amplitude of the output. Closed-loop inverters may include current feedback or filter modeling techniques as well to decrease the required control loop gains, but these techniques are not fundamentally necessary for this topology.

When coupled with a utility transformer or to the grid through several utility transformers, the differences in the behavior of the inverter from the behavior of the transformers may result in large variations in the power provided by the source feeding the grid through the inverter and the changes in the power provided by the utility. This is especially noteworthy in cases where the output amplitude is corrected, such as inverted with output amplitude correcting feedback or closed-loop inverters. An additional concern with closed-loop inverters is that possibility or producing harmonic currents if the grid voltage is not sinusoidal and the inverter is targeting a sinusoidal output.

The differences in behavior between a closed-loop inverter control and an amplitude-corrected inverter control may not be distinguishable to a simple root mean squared (RMS) measurement of the waveform, but closed-loop inverters with high switching frequencies may be capable of rejecting harmonics above the $100^{th}$ order. While this behavior is preferred to minimize output total harmonic distortion (THD), it may also result in large harmonic currents flowing between the closed-loop inverter and the power grid, connected synchronous machines, power electronics such as variable-frequency drives, or even amplitude-corrected inverters, which may produce higher harmonic content, especially at higher frequencies.

FIG. 1 illustrates a time plot representing 5 seconds of response characteristics to changing loads for three example DC energy sources with capability to produce or absorb energy. The battery voltage has a momentary dip due to the required time to accelerate charge carriers in the electrolyte when load is applied at time T1. The capacitor voltage does not experience a dip at time T1, but begins slowly discharging at time T1. The fuel cell voltage dips significantly at time T1 until the internal rate of ion transfer through the membrane has time to change.

By time T2, the capacitor voltage has decreased to a stable point, matching the input and output currents. By time T3, the fuel cell has recovered to a new nominal voltage level. The fuel cell voltage may not recover to the open-circuit terminal voltage of the cell.

Figure 2:
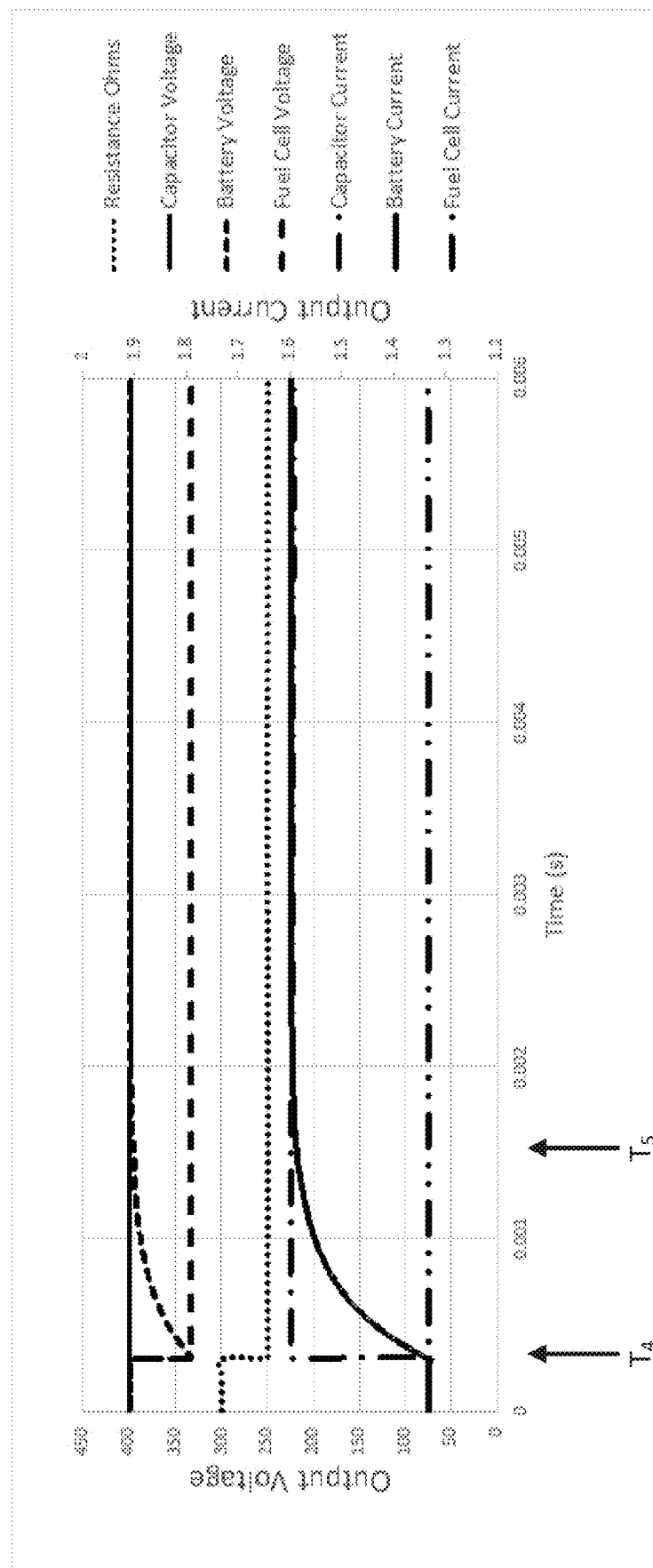
FIG. 2 illustrates 6 milliseconds of response characteristics of the three example DC energy sources with capability to produce or absorb energy illustrated over a longer time in FIG. 1

FIG. 2 illustrates a short time period of the behavior of the three sources illustrated in FIG. 1. The shorter time span allows review of the battery behavior when a load is suddenly applied. At time T4, the load changes and the battery voltage dips momentarily due to the required change in the current to maintain output voltage. By time T5, the battery current has increased to the new required level, allowing the voltage to recover. Battery voltage may not fully recover to nominal voltage due to internal resistance and electrical potential required to maintain charge mobility.

Figure 3:
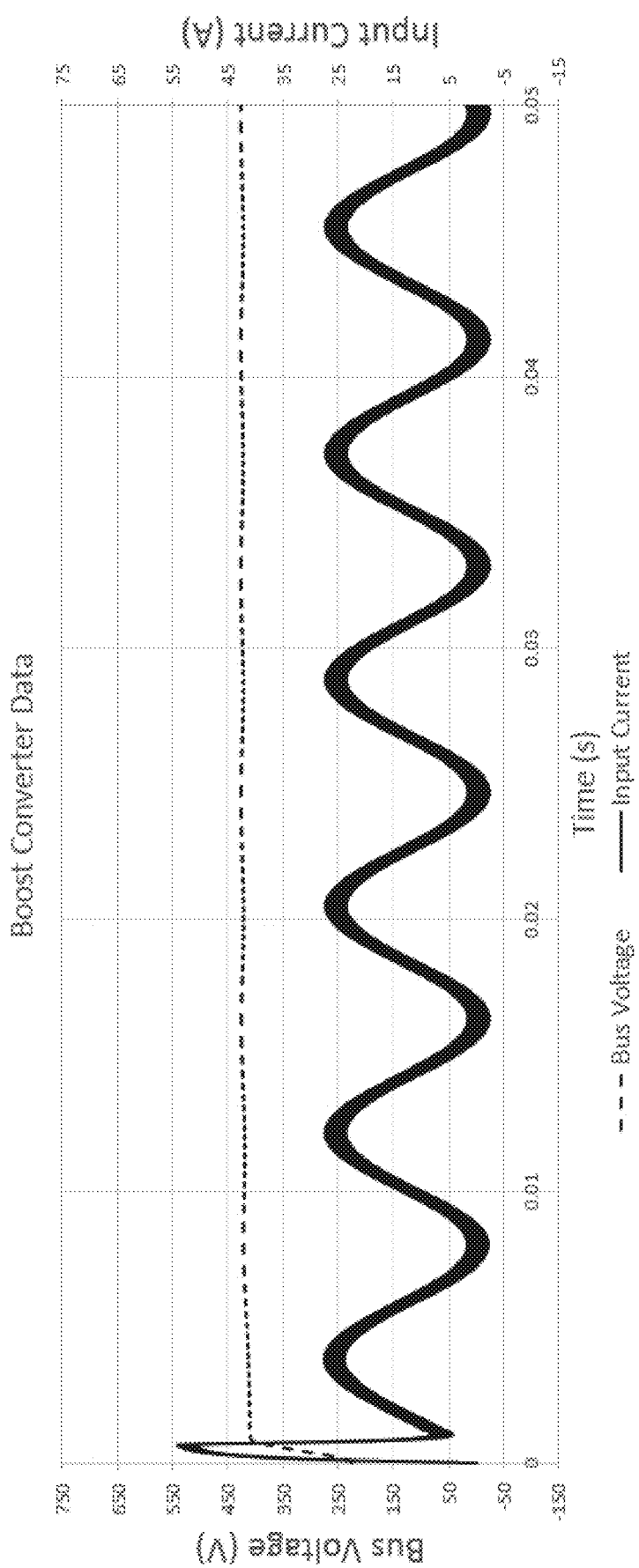
FIG. 3 illustrates an example supply current waveform from a battery to a grid-tie inverter sourcing single-phase 60 Hz AC power at unity power factor.

FIG. 3 illustrates an example supply current waveform from a battery to a grid-tie inverter sourcing single-phase 60 Hz AC power at unity power factor. The internal DC bus voltage displayed is applied to the DC link inside the inverter, such as the DC link capacitor illustrated as 75 in FIG. 7 and 81 in FIG. 8. The input current displayed is measured at the input to the inverter from a 225V DC source.

The 120 Hz AC component on the DC current input to the inverter illustrated in FIG. 3 is due to the sinusoidal nature of the output. Both the positive and negative half-cycle source power to the load, but no power is sourced to a resistive load when the voltage crosses 0 because the power is the instantaneous product of the voltage and current. For a resistive load, the input power profile looks like a 120 Hz sinusoid with a DC offset that would allow calculation of average power by multiplying by the input voltage.

The thickness of the current waveform illustrated in FIG. 3 is due to ripple current on the inductor for the boost converter. The current increases while a boost switch is active, then decreases when the boost switch is deactivated, increasing in voltage to allow the current to continue to flow in the inductor and allowing increase in voltage from the input voltage to the DC bus voltage. This ripple may have an undesirable effect on the source, depending on the size and type of the source and the frequency of the boost converter switching.

Figure 4:
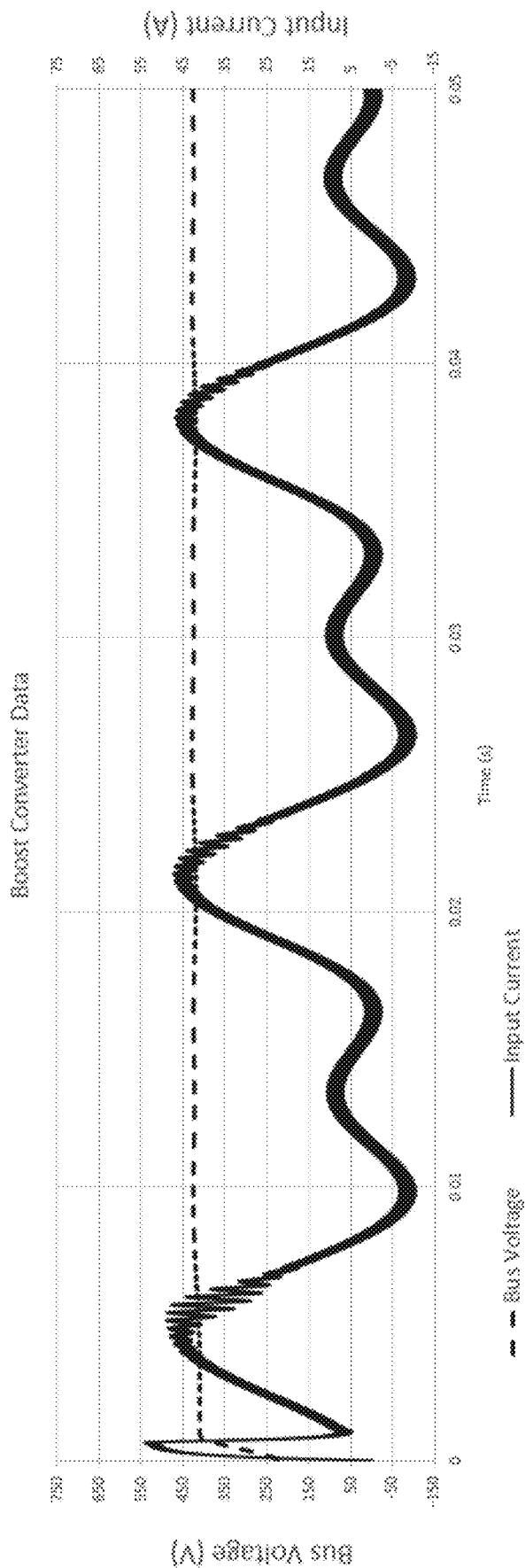
FIG. 4 illustrates another example supply current waveform from a battery to a bi-directional grid-tie inverter sourcing single-phase 60 Hz AC power at 0.8 power factor.

FIG. 4 illustrates another example supply current waveform from a battery to a bi-directional grid-tie inverter sourcing single-phase 60 Hz AC power at 0.8 power factor. In this case, the current waveform crosses through zero, meaning that the inverter is charging the battery for portions of the output cycle. The energy to charge the battery is taken from stored energy in the inductive load element connected to the output of the inverter during portions of the alternating cycle when the energy in the inductive load element is decreasing.

Although some sources, such as a battery or fuel cell, are capable of absorbing power, other sources, such as a solar panel or an AC device supplying DC power through a rectifier using simple diodes, are not capable of absorbing power, even if these sources can handle ripple on the current. While such devices may be capable of operating with a unity power factor, where the current direction is always into the inverter, the devices are not capable of absorbing the current returned to the source during the discharging of the energy storage element connected to the inverter.

When attempting to return current to the source, the bi-directional boost converter may apply the full voltage of the DC link within the inverter to the input. Some devices may be able to handle full bus voltage applied to their output. In this case, the DC bus voltage will increase with the returning energy from the load. Some devices may not be able to handle to full voltage of the DC bus in the inverter, especially in applications where the boost ratio of the converter is high (e.g. 1:10 boost). In these cases, the boost converter must prevent reversal of the input current to prevent damage to the source.

Some boost converters utilize a diode for the connection between the DC link and the boost inductor or transformer. These boost converters are uni-directional converters, being unable to return current to the DC supply. By design, it is not necessary for a uni-directional inverter to have a uni-directional boost converter. For example, use of a field-effect transistor (FET) instead of a simple diode is a common solution to improve efficiency of an inverter, but allows bi-directional power transfer to and from the DC bus. Failure of the source due to overvoltage is not typically a concern with a uni-directional boost converter but can still be a concern with a uni-directional inverter if the boost converter is bi-directional.

The DC average of the input current illustrated in FIG. 4 may still be used to compute the average power provided from the battery to the inverter by multiplying by the battery voltage. The average power is primarily related to the resistive load on the inverter but does increase slightly with reactive load due to the alternating current that is flowing through the boost converter.

Similarly to the input current waveform for FIG. 3, the input current waveform for FIG. 4 illustrates a significant thickness representing the high-frequency ripple on the waveform. This ripple is caused by reversing the voltage across the inductor while boosting voltage and occurs at the switching frequency of the boost converter.

Figure 7:
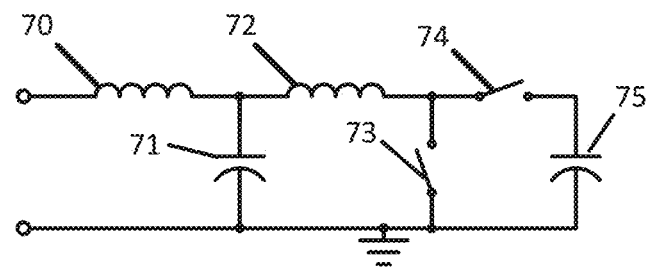
FIG. 7 illustrates an example circuit for a bi-directional boost converter containing an input filter in addition to the boost inductor.

Referring to FIG. 2 to determine capabilities of the battery source for the inverter illustrated in FIG. 4, the battery is capable of handling the low-frequency ripple at 120 Hz, but not the high-frequency ripple at the switching frequency of the boost converter (e.g. 20 kHz to 200 kHz). A capacitor may be placed in parallel with the battery in order to supply the rapidly-changing current demand. An inductor-capacitor (LC) filter, such as shown in FIG. 7, may also reduce the ripple current seen by the battery, with potentially enough decrease in capacitance to reduce the overall filter cost.

Figure 5:
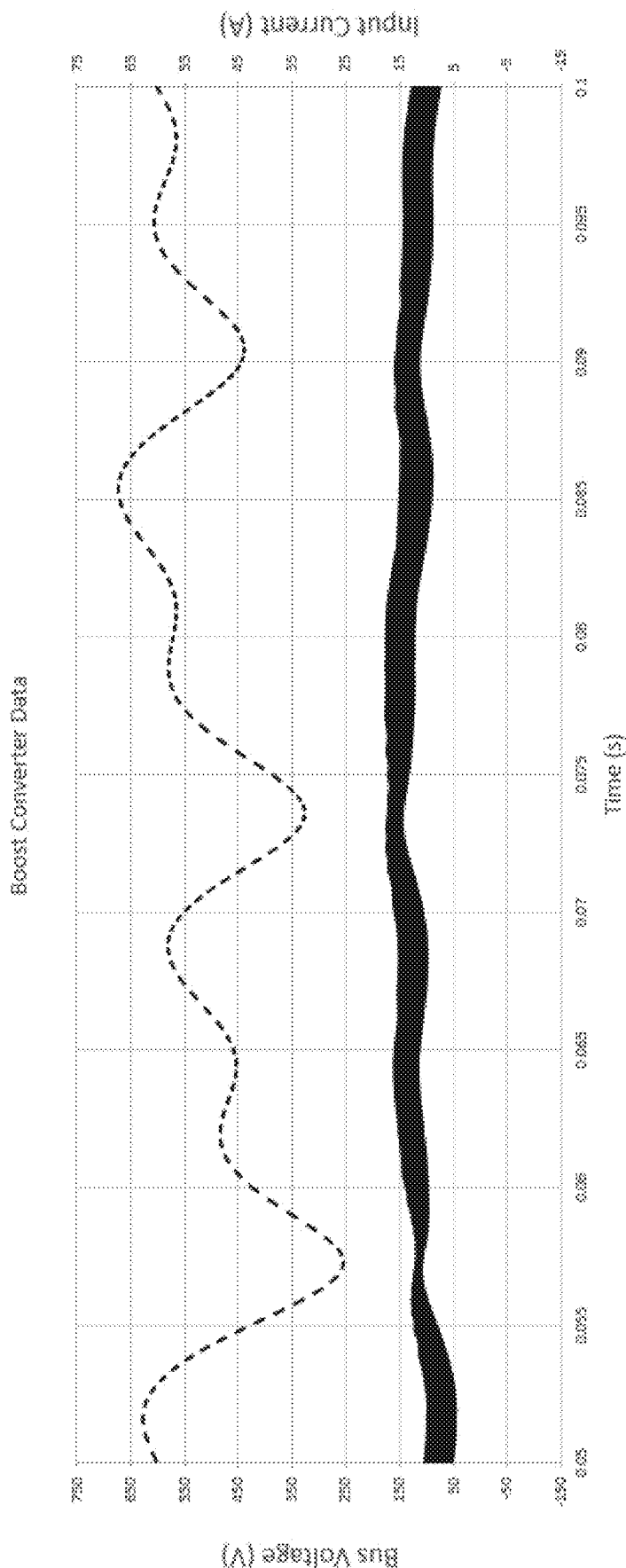
FIG. 5 illustrates the bus voltage and input current profiles for two example techniques of controlling a bi-directional boost converter.

FIG. 5 illustrates the bus voltage and input current profiles for two example techniques of controlling a bi-directional boost converter. Referring for comparison back to FIG. 4 that illustrates a conventional bi-directional boost converter control strategy, regulating the DC bus voltage to a substantially constant value, FIG. 5 illustrates an alternate control strategy for a bi-directional boost converter control strategy where the input current is regulated to a substantially constant value, while the voltage on the DC link is allowed to vary. This approach effectively utilizes the DC link capacitance as an energy storage element in lieu of using the power source as an energy storage element or in cases where the power source is not able to store energy. A combination of the two approaches may be used.

Figure 6:
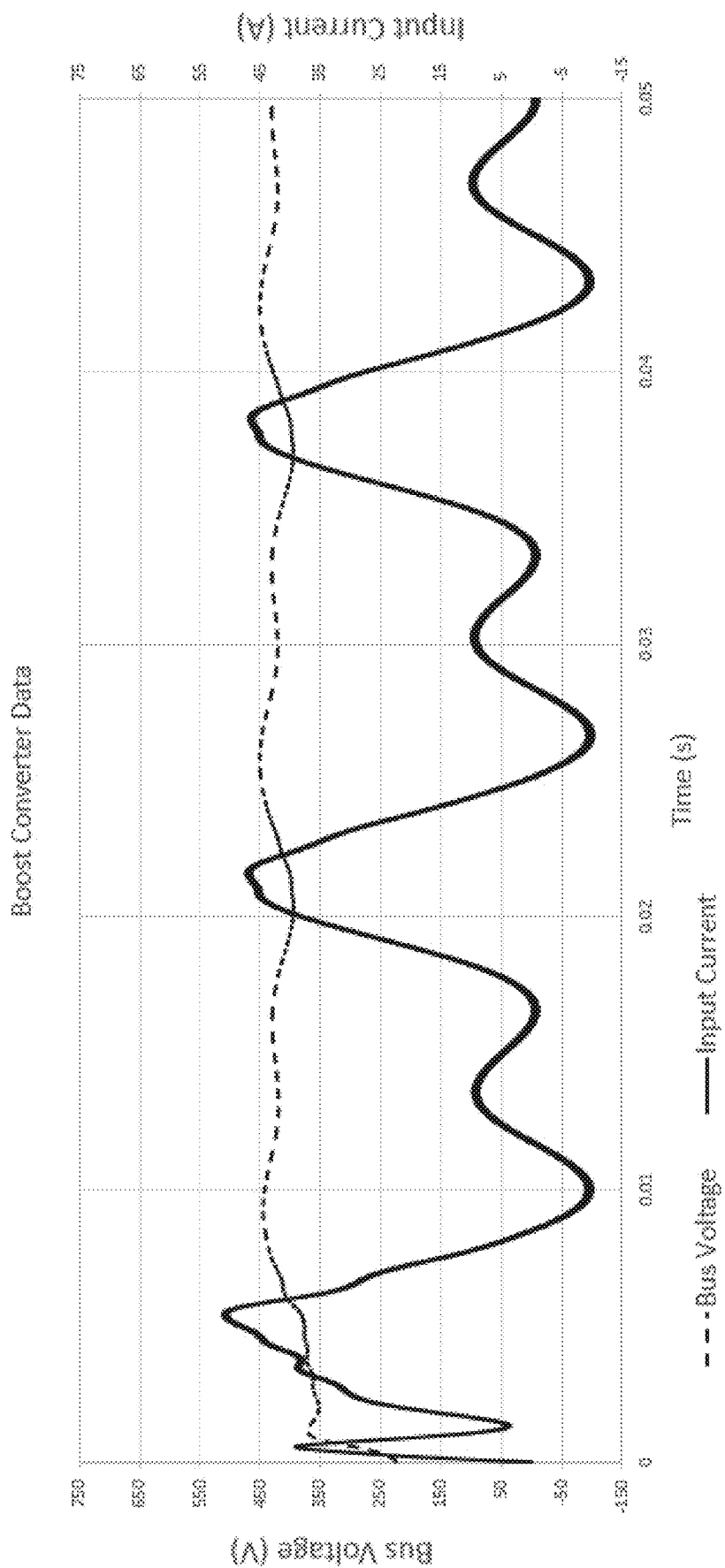
FIG. 6 illustrates input current profiles for boost converters using two different inductors.

FIG. 6 illustrates input current profiles for boost converters using two different inductors. Referring for comparison back to FIG. 4 that illustrates an input current profile for a boost converter using a smaller inductor, e.g. 260 uH, while FIG. 6 illustrates an input current profile for a boost converter using a larger inductor, e.g. 1 mH. Both example boost converters are switching at 100 kHz.

The width of the input current waveform illustrated in FIG. 6, representing the ripple on the input current, is significantly lower than the width of the input current waveform for FIG. 4. This decrease in ripple is a consequence of the increase of the inductance of the boost converter inductor. The higher inductance reduces the current slew rate, limiting the extent of the current change and therefore the ripple.

While additional inductance for the boost converter producing the behavior show in FIG. 6 would reduce the ripple on the input current, it may not be immediately obvious that such a change may also decrease the response speed of the boost converter and increase the voltage ripple and settling time of the DC link capacitor 75 voltage. The larger inductance and corresponding decrease in the current slew rate increases the time required for the boost converter to change the input current and thereby control the DC link capacitor 75 voltage. This increase in voltage ripple and settling time may be considered an undesirable effect, to be weighed against the undesirable effect of the input current ripple.

In addition, increasing the inductance of the boost inductor may result in an increase in the cost of the boost inductor, a decrease in the peak current capacity, or a combination of the factors. The physical size of the boost inductor may also increase, as well as the hysteresis and winding loss in the inductor. Given the factors described above, it is desirable to reduce the input current ripple without increasing the inductance of the boost converter inductor.

The examples illustrated above refer to a single-phase inverter case. A three-phase inverter with balanced phase loading does not exhibit any ripple on the input current due to the relative phasing of the three phases. One phase is always drawing positive power in a three-phase configuration, such that with a balanced load, the three current's sum to a DC input. Consideration of a single phase of a three-phase inverter allows support for a maximum imbalance on the output currents, which is a possible case in some applications.

Depending on the inverter source topology, inverters may not be connected to a common source. Connection to separate sources, while effectively separating the inverters and requiring additional control of the boost converter, may provide additional benefits. Additional benefits may include allowing connection of the inverters to the grid without input or output isolation transformers, allowing support of imbalanced loads, and reconnection into a variety of output configurations. As an example, three isolated inverters may be connected in series to provide increase voltage with a single-phase input. As another example, three isolated inverters may be connected in parallel to provide increase single-phase current. As yet another example, three isolated inverters may be connected in a delta configuration.

FIG. 7 illustrates an example bi-directional boost converter containing an input filter in addition to the boost inductor 72. The input filter inductor 70 may have a significantly lower inductance than the boost inductor 72. As an example, the input filter inductor 70 may have an inductance of 1 uH while the boost inductor may have an inductance of 260 uH. The input filter capacitor 71 may have a significantly lower capacitance than the DC link capacitor 75. As an example, the input filter capacitor 71 may have a capacitance of 400 uF while the DC link capacitor may have a capacitance of 2000 uF.

The input filter inductance and capacitance requirements may be determined by a need to reduce the input current ripple to a given level, by a need to provide a more stable input voltage to the boost converter, a combination of both, or neither. The effective impedance of the input filter to the boost converter switching frequency (e.g. 20 kHz or 200 kHz) is significantly different than the effective impedance to a current variation frequency, such as that supplied to a single-phase inverter (e.g. 100 Hz or 120 Hz).

Because the switching frequency directly effects the impedance of the filter elements, an input filter designed only to remove the switching frequency ripple may not need to be large or expensive.

Figure 8A:
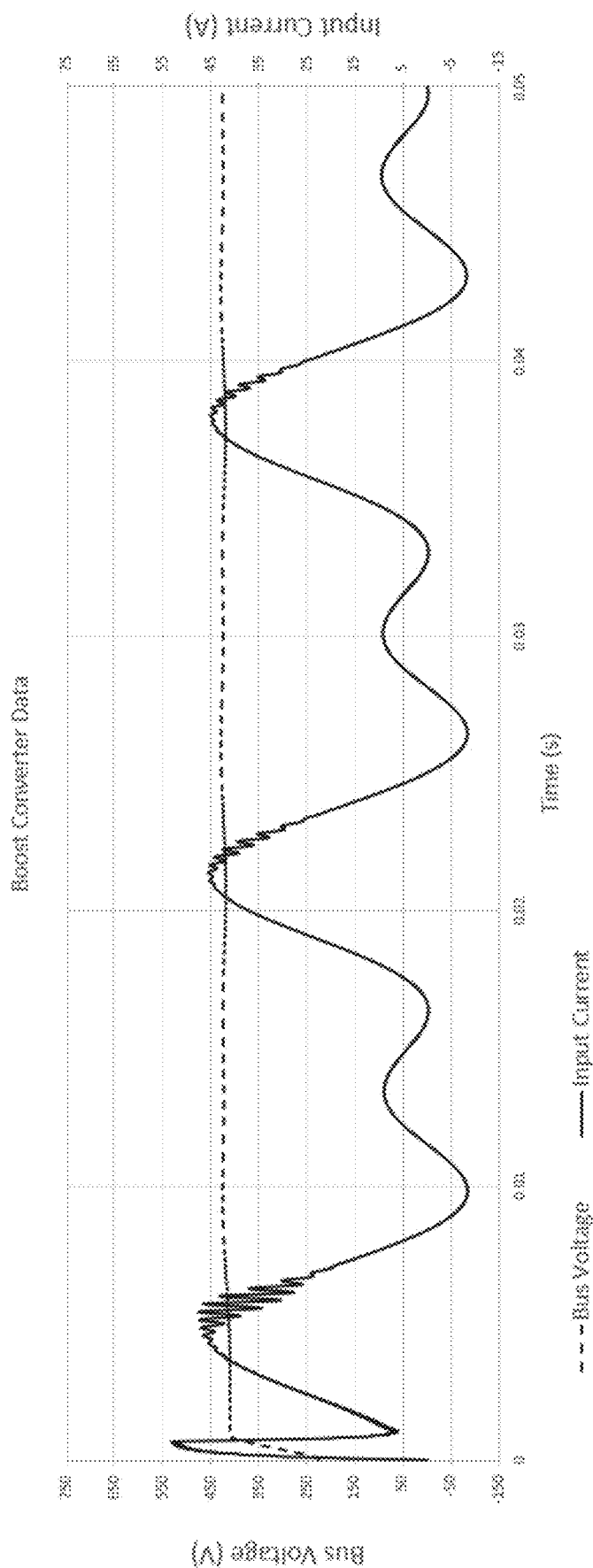
FIGS. 8A and 8B illustrate input current profiles for boost converters utilizing an input filter in conjunction with different boost converter control techniques.
Figure 8B:
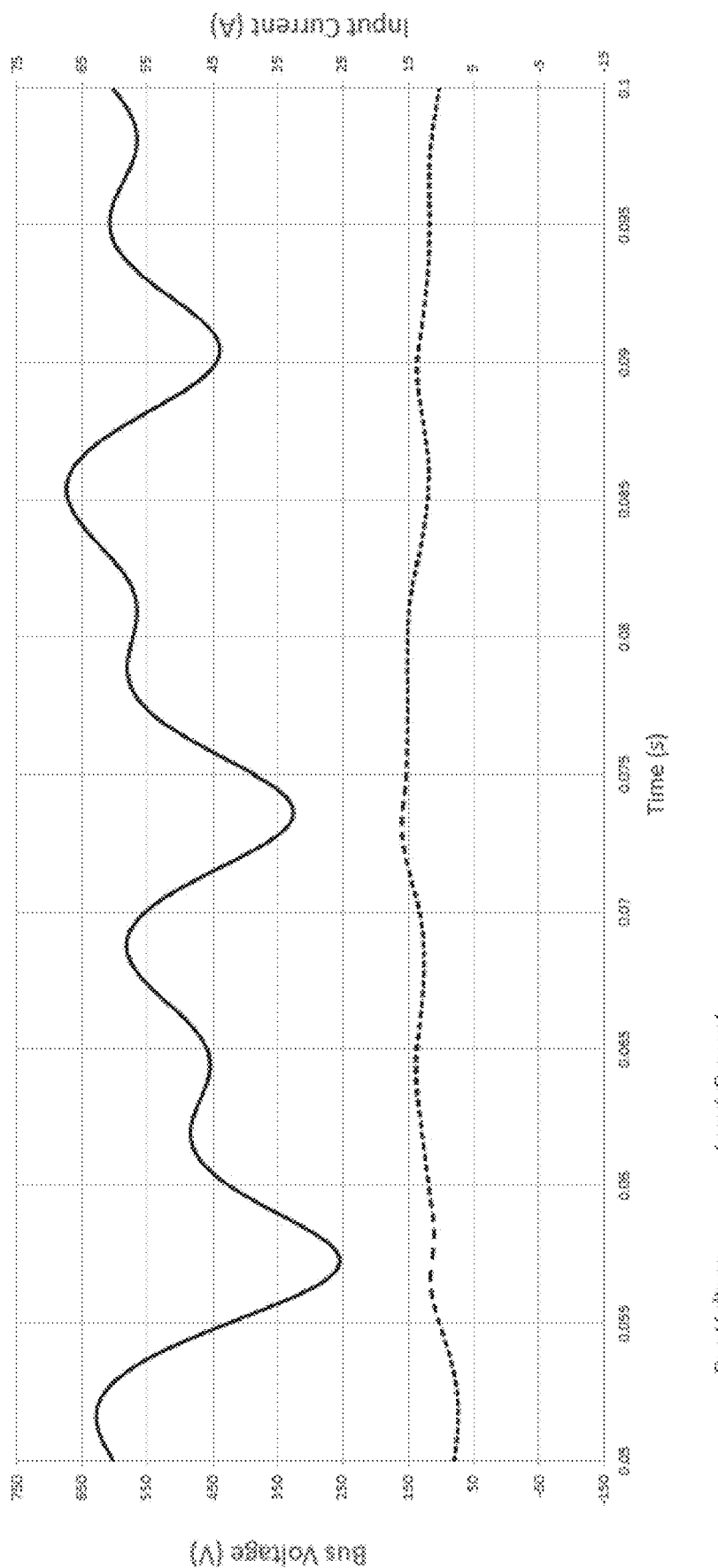

FIGS. 8A and 8B illustrates input current profiles for boost converters utilizing an input filter in conjunction with different boost converter control techniques. The input current profiles in the example still contain any low frequency variations in the signal (such as the current variation through the output cycling at 100 Hz or 120 Hz), but have greatly reduced the high-frequency (e.g. 100 kHz) ripple on the waveform.

In cases where the inverter is fed by a slow-responding device, such as a fuel cell, the input filter may be coupled with the alternative control strategy illustrated in FIG. 8B. In cases where the inverter is fed by a quicker-responding device, such as a battery, the input filter may be sufficient to allow the device to operate properly by minimizing the high-frequency (e.g. 100 kHz) ripple on the battery input current, while the battery may handle the low-frequency (e.g. 120 Hz) ripple without trouble, as illustrated in FIG. 8A.

In some cases, it may be possible to detect the type of source feeding the inverter and to select the correct operational strategy to operate the source within its capabilities. As an example, the response data illustrated in FIGS. 1 and 2 may provide sufficient differentiation to allow the inverter to determine the type of source feeding it.

Figure 9:
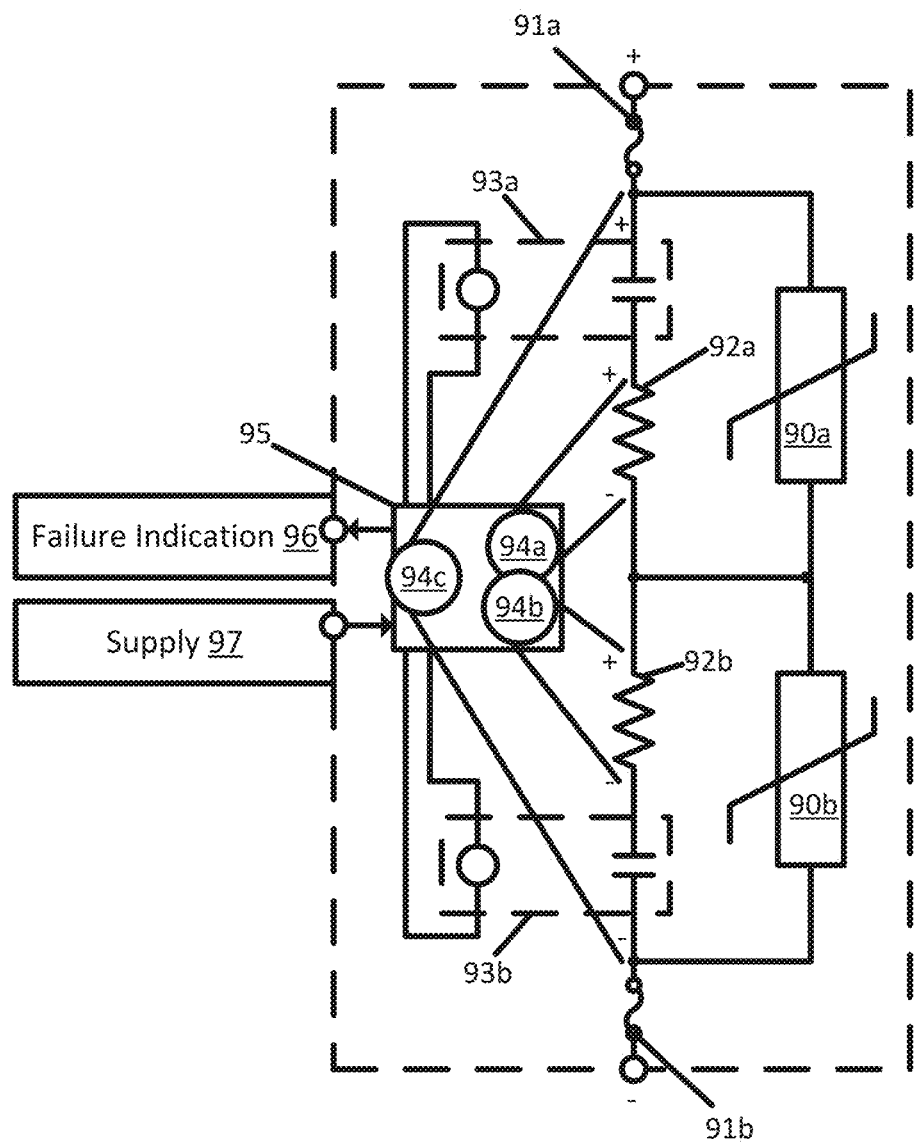
FIG. 9 illustrates an example surge suppression device.

FIG. 9 illustrates an example surge suppression device, operating to limit the voltage on the DC link within a safe level. The surge suppression device may only act under conditions where the inverter output receives a surge, such as when connected to the utility in the event of a lightning strike. The surge suppression device may operate a single time or multiple times. The number of times the surge suppression device operates may be related to the intensity or amplitude of the surge event.

The surge suppression device may contain an element or elements (e.g., a variable resistance component) designed to offer a variable resistance or to conduct at a pre-defined voltage, such as a metal oxide varistor (MOV) 90a, 90b, gas discharge tube, thermistor, or Zener diode. The variable resistance component limits the bus or DC link to a voltage. The variable resistance component is coupled to the inverter directly, or indirectly by way of a fuse or other component. The surge suppression device may include a semiconductor component which is activated by control circuitry that provides a control signal to the semiconductor component. The semiconductor component may be used in place of the variable resistance component or in parallel to the variable resistance component. The semiconductor component may be a crowbar that clamps to zero volts. This prevents the variable resistance device from being damaged or destroyed in a high voltage condition.

The control signal may specify a selected mode. As an example, the surge suppression device may include an insulated-gate bipolar transistor (IGBT) which is operated in linear mode (e.g., selected mode) to clamp the bus voltage to a level. As another example, the surge suppression device may include a latching semiconductor device, such as a silicon controlled rectifier (SCR), that drains the DC link voltage to a predetermined level or to 0 before resetting. In addition, the surge suppression device may contain a non-resettable component, such as a fuse 91a or 91b.

The surge suppression device may contain a plurality of variable resistance elements and/or a plurality of semiconductor elements. The surge suppression device and control circuit may contain failure sensing logic 95 and failure sensing devices that allow for detection of the failure of one or more elements in the variable resistance elements and/or the semiconductor elements. The sensing devices may be sensing resistors 92a, 92b, allowing small currents to flow through variable resistance elements to prove that the elements still provide continuity. The sensing resistors 92a, 92b, are connected in parallel to the corresponding variable resistance components (e.g., MOV 90a, 90b). The sensing resistors 92a, 92b are example sensing components, and other component types may be used for the sensing components.

The voltage across the sensing devices may be measured by voltage meters 94a, 94b (e.g., voltage detection devices) to establish that the elements operate at the correct voltages. The voltage meters may provide information to the failure sensing logic 95. The sensing devices may be selectively connectable in the circuit using switching devices such as dry contacts of relays 93a, 93b. The relays 93a, 93b may be controlled by the failure sensing logic 95. The relays 93a, 93b may be selectively activated by the failure sensing logic 95. The relays 93a, 93b are connected to the sensing resistors 92a, 92b, respectively, and the inverter.

The surge suppression device may also contain a bus voltage sensor 94c (e.g., direct current voltage sensor) that is coupled to the direct current link of the inverter. The bus voltage sensor 94c may be connected to the bus constantly or only be connected occasionally. The DC link voltage sensor 94c may be used to selectively activate a semiconductor element to decrease the DC link voltage to a predetermined threshold. The bus voltage sensor 94c may provide information to the failure sensing logic 95. The failure sensing logic 95 may use information from the DC link voltage sensor 94c and the voltage meters 94a, 94b to determine a conduction voltage for the variable resistance elements, such as the MOVs 90a, 90b. The conduction voltage may be compared to a threshold (e.g. 400V) to determine if the variable resistance elements are operating as expected. The control circuit including the failure sensing logic 95 is configured to detect a failure in the variable resistance component or in the semiconductor component in response to data from the direct current link voltage sensor. Specifically, the failure sensing logic 95 analyzes information from the voltage detection device 94a, voltage detection device 94b, and the direct current link voltage sensor 94c to determine a conduction voltage for the first variable resistance component and the second variable resistance component.

In the example illustrated in FIG. 9, the surge suppression device contains two variable resistance elements MOVs 90a, 90b. In the condition where the conduction voltage of one of the series-connected elements was lower than a normal operating voltage of the DC link capacitor 101 voltage, the conduction voltage of the MOVs 90a and 90b may be measured by selectively activating relays 93a and 93b. The failure sensing logic 95 may compute the conduction voltage of MOV 90a by closing contacts on relay 93b and subtracting the voltage from the voltage meter 94b from the voltage from the voltage meter 94c. A similar technique may be used to compute the conduction voltage of MOV 90b using relay 93a and voltage meter 94a.

If the normal operating voltage of the inverter is less than half the maximum DC link voltage, it may be necessary to extend the surge suppression module to three or more variable resistance elements in order to retain ability to test each individual element. This requires modification to the surge suppression module illustrated in FIG. 9, but this modification merely involves addition of elements in series and selection of conduction thresholds such that the total series combination provides appropriate voltage protection. Addition of more voltage meters and sensing resistors may be included.

A variable resistance element conduction voltage significantly over the threshold (e.g., open circuit threshold) may indicate an open variable resistance element and result in the failure detection logic 95 setting failure indication 96 to active. Similarly, a variable resistance conduction voltage within a certain range (e.g., shorted range) of 0V (e.g. 5V) may indicate a shorted variable resistance element and result in the failure detection logic 95 setting failure indication 96 to active. The fuses 91a, 91b may provide a device to disconnect a failed surge suppression device from the DC link, allowing the inverter to continue to operate.

If fuse 91a or 91b is blown, the failure sensing logic 95 may receive a reading of 0V from the DC link voltage sensor 94c. A blown fuse to the surge suppression module may indicate that it is no longer able to protect against surges. This may result in failure indication 96 being set active. The failure detection logic 95 may be fed by a supply 97, separate from the DC link, in order to enable fault indication with a blown fuse connecting to the DC link.

The failure indication 96 may be a digital signal to a controller or processor on the inverter, a visual indication to an operator, or information conveyed over a communication bus. The failure condition 96 may be transmitted as a normally active signal, such as a digital signal that is de-asserted when a failure is indicated or an LED that is normally active (e.g. a green 'good' signal to notify the operator). The failure indication 96 may be a combination of these techniques or another similar technique. The failure indication 96 may include a message to another device. The message may be transmitted to an inverter controller. The message may instruct another inverter to be brought online. The message may be a notification for a user to replace the surge suppression device.

Figure 10:
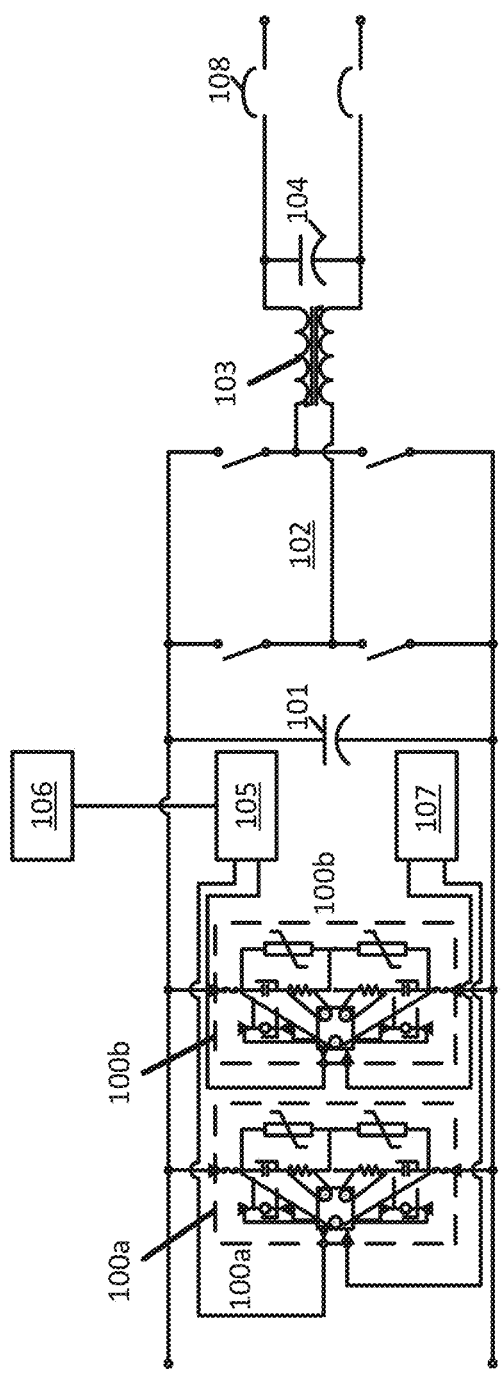
FIG. 10 illustrates an example inverter configuration containing multiple redundant surge suppression devices and output overcurrent protection.

FIG. 10 illustrates an example inverter configuration containing multiple redundant surge suppression devices 100a, 100b and output overcurrent protection 108. Although two surge suppression devices 100a, 100b are shown, additional or fewer surge suppression devices may be included. Overcurrent protection device 108 may also be used to selectively connect to the utility. An additional device may be used to selectively connect to the utility instead of using the overcurrent protection device 108.

The surge suppression devices are connected to a DC link, supported by DC link capacitor 101, which supplies DC voltage to H-bridge 102 in the example inverter. The surge suppression devices 100a, 100b, provide limiting for the voltage on the DC link and the DC link capacitor 101. In the event of a large surge, the surge suppression devices limiting the DC bus voltage may result in the tripping of the overcurrent protection device 108 due to conduction through the body diodes of the switches in the H-bridge 102.

In the event that a surge suppression device 100a, 100b fails, the failure indication 96 is received by the inverter controller 105 and may be transmitted to the user interface 106. The inverter controller 105 may be the controller that operates the switches in the H-bridge, the controller that operates the boost converter, or another controller. The inverter controller 105 is configured to operate a plurality of switches to provide an alternating current to an output. All functions may be performed by a single controller 105. The user interface 106 may be an indicator light (e.g. system status normal), multiple indicator lights (e.g. operating, warning, fault), a communications bus to external equipment, a text-based user interface, or a graphical user interface or another similar user interface.

The surge suppression modules 100a and 100b may be fed by separate, isolated power supplies from power supply module 107. The separate power supplies may allow for detection of faults even with fuses 91a, 91b blown. The surge suppression modules 100a and 100b may be sized to absorb surge energy based on the size of the filter inductor 103 and the filter capacitor 104.

Because surge suppressors must absorb large energy spikes, they often act sacrificially. When failing, they may fail to a short circuit or an open circuit. In either case, the surge suppression modules 100a, 100b may require replacement for continued reliable operation of the inverter. Providing multiple surge suppressors 100a, 100b and health status for each allows for the inverter controller 105 to perform protection for other components, such as notifying an operator, in a replacement instruction message, when the first surge suppression module 100a fails so that it can be replaced, disconnecting the inverter from the grid using overcurrent protection device 108 or another device configured to disconnect the inverter from the grid. The inverter controller 105 may also operate at a reduced output, provide an audible alert, or perform another appropriate action when a surge suppression module 100a is no longer providing protection.

In cases where three or more surge suppression devices are provided, the behavior may differ with one inoperable module versus two or three inoperable modules. The behavior may differ for each inoperable module. As an alternative, the inverter operation may not change when all modules are failed, but the inverter controller 105 may retain the information as to the failure timing for warranty considerations in event of a failure due to a surge on the utility. Surge suppression modules 100a, 100b may be designed to permit replacement while inverter is in operation (without taking out of service).

Figure 11:
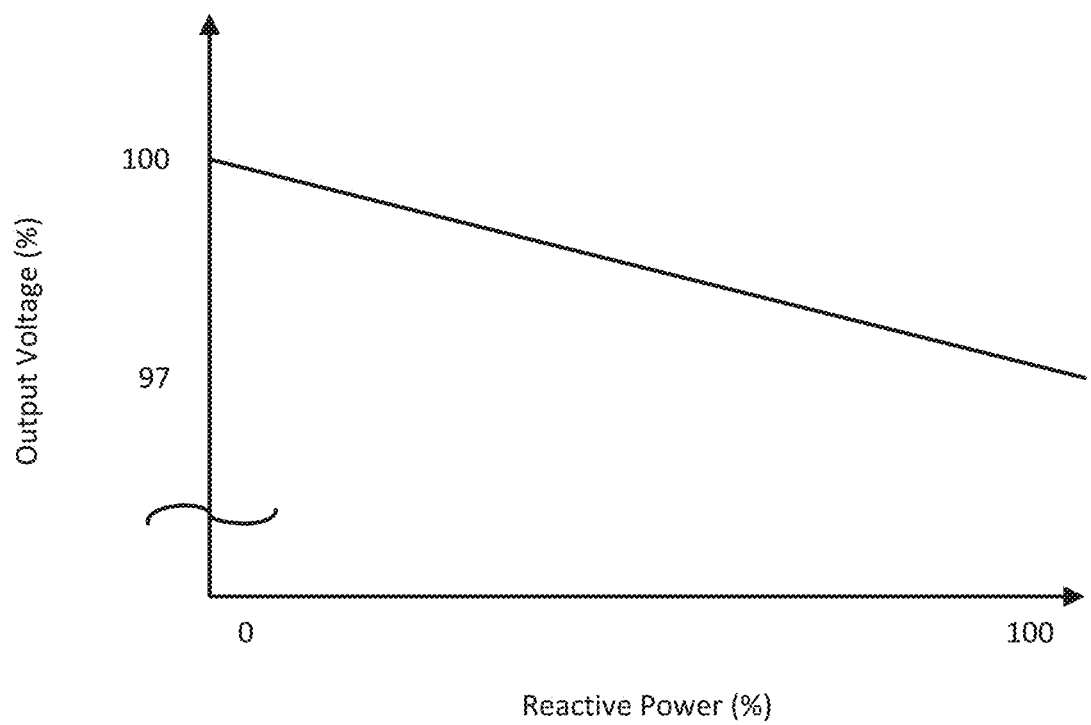
FIG. 11 illustrates a droop characteristic curve for an example transformer.

FIG. 11 illustrates a droop characteristic curve for an example transformer. The droop occurs due to the internal impedance of the transformer. The transformer illustrated in FIG. 11 provides an impedance of 3%, giving an output decrease of 3% at full reactive load. Although transformer voltage dip with full real load is typically lower than the rated impedance, transformer voltage still drops appreciably with real load as well.

Figure 12:
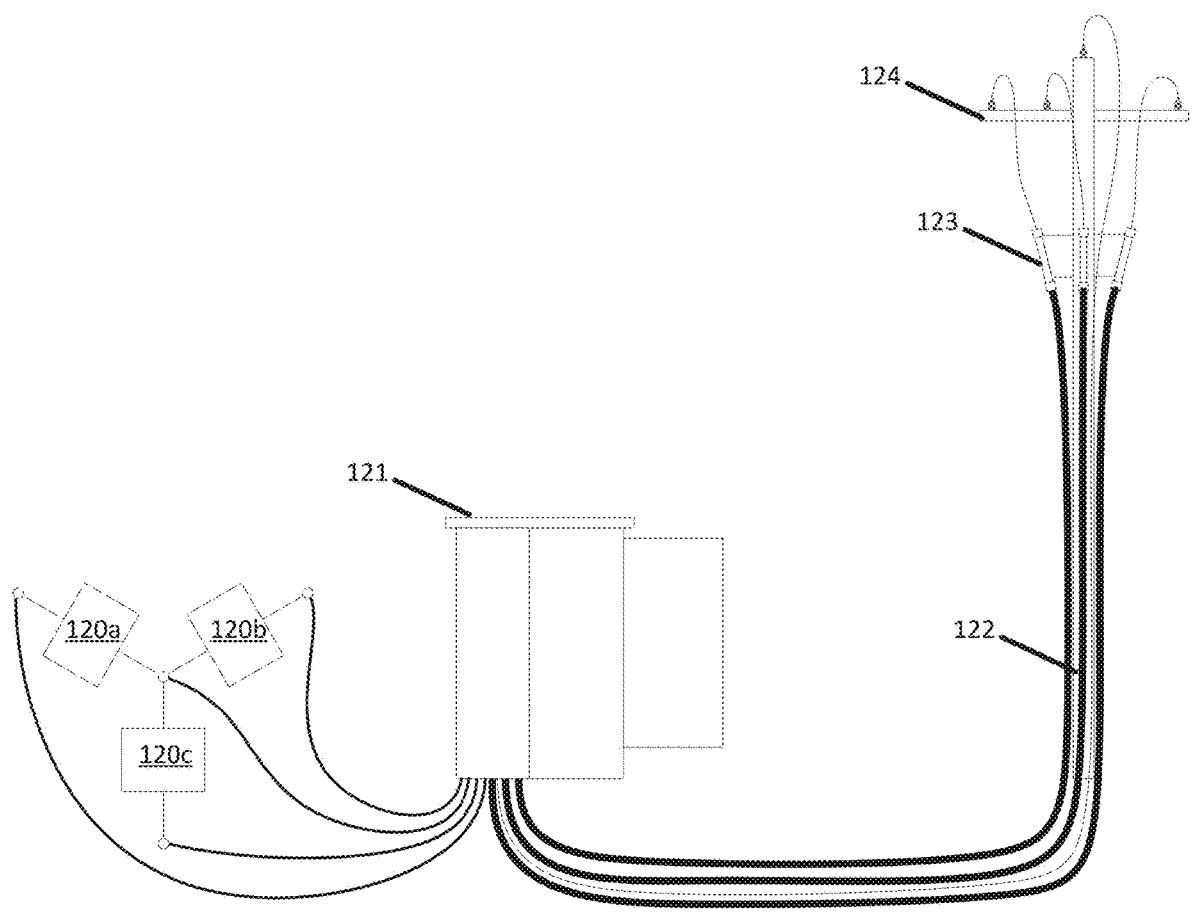
FIG. 12 illustrates an example system containing an inverter connected to a transformer fed by the utility.

FIG. 12 illustrates an example system containing a three-phase inverter 120a, 120b, 120c connected to a transformer 121 fed by the utility. The Inverters are connected between the three individual phases of the three-phase service and the neutral point, provided by the transformer 121. This connection topology may provide a lower DC link voltage (e.g. DC link capacitor 101 voltage) inside the inverter, potentially allowing for lower cost capacitors and switches.

The inverter is connected to the output (secondary) of the transformer 121, providing impedance between the inverter and the power grid. In addition, the underground feed lines 122, the bayonet fuses 123 and the overhead lines 124 also provide impedance between the electrical distribution grid and the inverter. The impedance presented by the components on the high side of the transformer 121 may be reduced due to the turn ratio within the transformer, but still provide some impedance to the power grid.

In addition to the electrical distribution components illustrated in FIG. 12, the utility voltage may vary due to load on substation transformers and tap configuration on multi-tap autotransformers throughout the distribution system. The changes in the system voltage based on load may not be restricted to variation from the distribution transformer 121.

The elevated positioning and pervasive path of the overhead lines 124 may make them susceptible to lightning strikes, causing surges through the electrical system. The surges are attenuated by the transformer 121, but still couple to the transformer secondary either through internal capacitance or through differences in the ground reference of the secondary and primary. This is often caused by large current flowing through the ground from the lightning strike. When coupled to the secondary of a utility distribution transformer 121, inverters may not survive long without surge suppression.

Due to the accuracy of the output regulation on an output-corrected inverter, the inverter may not share load with the utility equally. If the load changes, the inverter may adjust to provide appropriate output voltage, but the utility transformer sources current based on the droop curve, so it may not source any additional reactive power if the output voltage remains constant. As a result, the inverter may support any and all load transients in order to provide voltage stability.

Figure 13:
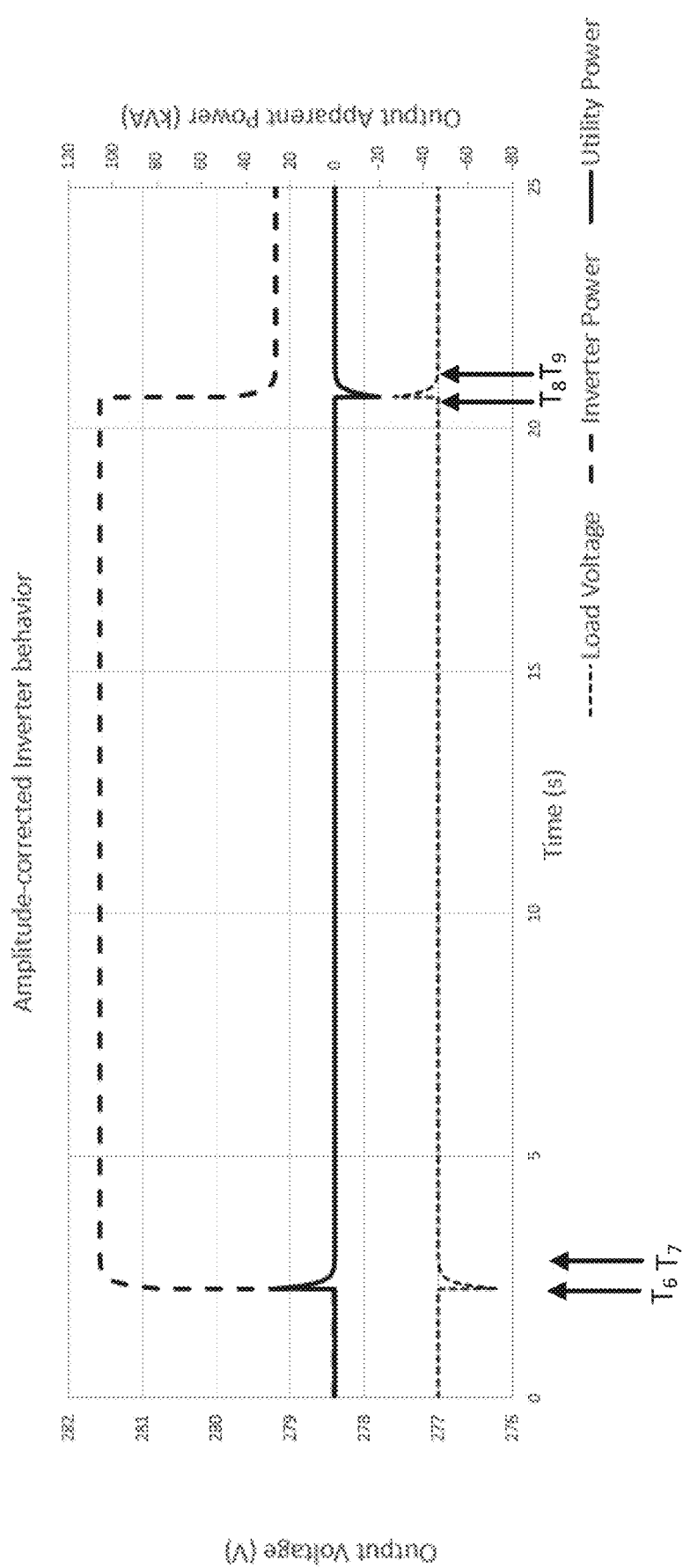
FIG. 13 illustrates an example current amplitude flowing from the inverter and transformer of the system in FIG. 12 with a changing load.

FIG. 13 illustrates an example current amplitude flowing from the inverter 120 and transformer 121 of the system in FIG. 12 with a changing load connected to the secondary of the transformer, which is also connected to the output of the inverter.

The load changes from 0 kVA to 105.9 kVA at time T6, resulting in a short-term dip in the output voltage of approximately 0.8V and some power being taken by the utility. The amplitude-correction in the inverter acts to correct the output voltage to 277V, reaching the target at time T7, at which time, the utility is no longer supplying power. At time T8, the load decreases to 26.6 kVA resulting in a short-term increase in the load voltage and negative power supplied by the utility (the utility is absorbing power). The amplitude-correction in the inverter acts to correct the output voltage to 277V, reaching the target at time T9 and the utility power reverts back to 0.

Figure 14A:
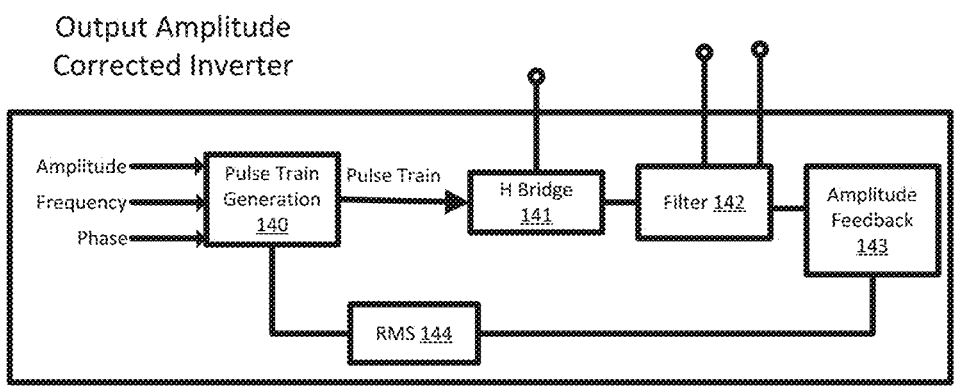
FIG. 14A illustrates an example inverter with output amplitude correction.
Figure 14B:
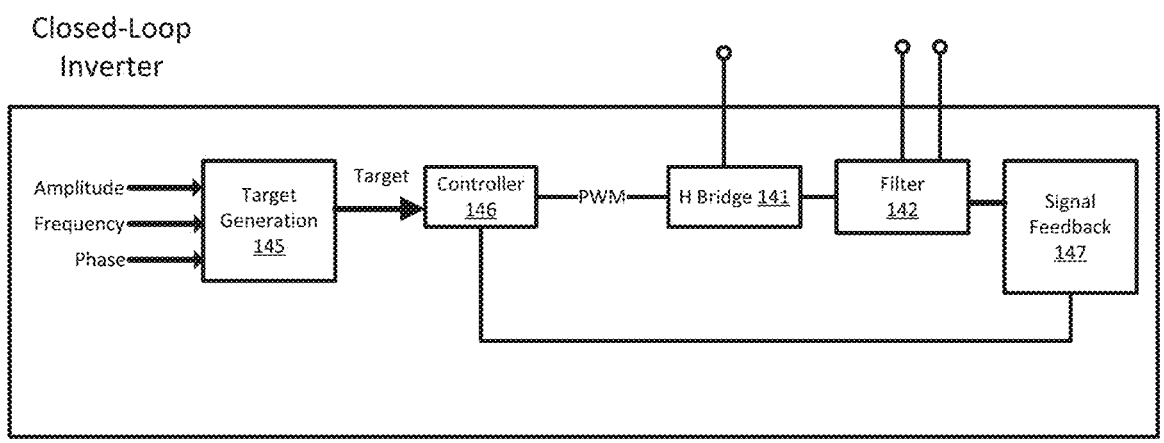
FIG. 14B illustrates an example inverter with closed-loop output feedback.

FIGS. 14A and 14B illustrate two example inverters. FIG. 14A is a block diagram representing an inverter with output amplitude correction. FIG. 14B is a block diagram illustrating an inverter with closed-loop output feedback. An inverter with neither is simply the output-corrected inverter without the amplitude feedback 143 or root mean squared (RMS) calculation 144.

The output-corrected inverter of FIG. 14A provides a sinusoidal pulse train from a pulse train generator 140. The pulse train may be generated based on any or all of the following characteristics: Amplitude, Frequency, and Phase. If phase is used in the generation of the pulse train, the phase may be measure relative to a dominate phase of the inverter or may be generated relative to a fixed reference.

The amplitude of the sinusoidal pulse train may be adjusted based on the RMS amplitude of the output waveform, computed in the RMS calculation 144. As an atypical alternative, the output may be adjusted based on an averaged quantity or even a fundamental component from an FFT applied to the output. The pulse train is provided to the h-bridge 141 to control the duty cycle provided to the switches in order to drive a sinusoidal output current. The output-corrected inverter in FIG. 14A may also include a feed forward or oscillation damper term for the output filter. This may be accomplished by a phase shifted current correction factor or an intentional distortion applied to the pulse train before reaching the h-bridge 141.

The switched voltage output from the h-bridge 141 is fed to the output filter 142, which removes most of the switching noise from the signal. As an advantage, the output filter 142 also provides an output impedance that can be very helpful to prevent switch damage in a short-circuit condition. The output filter 142 may be sized to allow sufficient impedance to prevent excessive output current when fed a sinusoidal input waveform and short-circuited on the output. The pulse train generation will typically fold back in a short current condition (when the output voltage measures very close to 0), but may require a few cycles to do so to maintain stability.

An inverter without output amplitude correction may not provide the capability to fold back in a short circuit. In addition, an inverter without output amplitude correction may have a stiffer filter to reduce the inherent droop associated with the filter. In some cases, inverters without output amplitude correction are unable to self-protect in the event of a short circuit on the output. In other cases, the self-protection is accomplished by other devices, such as a fuse or circuit breaker.

The closed-loop inverter of FIG. 14B generates a target, such as a sine wave, in the target generation 145 block. The target may be generated based on one or more of an amplitude, a frequency and a phase. The target may be a sum of sine waves of different frequencies, the target may be derived from a lookup table. The phase may be relative to another target signal or to a fixed reference. The controller 146 measures the signal feedback 147 and may compare the signal feedback 147 with the target 145. The signal feedback 147 may contain output voltage, output current or both signals. The controller 146 may control voltage or current to the target and may involve both signals in the control calculations. For example, a current controller may measure the output voltage in order to establish the necessary voltage to provide at the input to the filter inductor in order to achieve the target current in the next cycle.

The controller 146 may be a proportional-integral-derivative (PID) controller, a more complex linear controller, a state-space controller, a model optimization controller, or a combination of these or other controllers. The controller 146 may switch control modes based on observed behavior, such as current exceeding a threshold or output voltage suddenly dropping. The controller 146 may compute additional factors for consideration, such as output impedance, when computing optimal switch responses.

The signal feedback 147 may be measured once per switching cycle of the inverter, multiple (e.g. 16) times per switching cycle of the inverter, or even less frequently than once per switching cycle of the inverter. In many cases, system stability improves with increasing sample rates, making systems with less frequent sampling than once per switching cycle uncommon. Increased switching frequency will often improve stability of the inverter 120 with the added benefit of improving the range of harmonics that the inverter can reject.

The controller 146 may include a model of the filter 142. The controller may dynamically determine the characteristics of the filter. The dynamic determination of the characteristics may be limited to a range or a maximum difference from an expected value. The controller 146 may measure internal values within the filter 142. The controller 146 may estimate internal values within the filter 142. The controller 146 may estimate a future state of the measured or estimated values within the filter 142. The controller may limit duty cycle based on a predicted future state of the current through the filter inductor 103 in the filter 142.

Different inverter topologies may provide different features, behavior and capability. For example, an inverter without amplitude-correction may not provide a consistent voltage droop curve, depending on variations in the output filter, DC link stiffness and switch impedance, all of which may vary with temperature. And amplitude-corrected inverter can provide a consistent droop characteristic but may not be able to correct harmonic distortion in the output signal. An output-corrected inverter may be able to operate with a higher-impedance output filter than a non-output-corrected inverter, allowing short-circuit withstand capability. A closed-loop inverter may be able to operate at a significantly lower filter impedance and still provide short-circuit withstand capability.

In addition to the behavior illustrated by FIG. 13, the utility voltage may experience variation in the primary side of the utility transformer, changing the no load point on the transformer droop curve. In this case, the inverter output voltage may also vary when the inverter 120 is coupled directly to the secondary of the transformer 121. Several techniques exist to accommodate this variation in utility voltage, including controlling the inverter current relative to the measured output voltage, disabling operation when no utility is sensed, and operating with a very steep droop curve.

One of the advantages to providing current based on measured utility voltage is that the power factor that the inverter outputs can easily be defined by the relative phase between the measured utility voltage and the current sourced by the inverter. Another advantage is that the control is simple and straightforward.

One disadvantage to providing current based on measured utility voltage is that the inverter is unable to operate without utility voltage present. This creates a concern for the inverter system, as inverter are often used with battery banks to provide reliable ride-through power until an alternate power source, such as a generator, can be brought online.

Operating on a very steep droop curve may provide the advantage of stable operation when paralleled with utility and ability to operate without utility present. The voltage droop curve changes the reactive power output of the inverter 120, allowing the inverter to continue to provide real power without concern. Droop systems often provide a frequency droop characteristic with real load, but this may not be necessary when operating in parallel with the grid. If provided, the frequency droop may cause the output power to fluctuate, which may not be desirable behavior for the inverter if it is supposed to provide a fixed output power or if the output power needs to match the input power from a system that is not able to respond quickly.

With simple reactive droop, the inverter may still be able to fix the output power in order to load the sources supplying the inverter 120 optimally while controlling voltage due to reactive droop. If the voltage starts to drop, the inverter 120 will increase reactive power output, reducing the reactive load on the transformer and stabilizing the transformer 121 secondary voltage.

One drawback to reactive droop is that the inverter may have to provide significantly more apparent power than would otherwise be required to operate. In other words, the inverter may operate at a low power factor. Because the current passing through the H-bridge 102 of the inverter is linked to the output apparent power, not the output real power, the inverter efficiency may decrease significantly when operating at a power factor other than unity.

Another potential drawback to operating in droop is that the inverter 120 voltage is linked to the output reactive power, meaning that the output voltage of the inverter 120 may vary dynamically when the load changes. As an example, a large motor starting may cause significant light dimming throughout the facility, even though the inverter 120 may be fully capable of starting that motor with no noticeable voltage dip.

As an alternative to current-controlling and reactive droop, the inverter 120 may be equipped with a variety of operating modes and logic to switch between them. For example, the inverter 120 may operate in a grid-tied mode where the output current was controlled relative to the measured waveform when connected to the grid, then switch to a fixed output voltage and frequency when no longer connected to the grid.

While selecting modes may seem to be the best strategy for operating a grid-tie inverter, it brings with it additional challenges and advantages. One advantage is that the inverter 120 output is as stiff as the inverter topology will allow while operating in islanded mode, which may be orders of magnitude better than utility voltage regulation if equipped with amplitude-correction or operating in closed-loop. Another advantage is that the inverter 120 may be capable of operating at a variety of power factors, including unity, allowing the inverter to operate at maximum efficiency.

One potential disadvantage to selecting modes for the inverter is the possible need to operate with different behavior in a given situation. For example, it may be desirable to maintain consistent voltage at a certain location, while another location may prefer optimal inverter operating efficiency.

Figure 15:
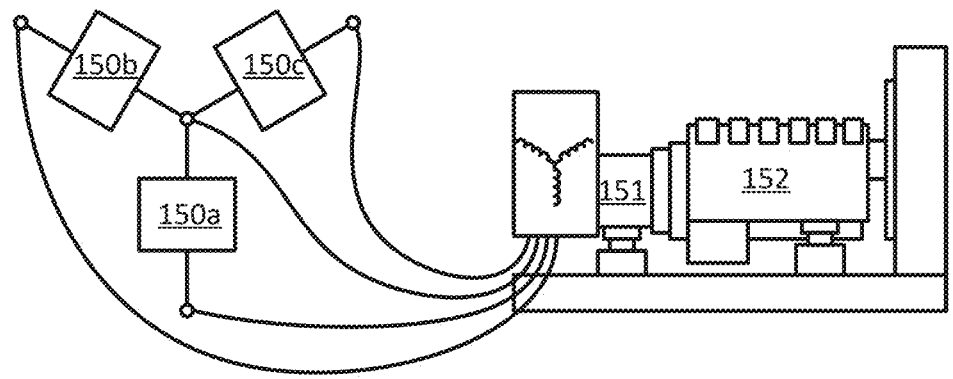
FIG. 15 illustrates an example system containing an inverter connected to a synchronous electrical machine driven by a prime mover.

FIG. 15 illustrates an example system containing inverters 150a-c connected to a synchronous electrical machine 151 driven by a prime mover 152. The three-phase inverter is connected in a wye configuration, with each inverter element 150a, 150b, 150c connected between the output phase and the neutral. This topology matches the connection of the internal coils in the synchronous electrical machine 151.

When operating in parallel with a synchronous electrical machine 151 driven by a prime mover 152, load sharing may become important. In some cases, the inverter may provide only the power which is supplied by the energy source feeding it, but in other cases, the inverter may have large energy reserves to draw from and replenish, meaning that the inverter may be put to different uses.

When in parallel with a synchronous machine, sudden sourcing of reactive power will result in the load voltage increasing. Similarly, sudden sourcing of real power will cause the load frequency to increase when the synchronous machine is driven by a prime mover 152. The prime mover 152 will typically act to correct output frequency to a nominal value, but the control response may not be a quick as that of the inverter. The synchronous electrical machine 151 will typically react to correct output voltage to a nominal value, but the control response may not be as fast as that of the inverter.

In some cases, the inverter response is one or more orders of magnitude better than that of the synchronous electrical machine 151 or prime mover 152. As an example, the inverter may be able to increase from no output power to full output power in 400 us, while the prime mover 152 may require 4 seconds to increase fuel and airflow from no power to full power and the synchronous electrical machine may require 400 milliseconds to increase excitation from no-load to full reactive power. Due to this difference in performance, the inverter is often used to respond quickly to a transient condition, allowing the synchronous electrical machine 151 and prime mover 152 time to respond. This condition may result in a temporary overload for the inverter, but overheating may not be a concern for a brief period.

An inverter may need to operate with different behaviors depending on what the output is connected to. In addition, different inverter topologies may provide different features and capabilities. In addition to the abilities already discussed, closed-loop inverters may provide improved power quality by actively sourcing harmonic current to offset harmonic distortion in a waveform from another source. If the target is a generated sinusoid, a closed-loop inverter may be able to generate a signal with 0.1% THD or less, even when feeding an inductive or capacitive load. In addition, a closed-loop inverter with sufficiently high switching frequency may be able to offset distortion from various non-linear loads operating at significantly lower switching frequencies. For example, an inverter switching at 100 kHz may be able to provide significant correction to harmonic distortion caused by a variable frequency drive switching at 2.4 kHz.

Both the output from the utility transformer 121 and the synchronous electrical machine 151 may contain harmonic content. This content may be observed using a frequency-domain analysis of the signal or by visual inspection of the shape of the output waveform. In most cases, this output is sufficiently clean to operate most electrical equipment, but in some cases, particularly where non-linear loads are involved, the output voltage becomes distorted outside a limit where devices receiving power from the source exhibit abnormal behavior.

Due to the frequency of the harmonic content all falling above the fundamental frequency, the energy content to remove from the signal is minimal, meaning that many inverters may be able to store the necessary energy to correct harmonic distortion in their DC link capacitors. With no additional hardware required, the desire to use an inverter as a voltage filter is often sufficient to lead to use in that application.

Even in cases where the switching frequency of the non-linear load exceeds that of the inverter, the capacitance 104 of the output filter on the inverter will still provide an additional source for high-frequency current. Ordinarily, capacitance tends to drive synchronous electrical machines and transformers, to a lesser degree, unstable, but the inverter is able to control current to the capacitor to some respect and may be able to make the capacitor appear to be any type of load desired (including an inductor) with the right topology.

Figure 16:
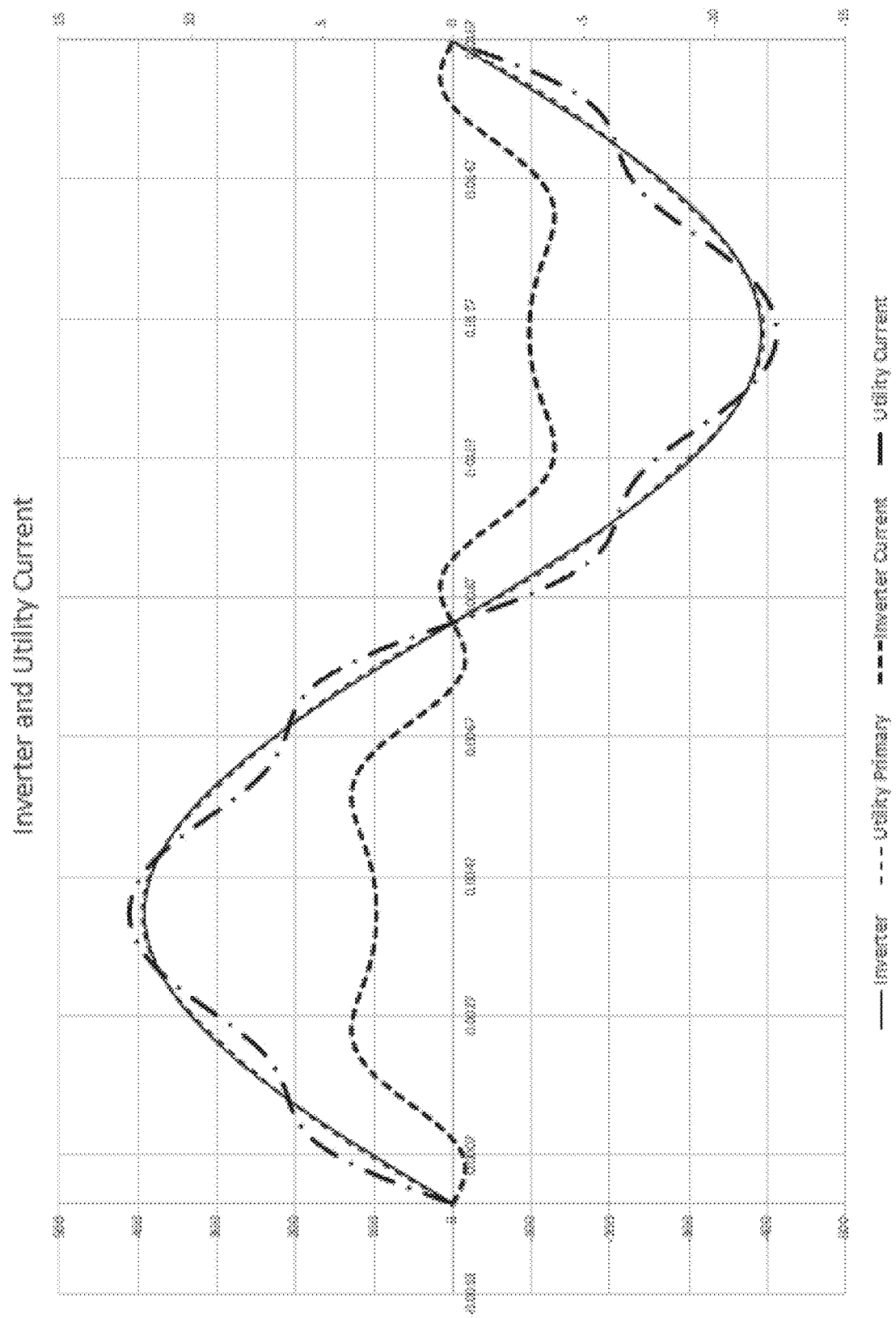
FIG. 16 illustrates example current waveforms of current flowing between the inverter and transformer of the system in FIG. 14 and/or the inverter and synchronous machine of the system in FIG. 15.

FIG. 16 illustrates example current waveforms of current flowing between the inverter and transformer of the system in FIG. 12 and is similar to behavior exhibited by the inverter and synchronous machine of the system in FIG. 15 when the inverter is a closed-loop inverter. This harmonic current is sourced by the inverter in order to cause a resulting harmonic current from the utility transformer 121 or synchronous machine 151 that works with their internal impedance to correct the output of the synchronous electrical machine 151 or the transformer 121 to a sinusoid or very close to a sinusoid.

For the example in FIG. 16, the total harmonic distortion (THD) of the utility and generator was 3.2%, but the harmonic current sourced by the inverter was able to reduce the THD for the combined output to 0.4%. The power sourced by the inverter is not significantly higher than if the inverter were not removing the harmonic content on the waveform, but this is due to high relative impedance of the transformer or synchronous machine.

As an example, the inverter current is well within its capability if a 15 kW inverter is paired with a 60 kW generator set or a 25 kVA utility transformer. In the same system, a 100 kW inverter would barely be impacted by the harmonic current and would probably be able to correct the THD to 0.2% or even better. That same 100 kW inverter paired with a 4 MW generator or a 1.5 MVA transformer would see significant harmonic current, probably close to the inverter's current capability, and only be able to correct the THD to 1.1%.

While correction of harmonic distortion may be useful in some cases, in other cases, such as the example of the 100 kW inverter and 4 MW generator or 1.5 MVA transformer, it requires the inverter to source huge currents with very minimal sourcing of net power. This results in the inverter having a very low power factor and leads to heating with minimal to no benefit, reducing the efficiency of the inverter and potentially reducing the life of internal components. In such cases, it may be beneficial to adjust the internally generated target to match the output voltage from the synchronous electrical machine 151 or utility transformer 121.

At some locations, more than one inverter is operated in parallel. In this case, the effective impedance of the inverters is computed as if the impedances were in parallel, decreasing with each additional inverter. If the site with a single 100 kW inverter had 40 100 kW inverters in parallel, the harmonic current required to correct the THD of the system to 0.3% or so would barely be noticed by each inverter, as they would only be carrying a $40^{th}$ part of the current. Once the additional inverter capacity is added to the example site, the harmonic distortion no longer presents a problem.

Unfortunately, multiple inverters in parallel presents another problem. If there are very stiff sources controlling to a pre-generated target, what prevents them from conflicting as to the desired output and exchanging current between them instead of providing it to the load.

Figure 17:
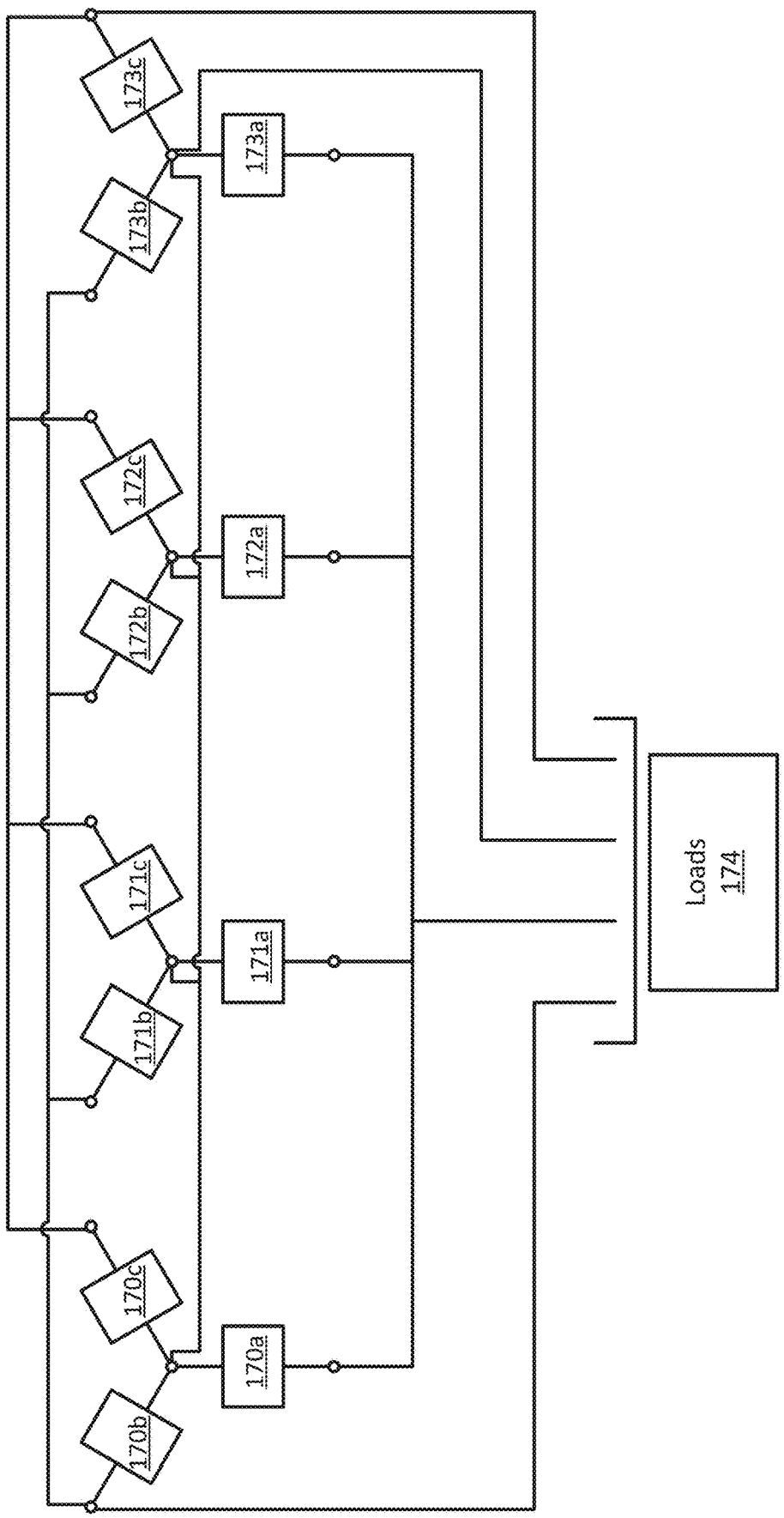
FIG. 17 illustrates an example system containing a plurality of inverters with closed-loop output feedback connected together to a common load.

FIG. 17 illustrates an example system containing a plurality of inverters with closed-loop output feedback connected together to a common load. Each inverter is capable of sourcing of sinking current from the common bus and the total current must equal the current to the load, but it is possible for inverter 170 (e.g., phases 170a, 170b, and 170c) to source 200A, inverter 171 (e.g., phases 171a, 171b, and 171c) to absorb 200A, inverter 172 (e.g., phases 172a, 172b, and 172c) to source 35A and inverter 173 (e.g., phases 173a, 173b, and 173c) to absorb 35A, with the load 174 receiving no current. All inverters would be generating heat from the current flowing through their switches and output filters, but not producing any work. In this case, voltage and frequency droop may help the inverters 170, 171, 172, 173 to reach a common target and reduce their circulating current, but it may take time. A different strategy to equalize the inverters would be to have them communicate with each other, but baring close enough physical proximity to allow communication, the inverters must have a technique that allows correction based on behavior alone.

Correcting output to match another inverter may require adjustment of frequency until the output signal lie in phase, which is how the droop technique would eventually correct them, but an alternate technique would be to stop trying to source current to drive the bus to a target and instead wait for a single inverter to establish a signal that the others can match once established. While this requires a protocol or procedure to determine the inverter that is permitted to establish the voltage, it allows for very quick arbitration of output and nearly immediate synchronization (possibly within a half cycle or less).

Once the signals match, a tiny increase in frequency when current lags voltage or a tiny decrease in frequency when current leads voltage will result in correcting this current with minimal effect to the load and allow continued parallel operation. This technique may provide satisfactory performance in other applications, such as parallel to utility cases as illustrated in FIG. 12 or parallel operation with a synchronous electrical machine as illustrated in FIG. 15.

While behavior may be defined for each of the operational modes of the inverter 120, another potential disadvantage to selecting modes for an inverter is the need to sense the application in order to select an appropriate mode. This may be performed in a variety of ways, including sensing on connectivity status of interconnects or selection of operational modes based on digital input to the inverter. A preferred method for selecting a mode would be based on characterization of the load being supplied.

For example, parallel operation with other inverters may be detected by very large reactive current, possibly reaching a current limit, with little to no real current. This may be corrected by adjusting frequency if the difference in phase is minimal, but may require disabling the output and re-synchronizing if significantly out of phase (as indicated by reaching the current limit with voltage on the system).

Other ways to detect parallel operation with other inverters include sensing high-frequency ripple, measurement of effective impedance, response to a disturbance, impedance to a known potential, or another technique of differentiating inverter behavior from utility of synchronous machine behavior. Different inverter topologies may have different behavioral characteristics. Some techniques may be more effective for some inverter topologies than for others.

Differentiation between parallel operation with a utility source and parallel operation with a synchronous electrical machine may include observation of frequency behavior with large load changes as compared to voltage behavior. As an example, the voltage may exhibit behavior similar to transformer droop when the inverter output power changes, such as increasing voltage when the inverter output power increases, when the inverter is connected to the utility source. By comparison, the synchronous machine voltage may not change appreciably with increasing output power form the inverter, but the frequency increase when the inverter power suddenly increases.

Detection of the type of paralleled source to an inverter may involve slow changes, such as adjustment over the course of 100 seconds, normal changes, such as adjustment over the course of a second, and quick changes, such as a change in 10 ms. Different sources may exhibit different behavior to different types of changes. For example, a synchronous machine driven by a prime mover may control frequency and voltage to a relatively constant value when subjected to a slow change, while utility voltage may vary.

As another example, a synchronous machine driven by a prime mover may control voltage to a relatively consistent value while the inverter increases power through a normal change, but the prime mover may not be able to control frequency during the event. A utility transformer may maintain frequency within a relatively tight band with a normal change in the inverter output power, but the voltage may change without recovering.

As yet another example, a synchronous electrical machine driven by a prime mover may see increases in voltage and frequency for a quick change in the output power of the inverter. The voltage and frequency recovery time may follow expected intervals, for example, the voltage may recover within 200 ms and the frequency may recover within is.

Some synchronous electrical machines may have a droop characteristic curve related to the output reactive power from the machine. Such synchronous electrical machines may exhibit different behavior from a utility transformer in that all droop observed occurs due to reactive power, while some utility droop may correlate with real power.

Another technique to determine if an inverter is connected to a synchronous electrical machine or a utility transformer relies on the differences in the electrical characteristics between the two systems. While a synchronous electrical machine may contain an air gap between the rotor and stator to allow relative rotation, a utility transformer may not contain such an air gap. An air gap may change the magnetic properties of the flux path within the machine, such as the frequency-based saturation or hysteresis behavior. Such behavior may be recognizable by a differences in impedance change with changing frequency.

To detect different impedance behavior, the inverter may introduce a higher-frequency (e.g. 5 kHz) carrier frequency on the output voltage. The inverter may measure the incoming waveform with no output current, and observe the harmonic current required to correct the THD to a known level. The corrected THD level may be converted to the frequency domain using a transform, such as a Fourier transform or fast Fourier transform.

The inverter may learn characteristics of the different sources based on measurements taken by the inverter and a feedback to determine the actual source. The inverter may make use of a machine learning algorithm, some combination of the techniques explained above, or another technique for recognizing the sources based on known behavioral characteristic of the sources or general expected source behavioral characteristic.

Figure 18:
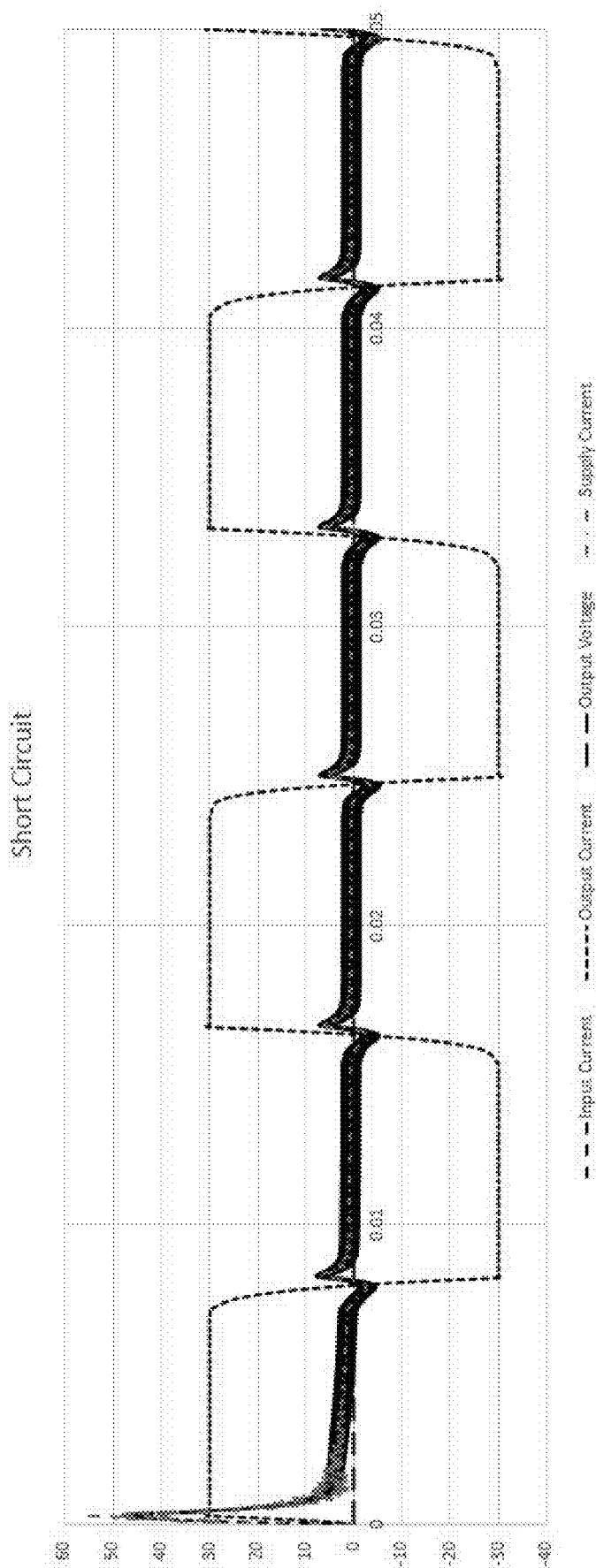
FIG. 18 illustrates closed-loop inverter behavior into a short circuit condition.

FIG. 18 illustrates closed-loop inverter behavior into a short circuit condition. The voltage remains very close to 0 and the output current quickly reaches the current limit of the output. The controller 146 limits the duty cycle of the PWM signal to the h-bridge in order to prevent current exceeding the current limit setting for the controller 146. In this condition, the output voltage is very close to 0, allowing the inverter to detect a short-circuit condition. This condition may be harmful to the output filter or switches in the h-bridge, although the loading is minimal on the boost converter or source, so it may be necessary to limit the duration of this condition. If the duration is limited, the inverter may fold back to a lower current or disable the output altogether.

If the inverter has disabled the output due to a short circuit condition, it may be helpful to test the output periodically to determine if the short circuit still exists. In another consideration, it may be beneficial to remain disabled after the condition is sensed.

In other applications the inverter may be connected without a ground reference or connected to a ground reference internally to the inverter such that a fault to ground may be detected. In this case, the inverter may disable the output immediately, actively controlling to 0V and disabling the output. Due to the nature of the output signal on the inverter, the waveform must fall from the crest of the sinusoid to the next zero crossing within ¼ cycle, meaning that the output could be completely disabled within about 4 ms on a 60 Hz output or 5 ms on a 50 Hz output. This may provide improved ground fault detection relative to a standard GFCI breaker or standard GFCI outlet.

It may also be advantageous to control THD or to stabilize frequency when the site is fed by a generator. In addition, load sharing with a generator is different than load sharing with the utility due to frequency fluctuation, yet both are parallel operation modes.

The applications and functional control modes for an inverter outlined above are provided for exemplary reference and are not intended to limit the operational or functional control modes of an inverter unnecessarily. Other control techniques may be used, such as voltage stabilization, frequency stabilization, and peak shaving, both to minimize peak demand from a utility source or generator source and to source power to the grid when the time-of-day rate for the power is at a maximum. These modes and other similar modes may be selected based on determination of a state of the system or parallel operation with a specific source.

In addition to differentiation of sources operating in parallel with an inverter, it may also be desirable to detect changes in the characteristics of a given source and to act accordingly. For example, a utility energy rate change may cause system behavioral changes, as well as changes in the utility feed line, transformer, substation, or similar characteristics, potentially indicating a back-feed condition (fed by an abnormal source).

Other factors may also lead to changes in the operational mode or behavior of the inverter or inverter system. For example, increased atmospheric temperature may require the inverters to operate at a lower power output. While some factors may be internal to the inverter system, others may be external to the system.

Figure 19:
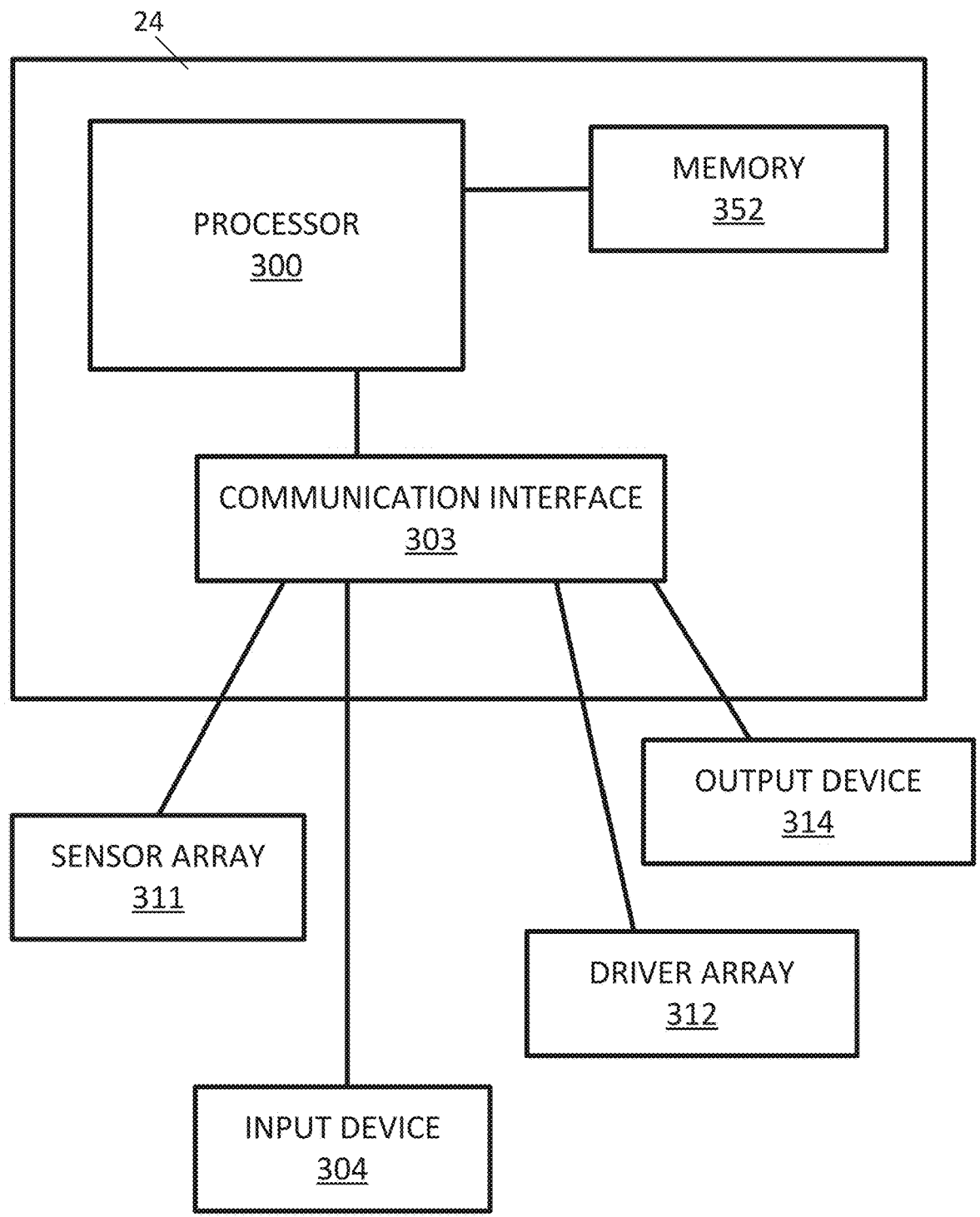
FIG. 19 illustrates an example controller for the surge suppression device and/or inverter.

FIG. 19 illustrates an example controller 24. The controller 24 may include a processor 300, a memory 352, and a communication interface 303. The controller 24 may be connected to a workstation or another external device. The controller 24 may be connected to an input device 304 such as a control panel and/or a database for receiving user inputs, system characteristics, and any of the values described herein. The communication interface 303 may be connected to a sensor array 311 including any one or combination of the sensors and receive sensor measurements as described above including voltage meters 94a, 94b and bus voltage sensor 94c. The communication interface 303 may be connected to a driver array 312 for driving and controlling any of the switches in the inverters. Additional, different, or fewer components may be included. The processor 300 is configured to perform instructions stored in memory 352 for executing the algorithms described herein.

The controller 24 may be connected to an output device 314, which may be integrated with the input device 304 as the control panel and may display settings or measurements of the controller 24. The output device 314 may include a failure indicator for indicating the failure determined by the failure sensing logic 95. The output device 314 may include an LED or other light or illuminator.

Figure 20:
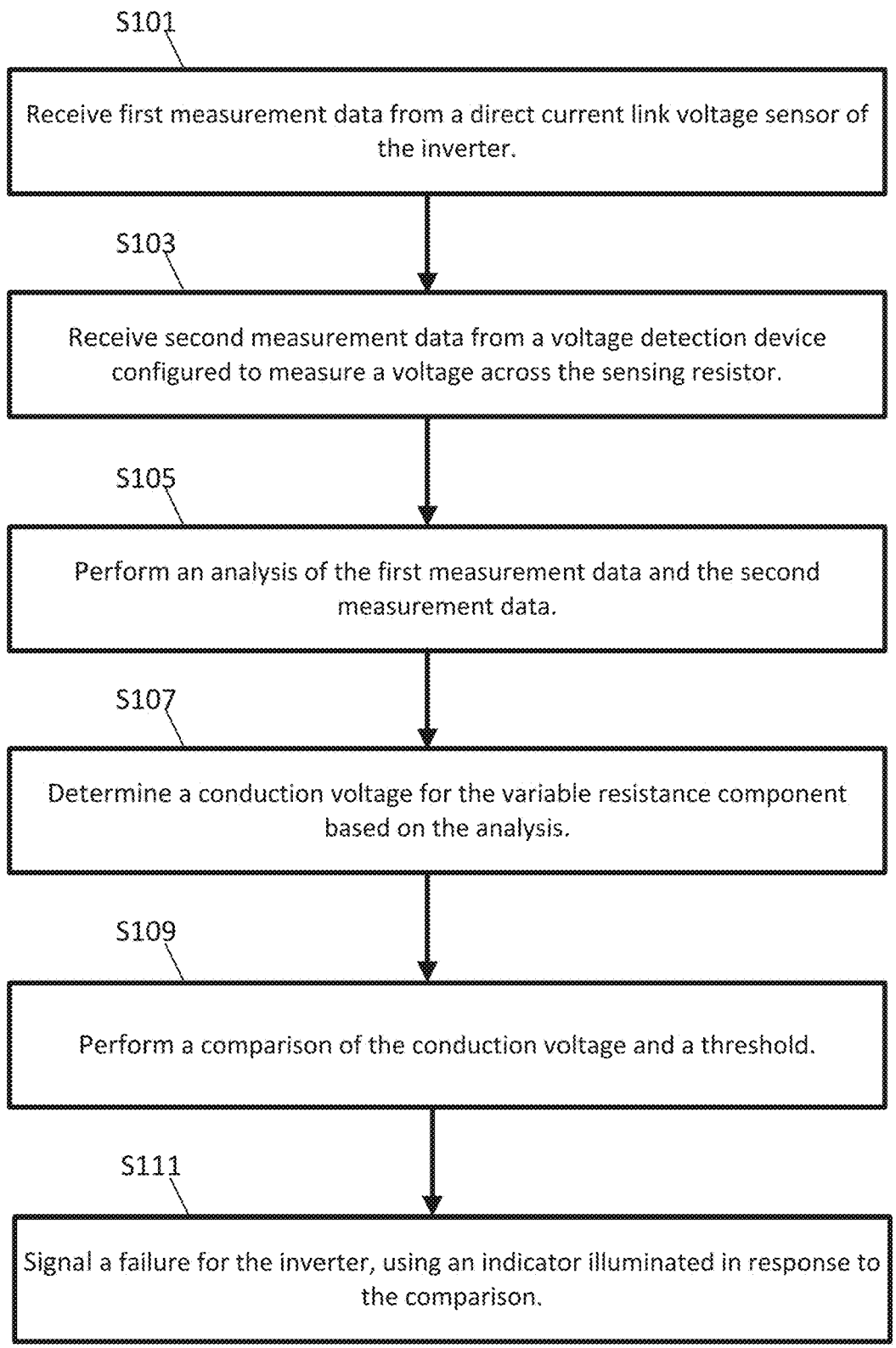
FIG. 20 illustrates a flowchart for the controller of FIG. 19.

FIG. 20 illustrates a flow chart for the operation of the controller 24. Additional, different of fewer acts may be included.

At act S101, the controller 24 receives first measurement data from a direct current link voltage sensor of the inverter.

The direct current link voltage sensor may be integrated into the controller 24 or be provided separately in the surge suppression device or the inverter circuit.

At act S103, the controller 24 receives second measurement data from a voltage detection device configured to measure a parameter (e.g., voltage across) at the sensing resistor. There may be two sensing resistors. One sensing resister is associated with a positive node of the direct current link of the inverter, and the other sensing resistor is associated with a negative node of the direct current link of the inverter. The variable resistors are connected to the inverter by way of a switching component.

At act S105, the controller 24 performs an analysis of the first measurement data from the direct current link voltage sensor and/or the second measurement data for the voltage across the sensing resistor.

At act S107, the controller 24 determines a conduction voltage for the variable resistance component based on the analysis. There may be two variable resistance components coupled together at a central node. One of the variable resistance components is coupled to the positive node of the direct current link of the inverter and the other variable resistance component is coupled to the negative node of the direct current link of the inverter.

At act S109, the controller 24 performs a comparison of the conduction voltage and a threshold. Based on the comparison, the controller 24 detects a failure in the variable resistance component in response to information from the variable resistance component and information from the detection device for the parameter of the sensing resistor. In one example, the controller 24 compares the conduction voltage for the first variable resistance component to an open circuit threshold and determine an open variable resistance element or open condition when the conduction voltage exceeds the threshold. In one example, the controller 24 compares the conduction voltage for the first variable resistance component to a shorted range and determine shorted variable resistance element or open condition when the conduction voltage is within the shorted range.

At act S107, the controller 24 signals a failure for the inverter. The signaling may include an indicator illuminated in response to the comparison. The signaling may include a communication message sent by the communication interface 303 to another device. The communication message may be sent to the inverter controller, which may be configured to disconnect the inverter from a power grid in response to the failure. The communication message may be sent to a management device that allows a user to monitor surge suppression modules across multiple systems and dispatch maintenance personnel to replace the modules as needed. The communication message may be sent to a manufacturer device for logging errors that occur in the installed systems.

An inverter circuit may change direct current (DC) to alternating current (AC) or change AC current to a different AC current. Various circuit topologies are available to perform this function. One example for DC-AC is an H-bridge topology with a predetermined number of switches arranged in an H-shape, which is described in more detail below. The switches of the inverter circuit are controlled to produce a specific output, which may be a sinusoidal function (e.g., sine wave) at a predetermined frequency for the AC signal. The inverter circuit drives a load, including a load circuit, which may experience a ground fault. A ground fault is an electrical contact between an energized path and a ground path in the load circuit. The electrical contact may be an accident or an intentional grounding (e.g., for testing).

The ground path may be the chassis or frame of a piece of equipment including the load circuit. The ground path may be the earth or another path that is external to the piece of equipment. While the ground fault may be caused by a breakdown in insulation, often times an animal or human becomes the electrical conductor between the energized path and the ground path that causes the ground fault.

Figure 21:
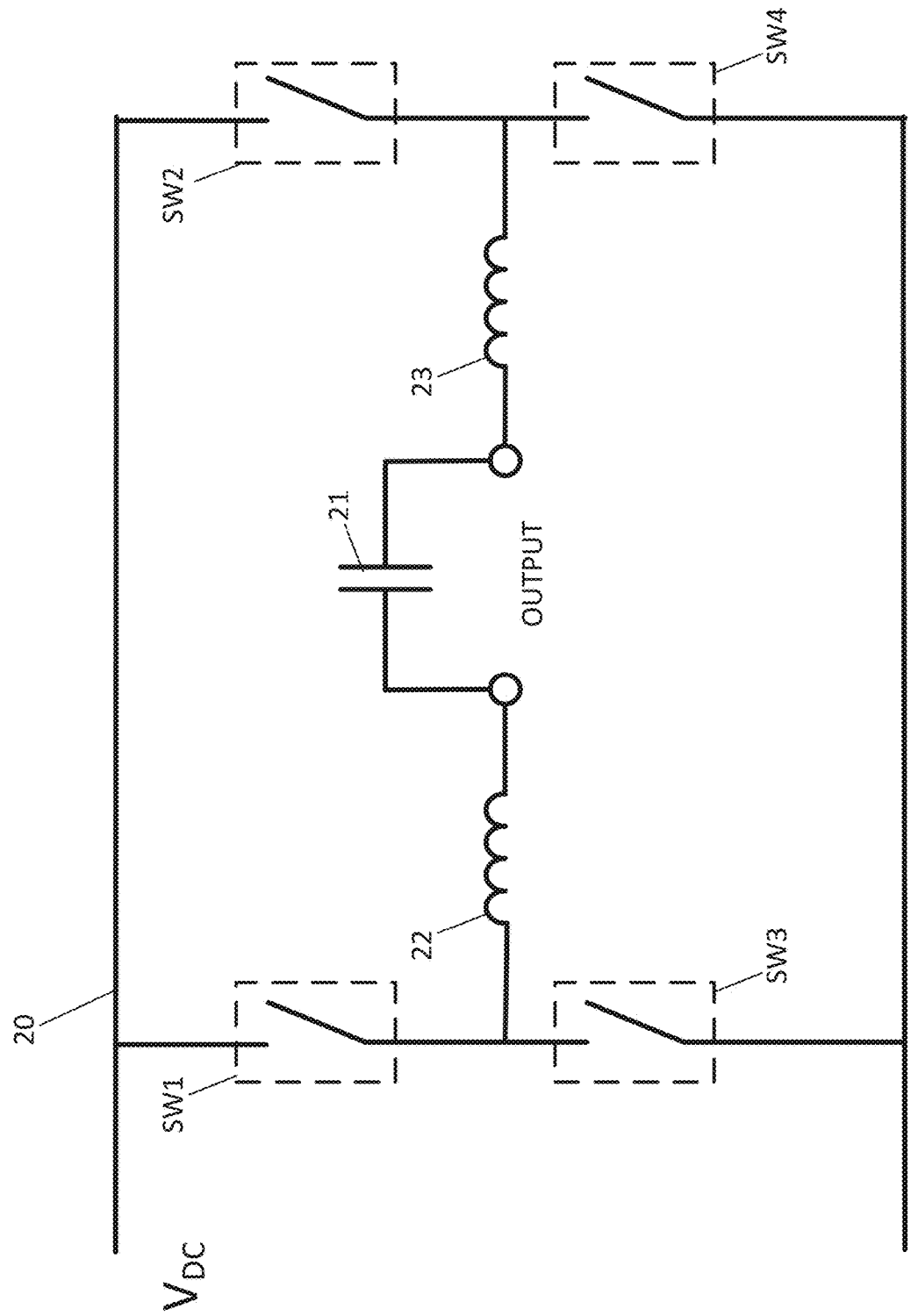
FIG. 21 illustrates an example circuit for ground fault minimization.

FIG. 21 illustrates an example circuit 11 for ground fault minimization. The circuit 11 includes a power supply rail 20 (DC link), a plurality of switches including switches SW1, SW2, SW3, and SW4. The voltage of the power supply rail is $V_{DC}$ connected to a power supply (e.g., source or voltage source). From a circuit topology perspective, the switches are arranged in a first side, including SW1 and SW3 and a second side, including SW2 and SW4. An inductor 22 is connected between a first side pair of switches SW1 and SW3 and an inductor 23 is connected between a second side pair of switches SW2 and SW4. An output of the circuit 11 is in parallel with capacitor 21 and connected to the inductor 22 and the inductor 23. The capacitor 21 or the capacitor 21 in combination with the inductor 22 and/or the inductor 23 is an output filter. Additional, different or fewer components may be included. The following embodiments may be applied to a synchronous inverter or AC-AC inverter that changes AC from a source to AC at the output.

FIG. 21 illustrates a single phase system. Alternatively, a three-phase system may be used. A three-phase system may comprise three circuits similar to circuit 11 connected in a predetermined configuration, such as a wye configuration or a delta configuration, or a configuration feeding all phases from a single DC link, such as a 6-switch line-line inverter topology. Similarly, a n-phase system (e.g., with n equal to any integer greater than 1) may include n instances of circuit 11. Any of the embodiments described herein may be adapted for a n-phase implementation.

Figure 22A:
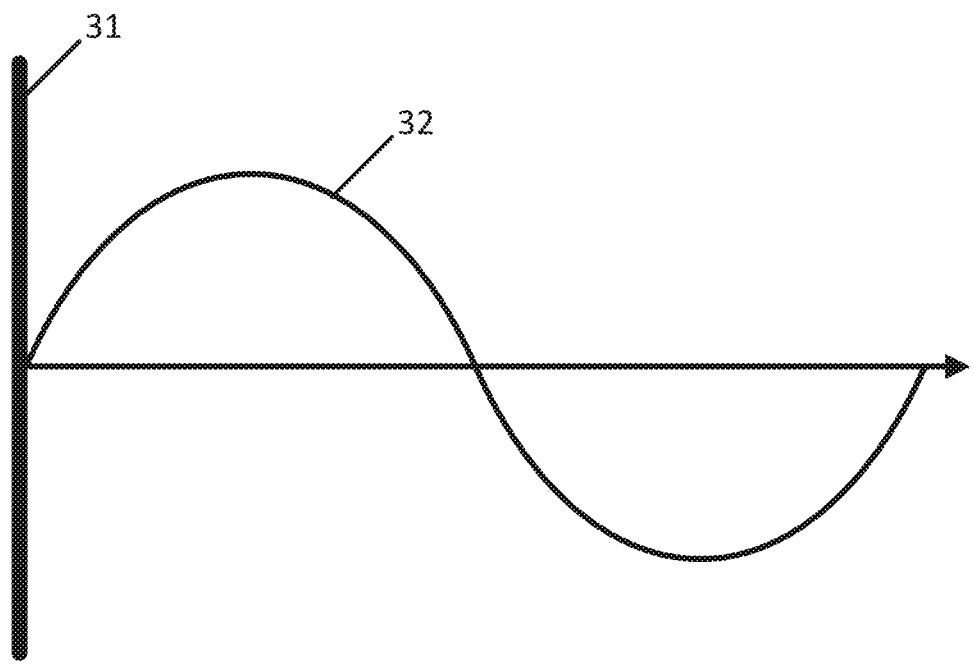
FIG. 22A illustrates an example output of an inverter.
Figure 22B:
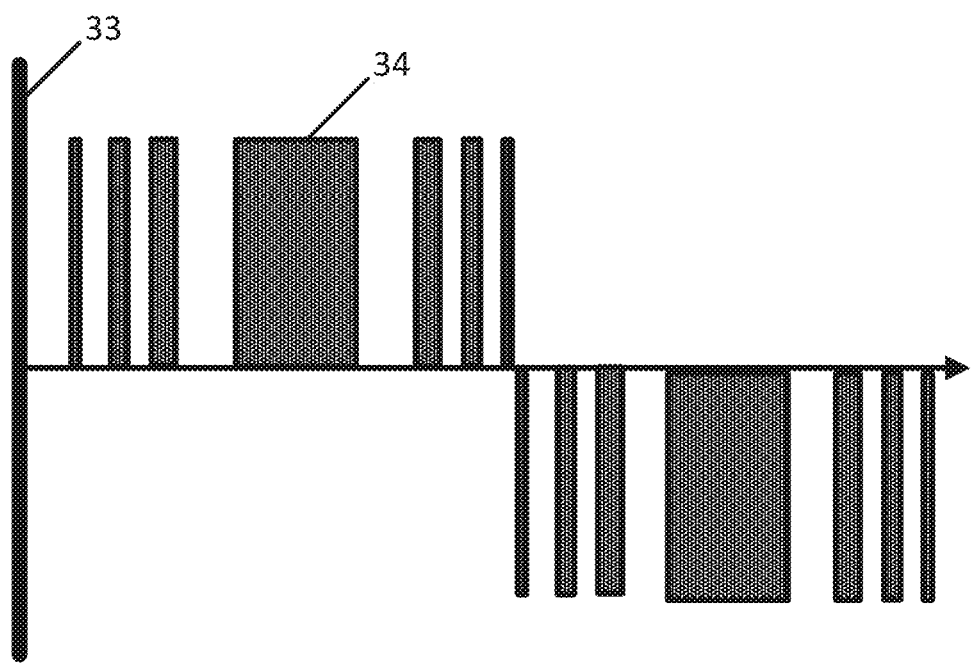
FIG. 22B illustrates an example control signal for the inverter of FIG. 22A.

FIG. 22A illustrates a chart 31 for an example output 32 of an inverter circuit. A sinusoid (e.g., sine wave) is illustrated but other waveforms may be used such as a square wave or saw tooth wave. The circuit may be controlled such that a pair of switches (SW1, SW4) provides a positive voltage and current to the output and another pair of switches (SW2, SW3) provides a negative voltage and current to the output. The circuit may be controlled using pulse width modulation (PWM) such that a control sends PWM signals to the switches. FIG. 22B illustrates an example PWM control signal for the inverter of FIG. 22A. The pulse width of the PWM signal may be proportional to the amplitude of the output of the switches. That is, when the output filter smooths the PWM signal to a sinusoidal output, the longer pulses of the PWM signal correspond to the larger amplitudes of the sinusoidal output. A combined switch signal includes a first pulse width modulated signal for the first side pair of switches and a second pulse width modulated signal for the second side pair of switches.

FIG. 22B illustrates an example chart 33 for a PWM signal 34. Chart 31 and chart 33 are aligned in time so that the increased width in the pulses of the PWM signal 34 correspond to the higher amplitudes in the output 32. The switches SW1, SW2, SW3, and SW4 may be referred to collectively or individually as the switches.

Figure 23:
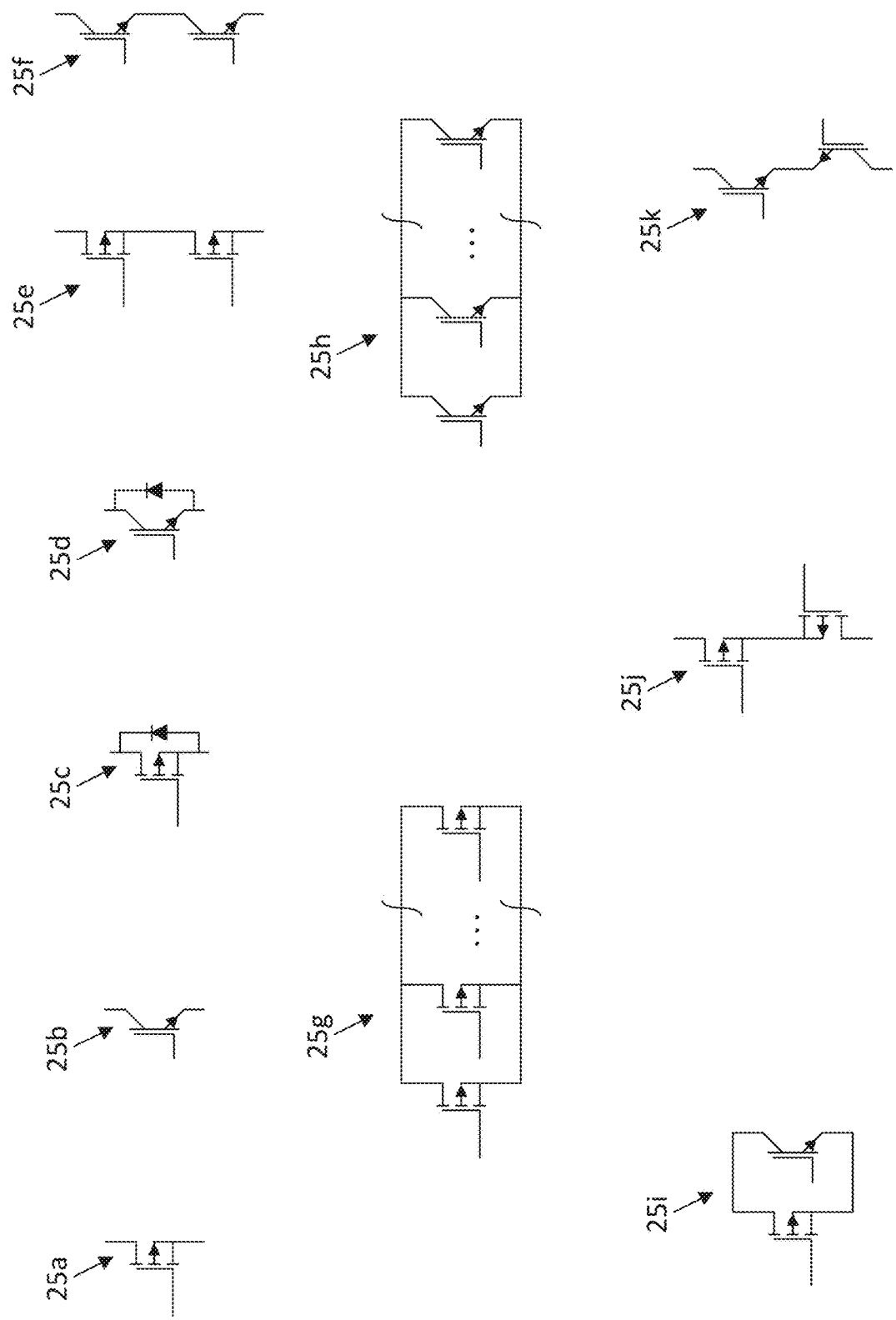
FIG. 23 illustrates examples for the switches of FIG. 21.

FIG. 23 illustrates examples for the switch of FIG. 21. The switch may be composed of a single device, such as the FET 25a or the IGBT 25b, or multiple devices in a common package, such as the combined FET and body diode 25c or the combined IGBT and body diode 25d. The switch may be composed of multiple devices connected in series, such as two FETs 25e or two IGBTs 25f. Greater than two devices may be connected in series, the series connection may include steering devices and energy storage or dissipative elements to equalize voltage across the switches.

The switch may be composed of multiple devices connected in parallel similarly to the parallel-connected FETs 25g and the parallel-connected IGBTs 25h. The switch may be composed of a parallel combination of a FET and an IGBT 25l or a combination of one or more IGBTs and one or more FETs connected in parallel. The switch may be composed by a back-to-back combinations of FETs 25j or a back-to-back combination of IGBTs 25k. Both source and drain connected FETs and emitter and collector connected IGBTs are considered as back-back combinations.

FETs included in 25e-25k may be simple FETs 25a or combined FETs with body diodes 25c. IGBTs included in 25e-25k may be simple IGBTs 25b or combined FETs with body diodes 25d. In addition, the concept of a switch is that of a means of interrupting or significantly reducing current flowing through a path and is not restricted to the embodiments detailed herein.

Figure 24A:
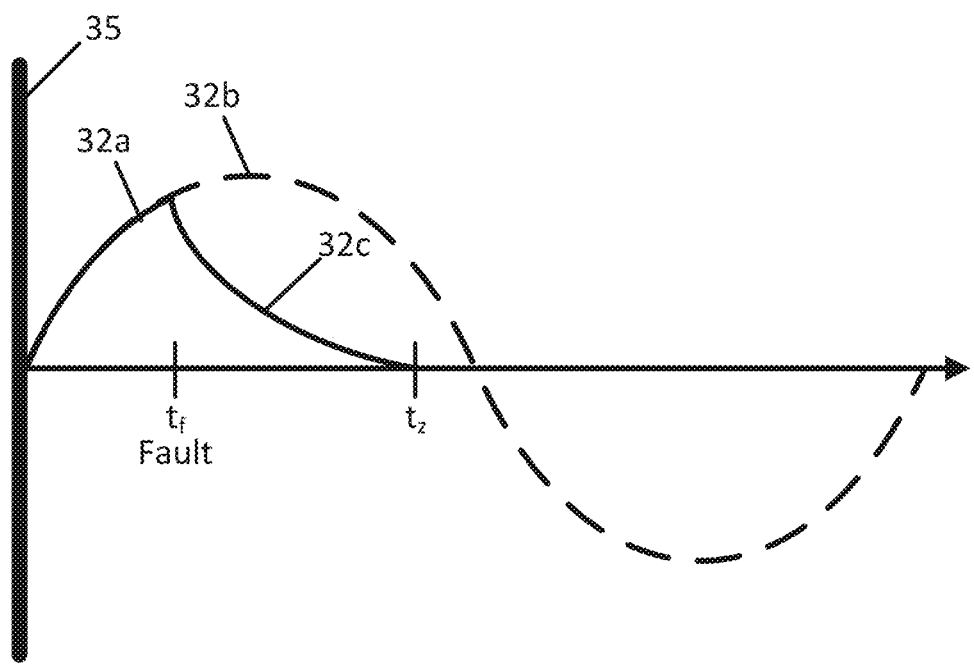
FIG. 24A illustrates an example output of an inverter responsive to a ground fault.

FIG. 24A illustrates a chart 35 with output 32. At time $T_f$ a ground fault occurred at the load. The ground fault is determined at the inverter, which is discussed in more detail below. The output 32a before the ground fault, illustrated as a solid line, follows the sinusoidal signal generated from the increasing/decreases widths of the pulses from the PWM signal. The uncontrolled output 32b, illustrated by a dotted line, illustrates the output with no control in response to the ground fault. The controlled output 32c, after the ground faults occur illustrates that the inverter is actively controlled to a threshold output such as a zero output in a short amount of time, ending at zero output point $t_z$. The switch signal in response to the ground fault signal changes a state of at least one of the switches and may change the state of two, three, or four of the switches.

The maximum amount of time between the fault $t_f$ and the zero output point $t_z$ when the output substantially reaches zero may be less than a predetermined amount. The predetermined amount of time for the maximum delay between fault $t_f$ and the zero output point $t_z$ may be a fraction of the period of the output 32. The predetermined amount of time for the maximum delay between fault $t_f$ and the zero output point $t_z$ may be a ¼L where L is the wavelength or period of the output 32. For example, for 60 Hz, the period of the cycle is 16.67 milliseconds, and ¼ of the period of the cycle is 4.2 milliseconds. Thus, for a 60 Hz signal the maximum delay between the ground fault signal and the substantially zero output from the inverter is 4.2 milliseconds.

Figure 24B:
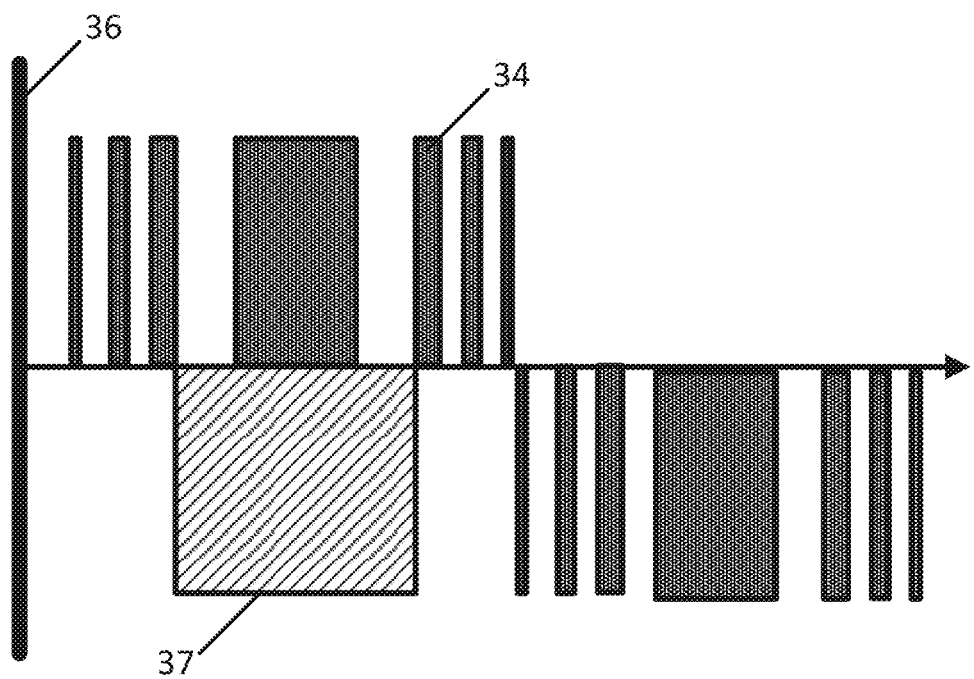
FIG. 24B illustrates an example control signal for the inverter of FIG. 24A.

A controller is configured to receive a ground fault signal that indicates a fault has occurred and configured to generate a switch signal for the switches for a minimum energy state of the output filter and in response to the ground fault signal. The inverter may be actively controlled to the threshold (e.g., zero) by inserting one or more PWM pulses into the PWM signal provided to the switches of the inverter. FIG. 24B illustrates a reverse pulse 37 that is provided to the output of the inverter in order to discharge the capacitor 21. The reverse pulse 37, as illustrated is negative when the PWM signal 34 is positive. Conversely, the reverse pulse 37 is positive when the PWM signal 34 is positive.

Under normal operation, the voltage of the capacitor 21 changes as the capacitor 21 is charged and discharged by the PWM signal 34. As current leaves the capacitor 21 the current flows to the load, and during a ground fault, the current may flow to an unintended sink such as a human or animal. However, by inserting the reverse pulse 37 to the output of the inverter, current from the capacitor 21 is reverse conducted through inductor 22 or inductor 23 to the DC link 20. Specifically, the reverse pulse 37 may adjust the voltage in inductor 22 and/or inductor 23 so that a reverse current flows through inductor 22 and/or inductor 23 and back to the DC link 20. The amount of current that flows to the DC link 20 is not available to flow to the unintended sink. If all of the stored energy in the capacitor 21 flows to the DC link 20, no current will flow to the unintended sink.

Subsequent to controlling the output of the circuit to the threshold output which is substantially zero voltage and/or zero current, the controller may send a switch signal to the switches of the circuit that turns off or opens all of the switches. In other words, in response to a ground fault detection, first the switches are controlled so that the circuit output is substantially zero, and then the switches are turned off.

Figure 25A:
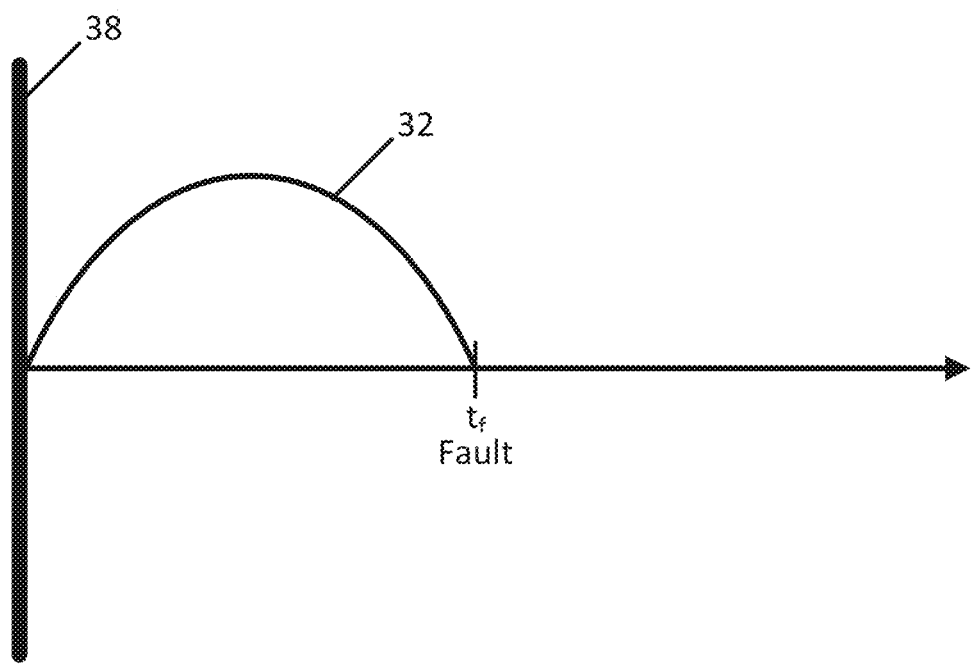
FIG. 25A illustrates an example output of an inverter responsive to a ground fault.
Figure 25B:
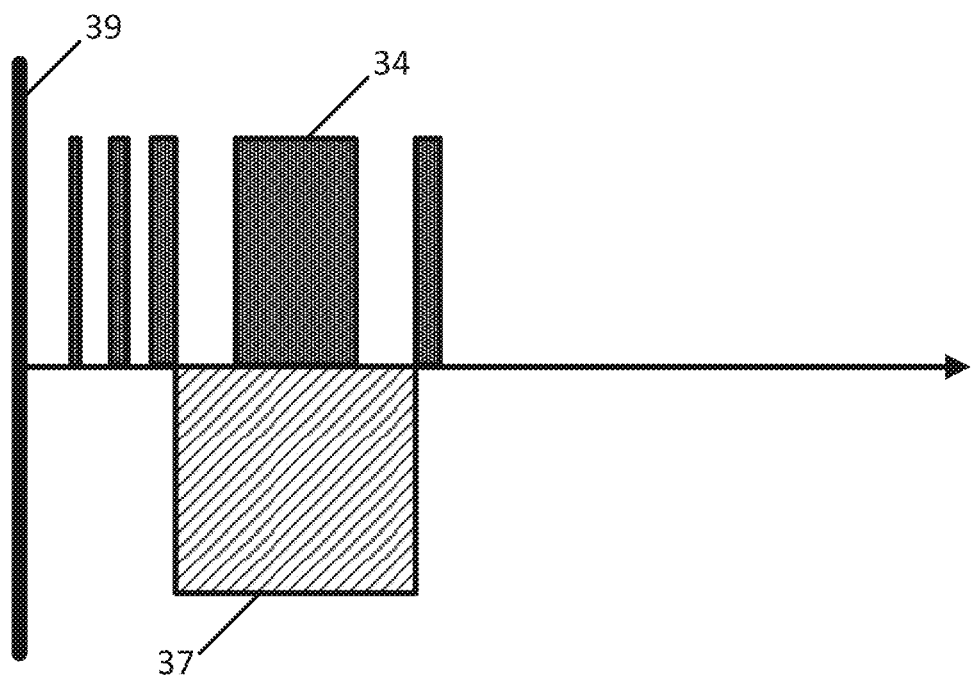
FIG. 25B illustrates an example control signal for the inverter of FIG. 25A.

FIGS. 25A and 25B illustrate the scenario when the ground fault determination occurs at or near a zero crossing of the output 32. FIG. 25A illustrates a chart 38 with output 32. At time $T_f$ a ground fault occurred at the load. The output 32 is controlled to zero in response to the ground fault. However, simply turning off all of the switches may result in ringing in the output filter (e.g., through the capacitor 21, the inductor 22, and/or the inductor 23). Instead, the output 32 is controlled to zero by adding pulse 37 to the PWM signal that controls one or more of the switches of the inverter.

Figure 26A:
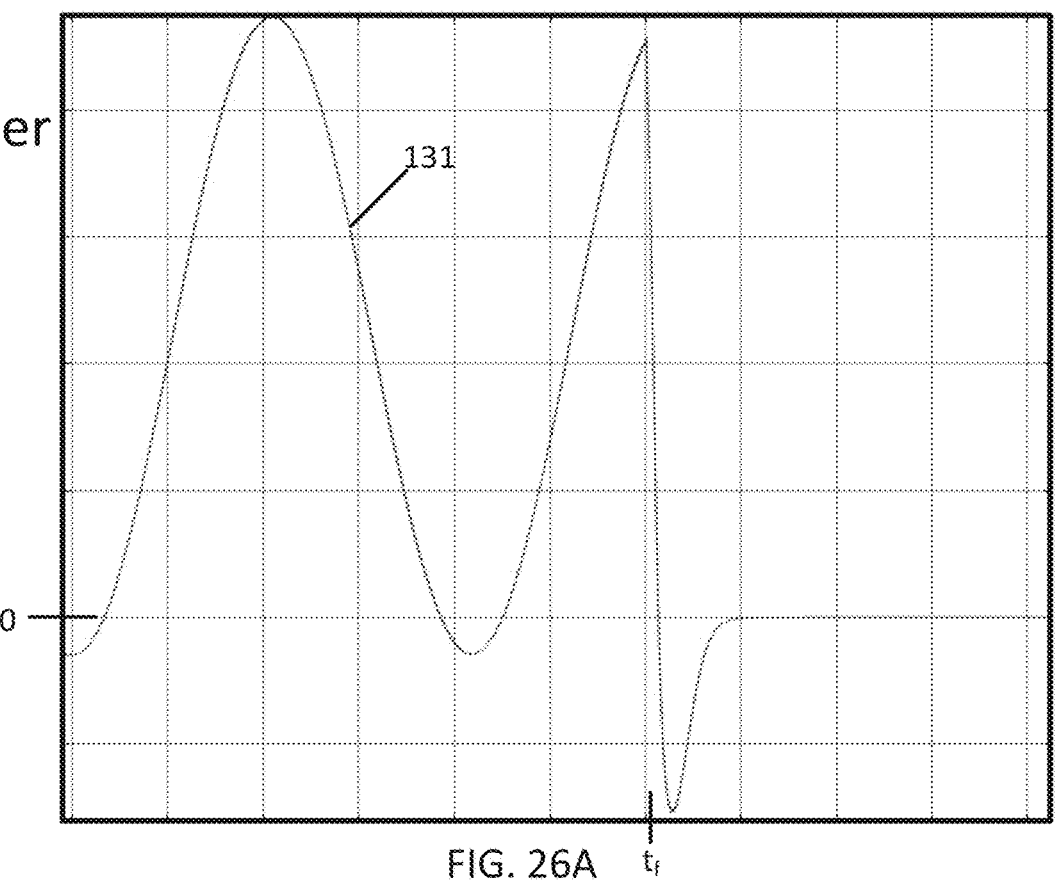
FIG. 26A illustrates an example response by actively controlling switches of the inverter.

FIG. 26A illustrates an example response by actively controlling switches of the inverter. The plot 131 shows the power provided to the output filter through the inverter switches SW1, SW2, SW3, and SW4 from the DC link. This power is normally transferred to the load. Specifically, the capacitor 21 is discharging to the load and charging through the inductors 22, 23. When the plot 131 goes negative at $t_f$ power is provided into the inverter circuit. Specifically, the capacitor 21 is discharging both through the load or ground fault and through the inverter circuit to the DC link. It should be noted that the switches SW1, SW2, SW3, and SW4 may be disabled after the output voltage has reached zero.

Figure 26B:
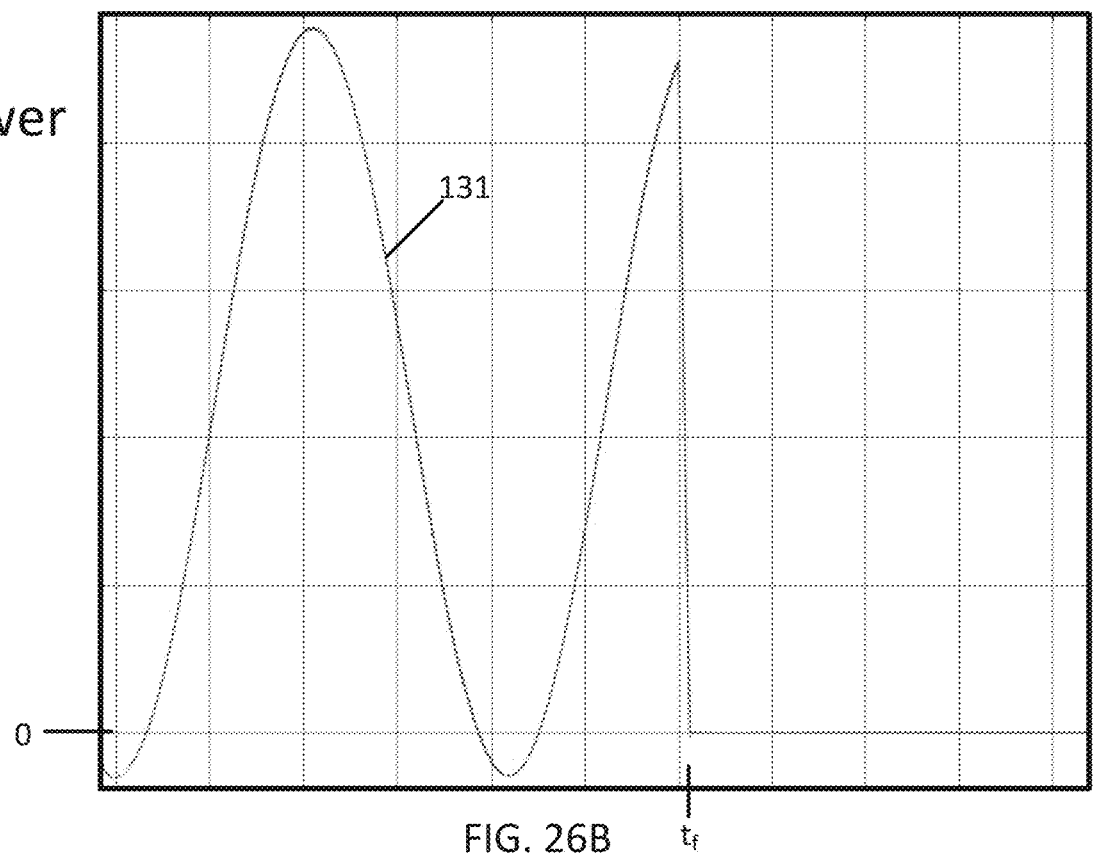
FIG. 26B illustrates an example with the switches of the inverter turned off.

FIG. 26B illustrates an example with the switches of the inverter turned off. When the switches are turned off at $t_f$ power is not taken out of the capacitor 21 and the DC link. Any energy that is stored within capacitor 21 must discharge through a load or ground fault on the output of the inverter. With all switches turned off, no other current path is present to discharge capacitor 21.

Figure 27:
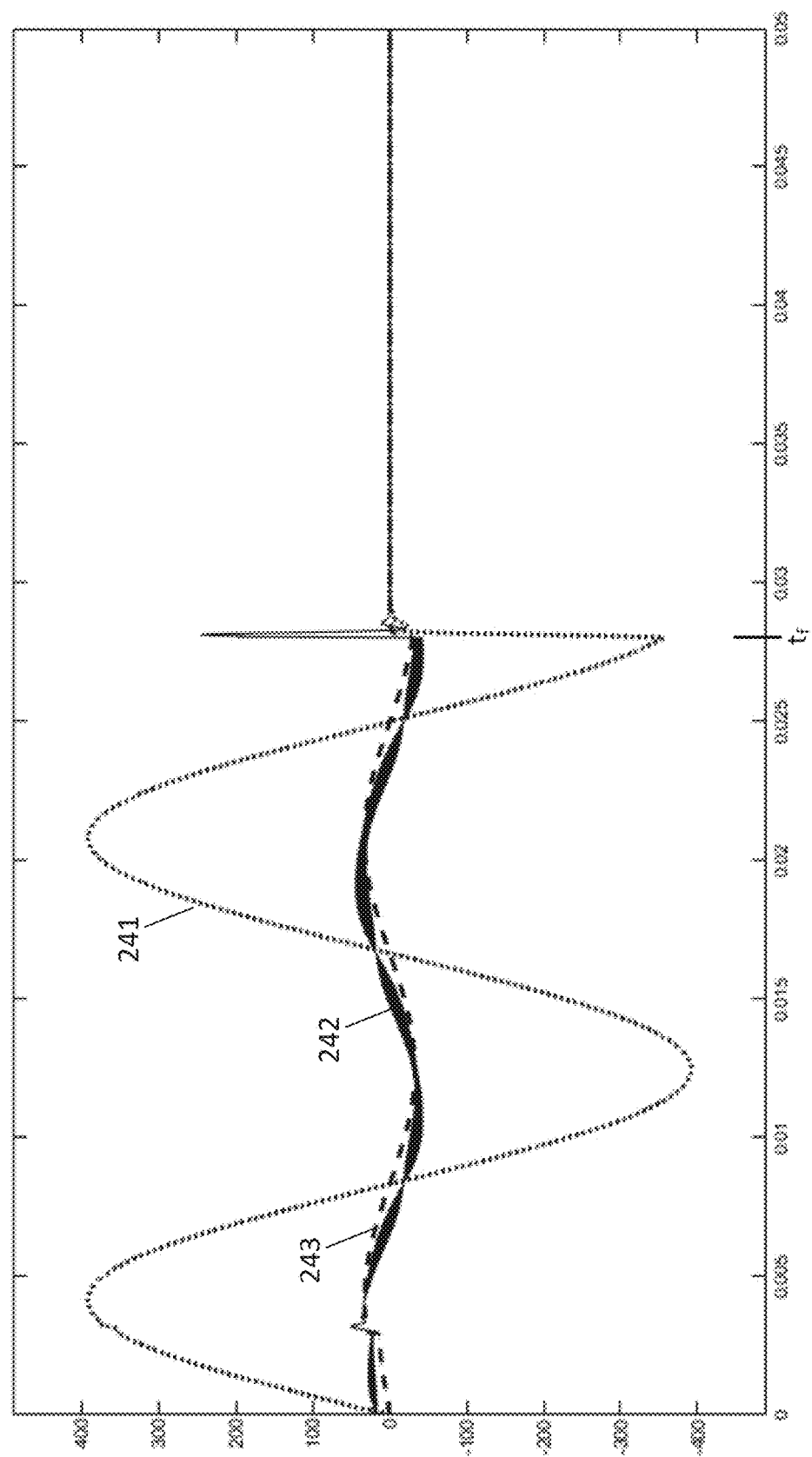
FIG. 27 illustrates an example plot of voltage or current provided to a ground fault using active control.

FIG. 27 illustrates a controlled example using ground fault minimization. FIG. 27 includes an example plot 241 of voltage, an example plot of current 242 through the output filter (e.g., inductor 22 or 23), and an example plot 243 of current to the load. At the time of ground fault detection, $t_f$ the switches are controlled to apply a reverse voltage to the output filter. This reverse voltage induces the inductor current 242 to reverse, thereby reducing the amount of stored energy from capacitor 21 that is delivered via the load current 243 to the load and/or ground fault.

Figure 28:
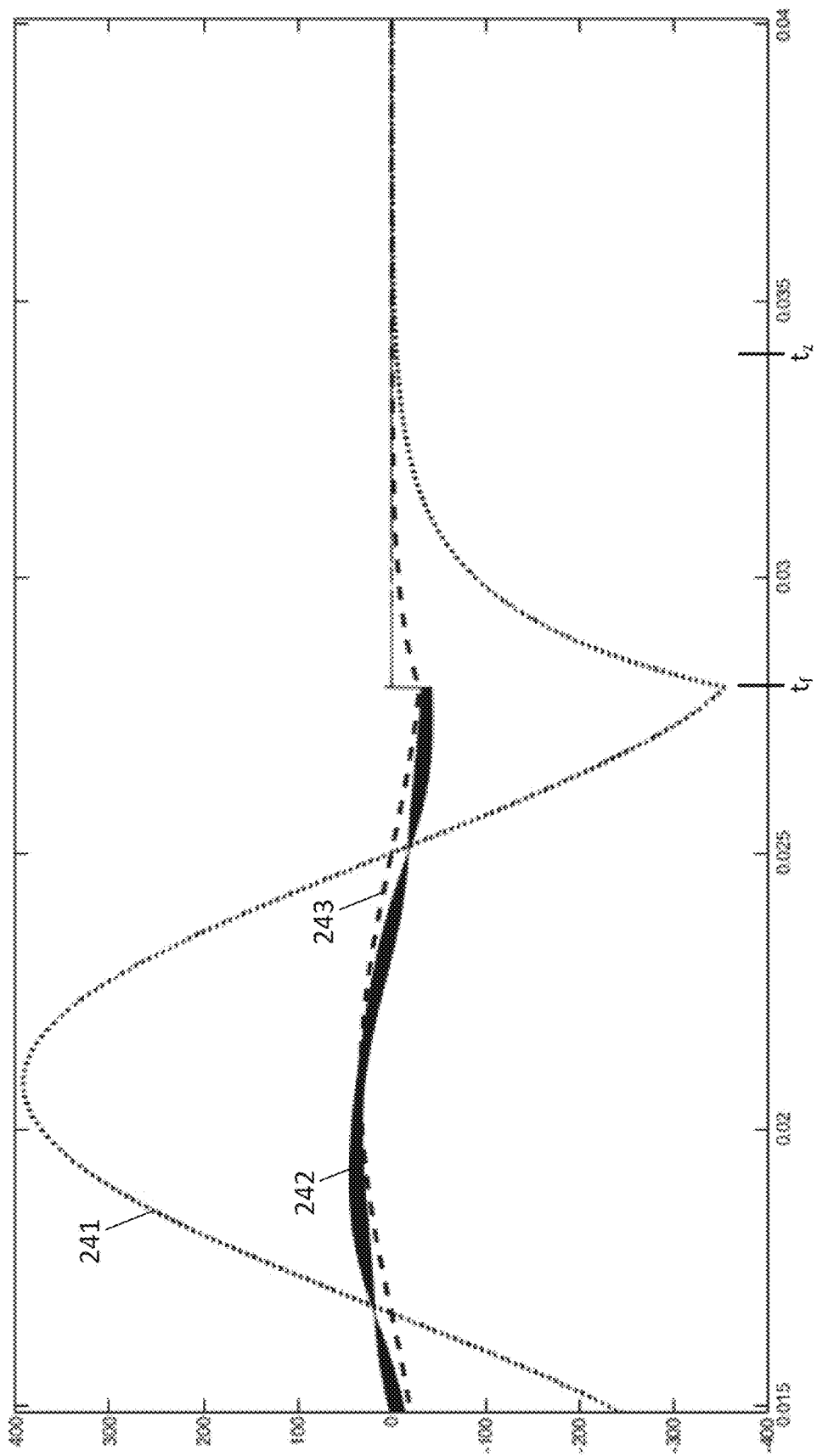
FIG. 28 illustrates an example plot of voltage or current provided to a ground fault without active control.

FIG. 28 illustrates an uncontrolled example without ground fault minimization. FIG. 28 illustrates an example plot 241 of voltage, an example plot of current 242 through the output filter (e.g., inductor 22 or 23), and an example plot 243 of current to the load. At the time of ground fault detection, $t_f$ the switches are opened, disallowing current to flow between the DC link and the output filter. The inductor current 242 is interrupted and may be discharged through a snubber network or similar mechanism. Without a path to remove energy from the capacitor 21 to the DC link, the capacitive energy will discharge through the load and/or the ground fault. The magnitude of the load current 242 and duration from $t_f$ to $t_z$ will be dependent primarily upon the energy in the capacitor 21 and the load and/or ground fault impedance.

Figure 29:
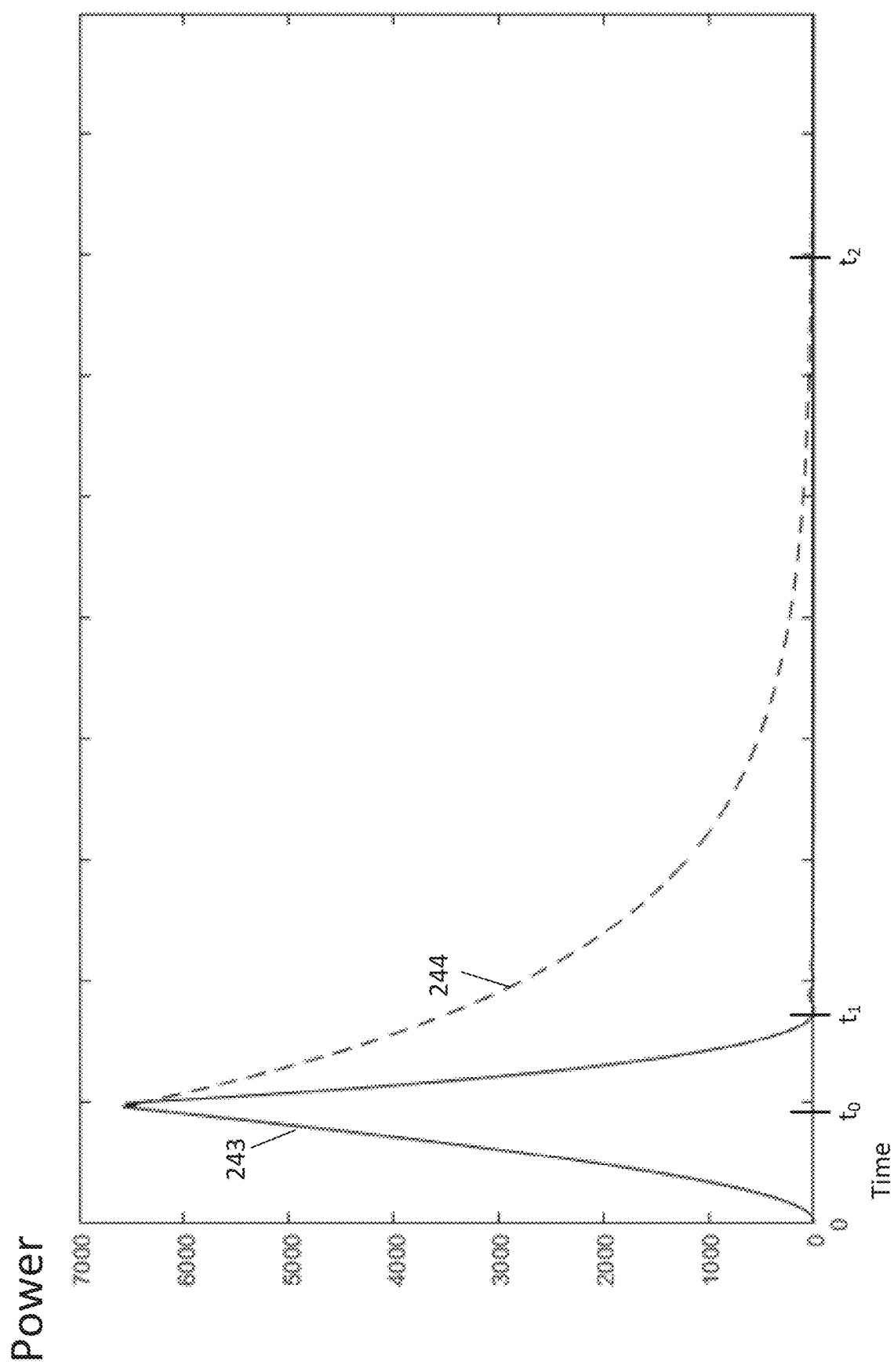
FIG. 29 illustrates an example plot for energy delivered to the ground fault.

FIG. 29 illustrates a time plot of the power delivered to a load by an inverter containing an output filter with an inductive element and a capacitive element. The power output before the time $t_0$ is normal for the inverter and is related to the load connected to the inverter while a ground fault does not exist on the output of the inverter. The power output after $t_0$ is provided partially to the load and partially to the fault e.g. the component, element, person or animal providing the ground fault path.

The dashed line 244 illustrates the power delivered to the load and fault during a ground fault scenario where the inverter disables all switching elements. The power decreases from time $t_0$ to time $t_2$ where it is effectively 0. In this scenario, the area under the power time plot effectively represents the energy stored in the output filter inductor and capacitor at time $t_0$.

The solid line 243 illustrates the power delivered to the load and fault during a ground fault scenario where the inverter intentionally controls the output to 0. The power decreases from time $t_0$ to time $t_1$ where it is effectively 0. In this scenario, the difference in the area under the power time plots 243 and 244 effectively represents the difference between the energy stored in the output filter inductor and capacitor at time T0 and the energy intentionally transferred from the output filter inductor and output filter capacitor into the energy storage element or supply of the inverter. For a time duration, a first energy corresponding to the switch signal after the ground fault signal is less than a second energy corresponding to a preceding switch signal for the same time duration before the ground fault signal. It should be noted that the energy related to solid line 143 is substantially less than the energy related to dashed line 144.

It should be noted that the inverter typically changes from a minimum power to a maximum power twice per cycle of the inverter output, once for the positive-going portion and once for the negative-going portion. In order to provide the appropriate output signal, an inverter may be required to increase to a maximum power state and to reduce from that maximum power state to a zero-power state twice in a cycle of the output. In this case, the inverter will typically be capable of reducing from a maximum power state to a minimum power state in one quarter of an output cycle. If the inverter is able to actively control the output from a maximum power state to a zero-power state during normal operation, it should be able to actively control the output to a zero-power state in a similar time in the event of a ground fault. When not controlled, the time to reduce to a zero-power state may be largely dependent on the characteristics of the load, with lower loads reducing the output voltage more slowly.

Figure 30:
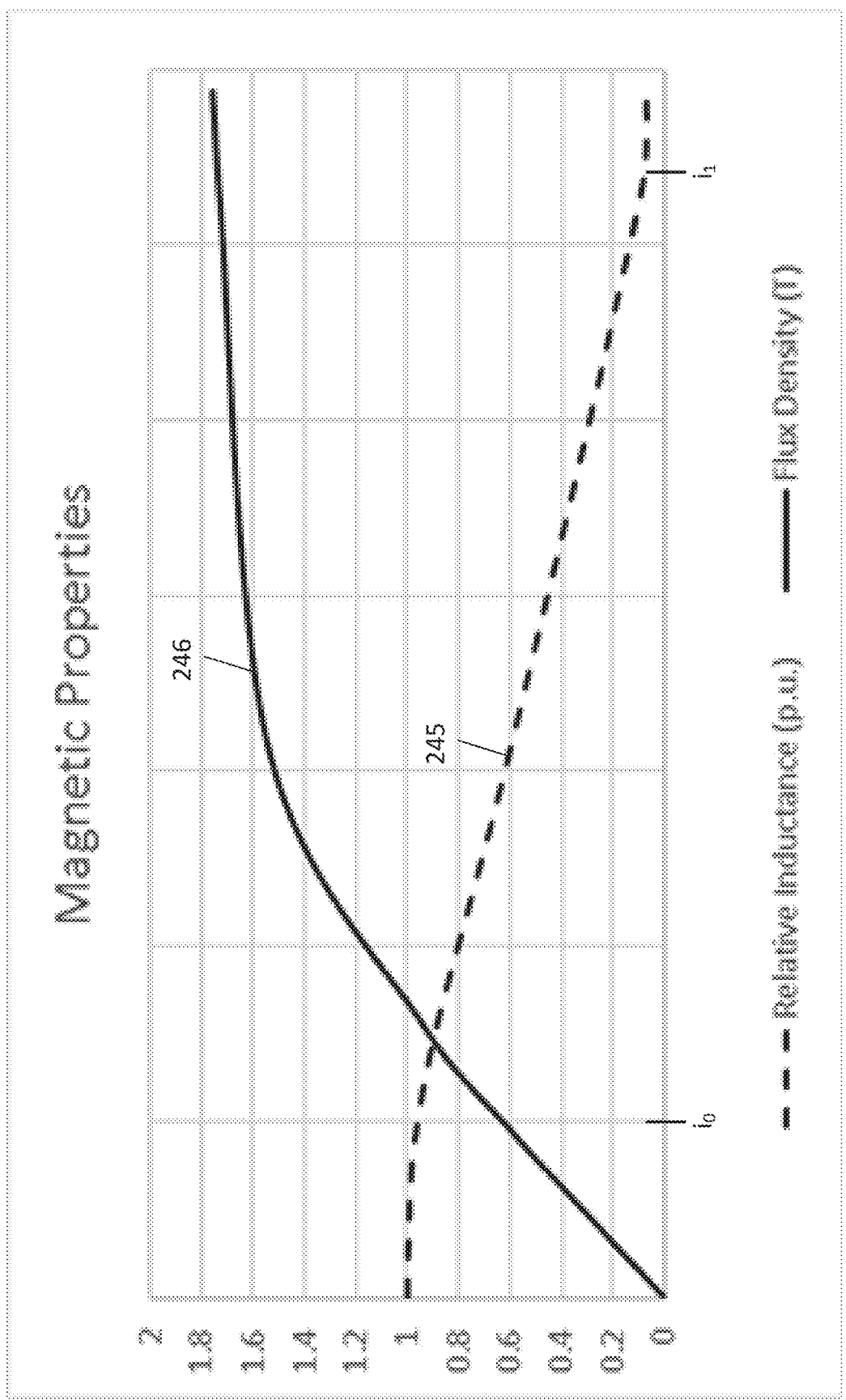
FIG. 30 depicts a typical magnetization curve for an example magnetic material.

FIG. 30 depicts a typical magnetization curve for an example magnetic material. The curves are plotted relative to current passing through a coil of a known number of turns placed in a way to enclose some or all of the magnetic material, resulting in an inductive element, such as an inductor or transformer.

The dashed line 245 illustrates the relative inductance, resistance to changes in current, of an inductive element as compared to a nominal inductance at 0.1 T over a range of inductor currents. The relative inductance of the inductive element can be seen to decrease significantly above a saturation knee current level $i_0$ and to decrease to 10% of nominal inductance at a fully saturated current level $i_1$.

The solid line 246 illustrates the magnetic flux density contained within the example magnetic material of the inductive element over a range of inductor currents. The energy contained within the inductor is largely contained in the magnetic flux, which is directly related to magnetic flux density in a material with a fixed or substantially fixed geometry. At a current level $i_0$, the magnetic flux density within the magnetic material is approaching a reasonable maximum. At a current level $i_1$, the magnetic flux density has reached a reasonable maximum level, where very large currents will be required to make a noticeable increase in the magnetic flux density within the material.

The dashed line 245 is related to the slope of the solid line 246, as the inductance of the inductive element is largely related to the change in flux density which influences the energy stored within the magnetic material.

Other magnetic materials may exhibit similar or different properties, but limiting the DC current maximum while providing maximum RMS output current is still beneficial for all materials with non-linear diminishing behavior in the inductance (saturation characteristics). Changing air gap, number of turns, and material quantity may also change the shape and behavior of the magnetization curve, but will retain saturation behavior, even if this point occurs at a different current level and with differently-shaped curves.

An inverter may rely on the inductance of the inductive element of the output filter to limit the rate that current increases into a fault condition. If the inductance of the inductive element of the output filter is below a certain threshold, e.g. 100 uH, the output current may increase too quickly, resulting in excessive current on a switching element in the inverter e.g. 40A within a single switching cycle of the inverter e.g. 10 microseconds. To prevent damage to the inverter, the inductive element of the filter may be required to retain inductance over this threshold, which may require increasing the size of the inductive element in order to support short-circuit current.

In order to provide sufficient current to allow protective devices such as fuses or circuit breakers downstream of a power source to operate in an acceptable timeframe, a power source may be required to provide a higher current to a short circuit condition than it provides to a normal load. In some cases, this current may be a multiple of the inverter rated current, such as three times rated current. Due to the low impedance of a short circuit the output voltage of the power source may be reduced, potentially reducing the real power requirement of the load. In this case, the load on a power source feeding an inverter may be reduced, but the inverter may still need to supply a current to the short circuit in order to operate downstream circuit protection devices.

Figure 31:
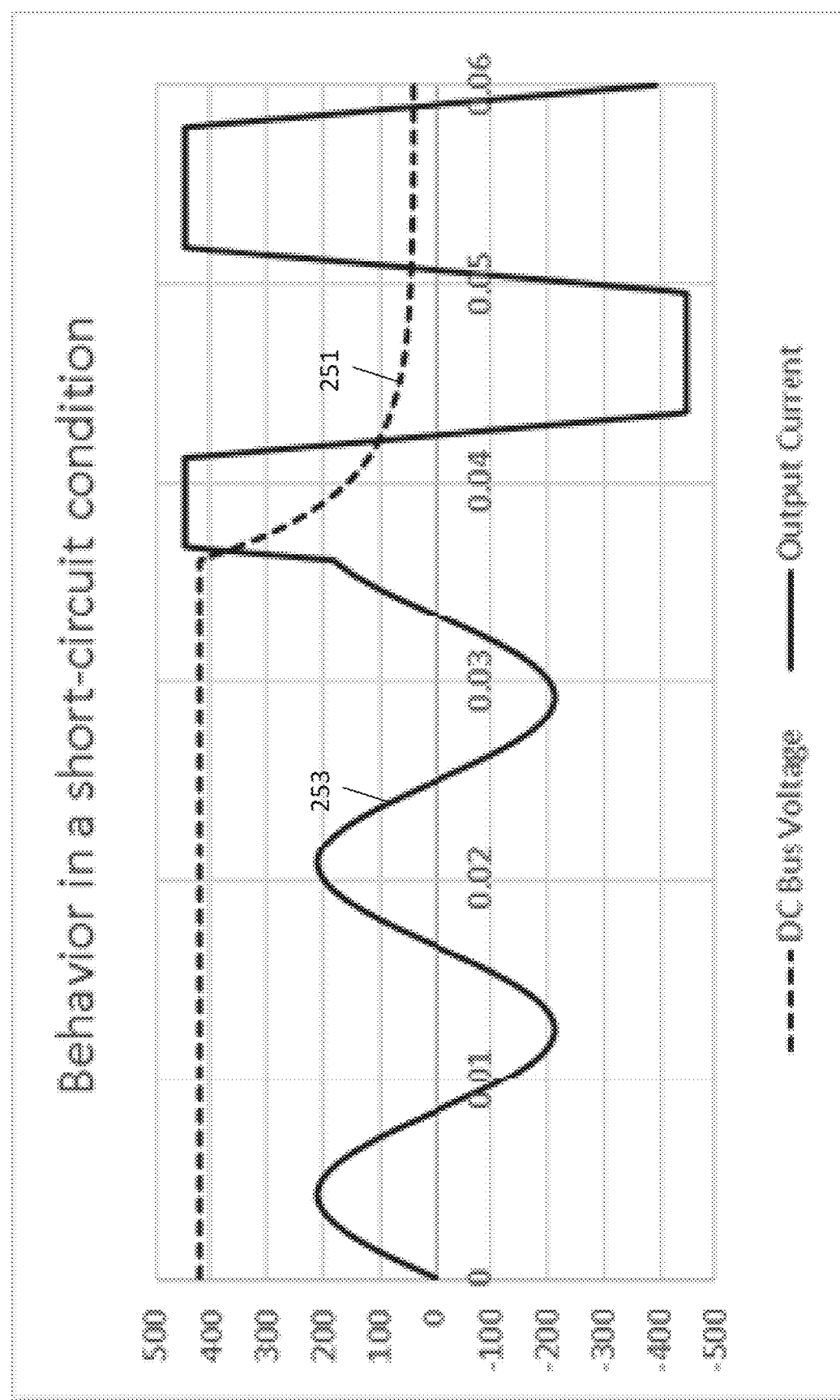
FIG. 31 provides an illustration of the voltage of an internal energy storage element for an inverter reduced during a short circuit condition.

FIG. 31 provides an illustration of the voltage of an internal energy storage element (illustrated as dashed line 251) and output current (illustrated as solid line 253) for an inverter where the voltage is reduced during a short circuit condition. The ripple on the output current of an inverter may be reduced by both the inductive element and the capacitive element in the output filter of the inverter during normal operating conditions, but may only be reduced by the inductive element during a short circuit condition due to a reduction in the output voltage due to a low impedance connection across the output of the inverter. In the short-circuit condition, the output current ripple may exceed a certain threshold (e.g. 1%) at the switch frequency of the inverter.

The ripple on the inductive element of the output filter is linked to the voltage applied across the inductive element of the output filter, which may be related to the switching sequence of the inverter, the voltage on the internal storage elements within the inverter, the voltage across the capacitive element of the output filter, or a combination thereof. In some cases, reducing the operating voltage on the internal storage elements within the inverter may reduce the ripple across the inductive element of the output filter, especially cases where the output of the inverter is connected to a short circuit.

Figure 32:
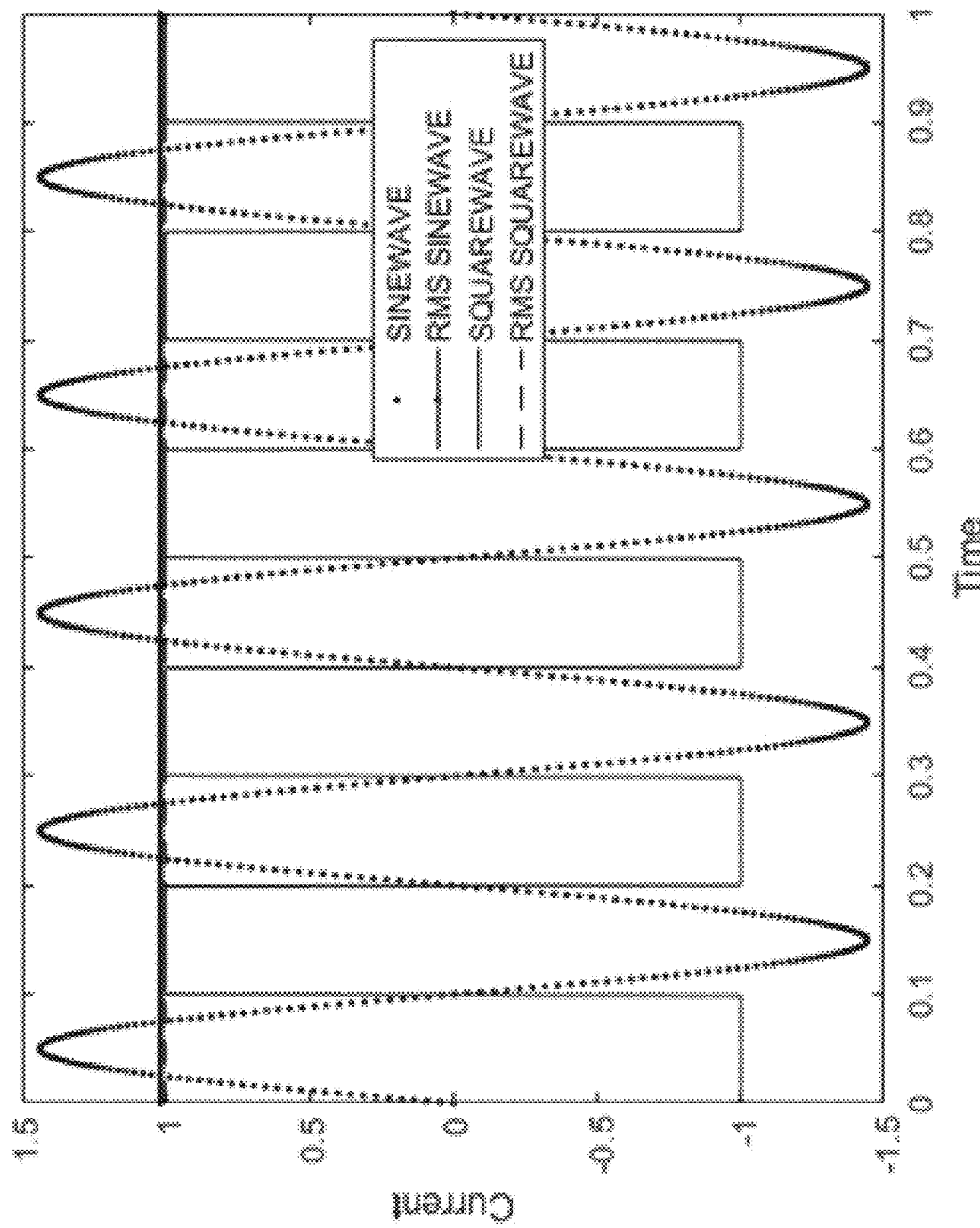
FIG. 32 provides a comparison between two different output waveshapes

FIG. 32 provides a comparison between two different output waveshapes to produce a comparable RMS (root mean squared) output. The peak current required for the sinusoidal output is noticeably higher than the peak current required for a square-wave output, while providing equivalent clearing current (for tripping of coordination devices, such as fuses and breakers). Lower peak currents may reduce required inductor size on an output filter of an inverter while providing protection for switches within the inverter.

In some applications, the output current may be controlled not to exceed a current threshold relating to a saturation point of the inductive element of the output filter. Control to a maximum output current may result in a square wave output. Control to a maximum output current may be performed based on a computed, estimated or pre-configured expected rise rate of current in the inductive element of the output filter.

FIGS. 33-37 illustrate various embodiments of controlling the output of the inverter circuit to zero. In some embodiments, a controller 40 receives data indicative of a ground fault and controls the switches of the inverter in response to the ground fault. In other embodiments, the inverter circuit includes logic to control the switches in response to a ground fault signal.

Figure 33:
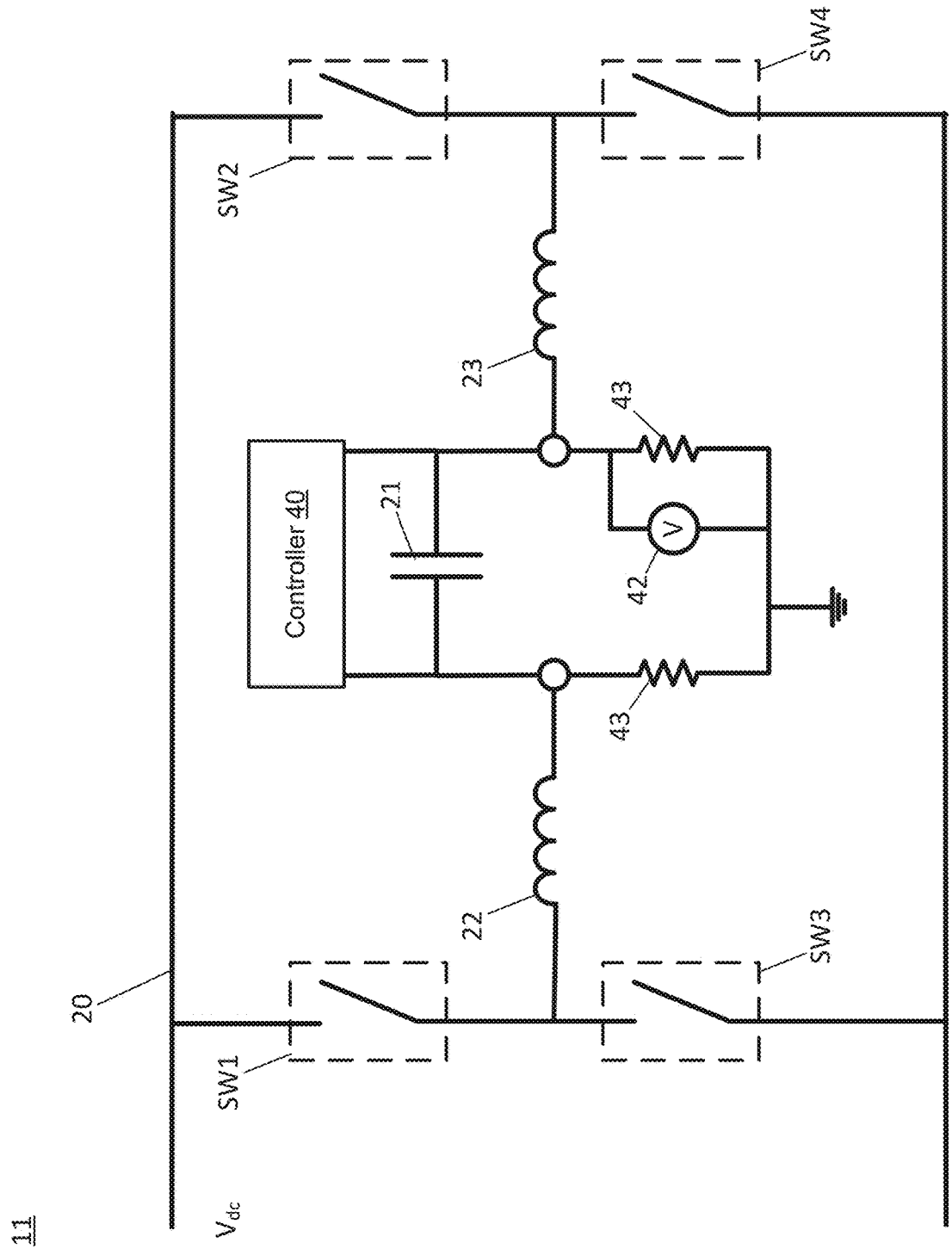
FIG. 33 illustrates an example circuit for ground fault minimization detected by resistive impedance.

FIG. 33 illustrates an example circuit for ground fault minimization detected by resistive impedance. The output connected to the load includes one or more resistors 43 connected to ground. The resistors 43 may alternatively represent one or more components or devices in the load circuit that have a resistive property.

Figure 34:
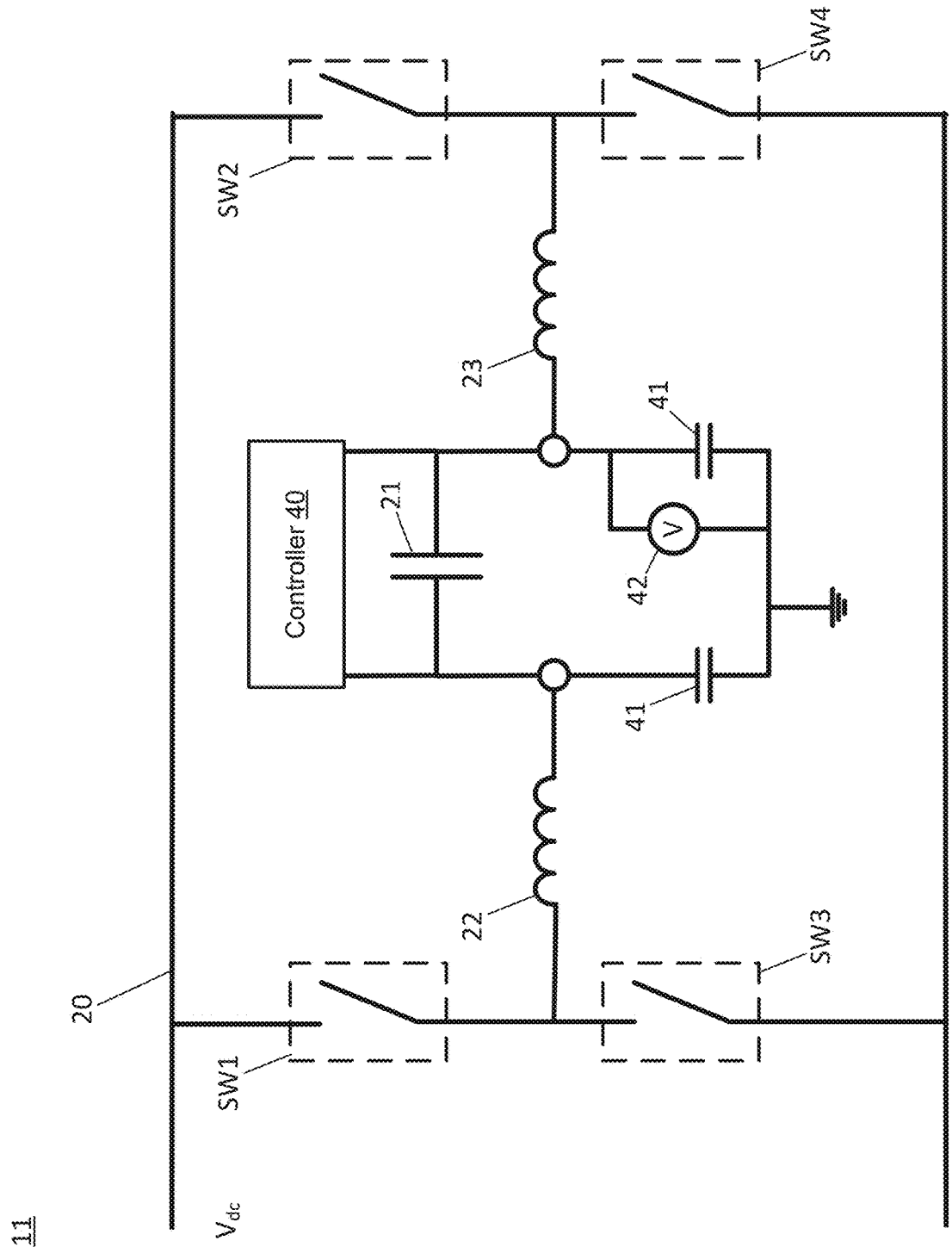
FIG. 34 illustrates an example circuit for ground fault minimization detected by capacitive impedance.

FIG. 34 illustrates an example circuit for ground fault minimization detected by capacitive impedance. The output connected to the load includes one or more capacitors 41 connected to ground. The capacitors 41 may alternatively represent one or more components or devices in the load circuit that have a capacitive property. Alternatively, the output filter capacitor 21 may be connected to ground in such a way to provide capacitance 41.

A sensor, such as voltmeter 42, may detect the impedance to ground at the output of the inverter circuit 11. The sensor may be internal or external to the controller 40, which analyzes the sensor data from the sensor. The controller 40 compares the impedance to a predetermined threshold. When the impedance to ground is less than the predetermined threshold, the controller 40 determines that a ground fault has occurred. In response to the determination of the ground fault detected from the impedance seen at the output, the controller 40 generates a control signal for the switches of the inverter to cause the output 32 to go to zero within the time delay. The time delay may be an intentional minimum delay or another preconfigured or computed delay.

Figure 35A:
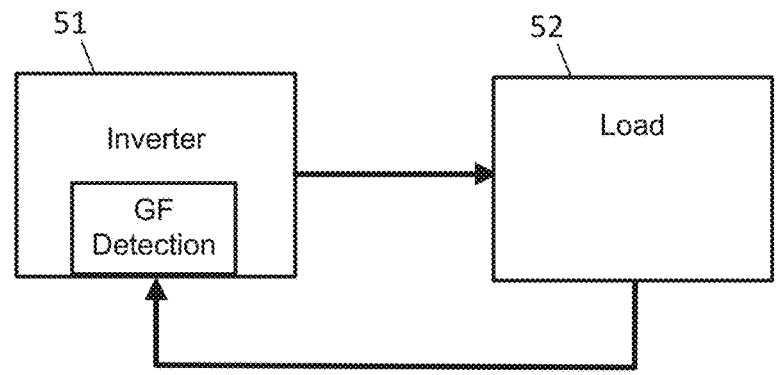
FIG. 35A illustrates an example system with ground fault detected at an inverter circuit.
Figure 35B:
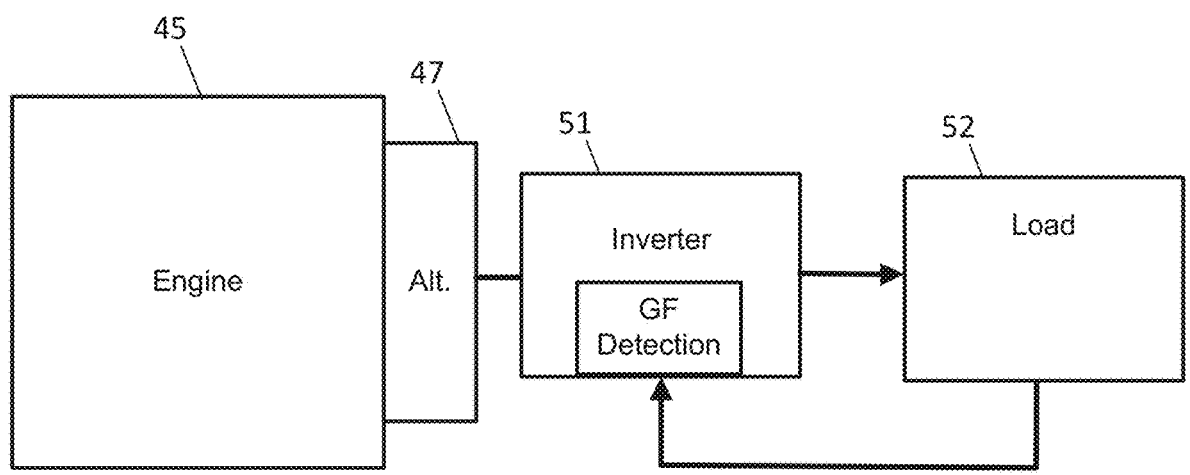
FIG. 35B illustrates an example system with ground fault detected at an inverter circuit coupled with an engine generator set.

FIG. 35A illustrates an example system with ground fault detected at a load circuit 52 connected to an inverter 51 implementing any of the embodiments for ground fault minimization. As described with respect to FIGS. 33 and 34, the ground fault may be detected at the inverter 51. FIG. 35B illustrates an example system with ground fault detected at a load circuit coupled with an engine generator set including engine 45 and alternator 47.

The engine 45 may include one cylinder, two cylinders or another number of cylinders. The one or more cylinders may include oscillating one or more pistons. The one or more pistons may be guided through the one or more cylinders by a connecting rod that is connected to a crankshaft by a crankpin. A combustion chamber includes a combustion chamber adjacent to a head of the piston. The combustion chamber is formed in a cylinder head. In one phase of a combustion cycle for the piston, the exhaust port is blocked from the combustion chamber by the piston, and in a subsequent phase, the exhaust port is in gaseous connection with the combustion chamber to release exhaust gas through the exhaust port to a muffler.

The alternator 47 is configured to generate a single-phase or poly-phase signal through operation of the engine 45. The controlled field alternator 47 may include an exciter armature for generating a field current. As the exciter armature is rotated in a magnetic flux, a time varying voltage is induced in the windings of the exciter armature. The output from the exciter armature is connected to the main field portion of generator. The connection may be made with or without brushes and slip rings. The field current of the output of the exciter provides a magnetic field in rotor field of the generator. As the field portion of the alternator is rotated relative to the stator, a magnetic flux is passed through and across the alternator stator windings producing time varying voltage. The field current from the exciter armature output may be rectified or otherwise controlled.

The output of the alternator 47 may be a three phase signal. The phases of the poly-phase signal may be offset one another by a predetermined angle (e.g., 120 degrees or 2*Pi/3 radians). The poly-phase signal may vary with respect to amplitude and frequency.

Figure 36A:
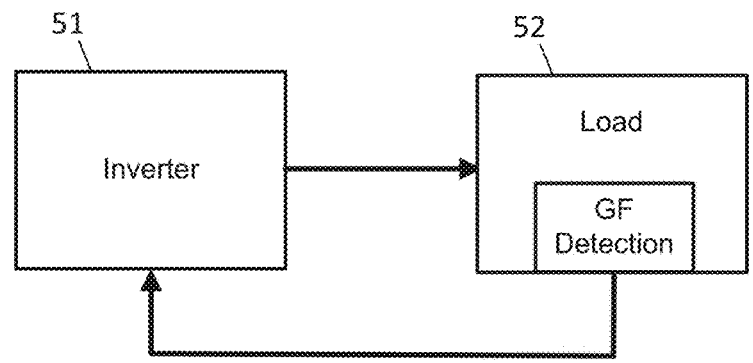
FIG. 36A illustrates an example system for ground fault detection at a load circuit.
Figure 36B:
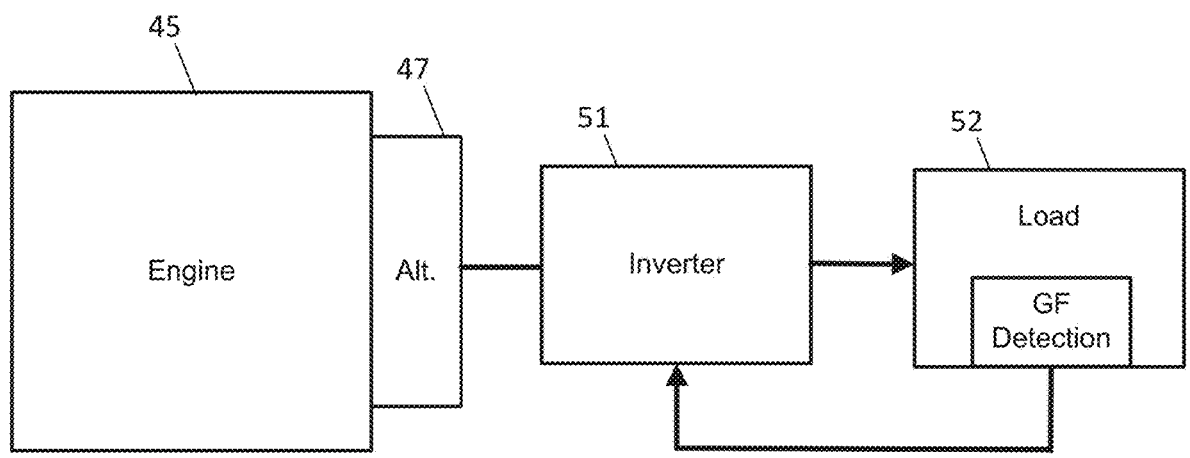
FIG. 36B illustrates an example system for ground fault detection at a load circuit coupled with an engine generator set.

FIG. 36A illustrates an example system for ground fault detection at a load circuit 52. FIG. 36B illustrates an example system for ground fault detection at a load circuit 52 coupled with an engine generator set including engine 45 and alternator 47. The load circuit 52 may include an external ground fault detector, such as a ground fault circuit interrupter (GFCI), sensitive earth fault protection (5ONs), or ground fault alarm (GFA) that is configured to generate the ground fault signal. The ground fault detector may compare the amount of current flowing to the load circuit 52 to a threshold. When the external ground fault detector determines that current greater than the threshold is flowing in the load circuit 52, the ground fault signal is returned to the inverter circuit 51.

Figure 37A:
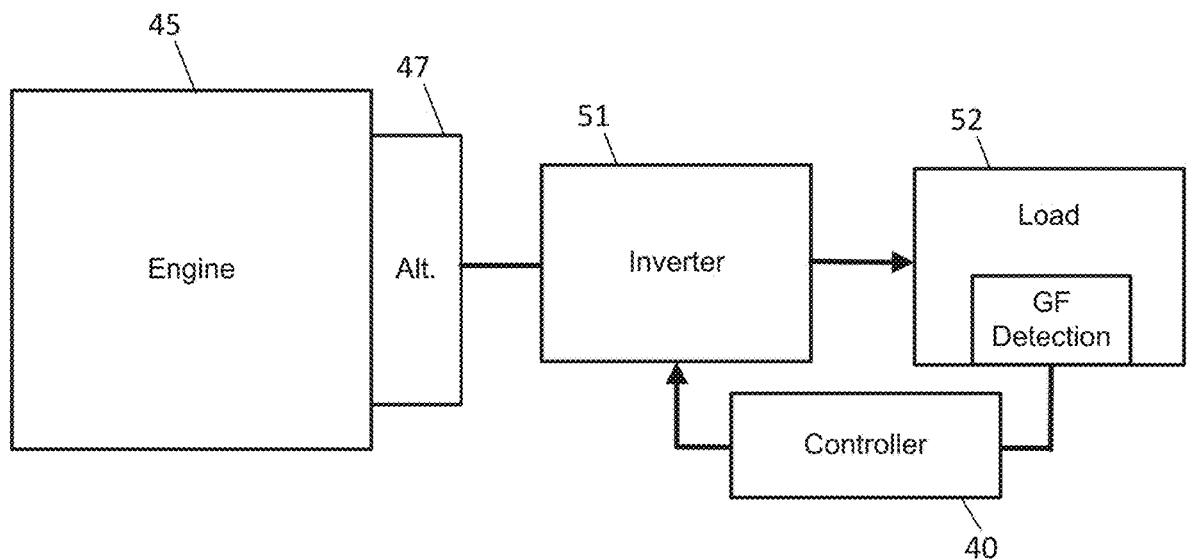
FIG. 37A illustrates an example system with a controller for ground fault detection at a load circuit.

FIG. 37A illustrates an example system with a controller 40 for ground fault detection at a load circuit 52. The controller 40 may receive sensor data collected at the load circuit 52 and analyze the sensor data to determine when the ground fault has occurred.

Figure 37B:
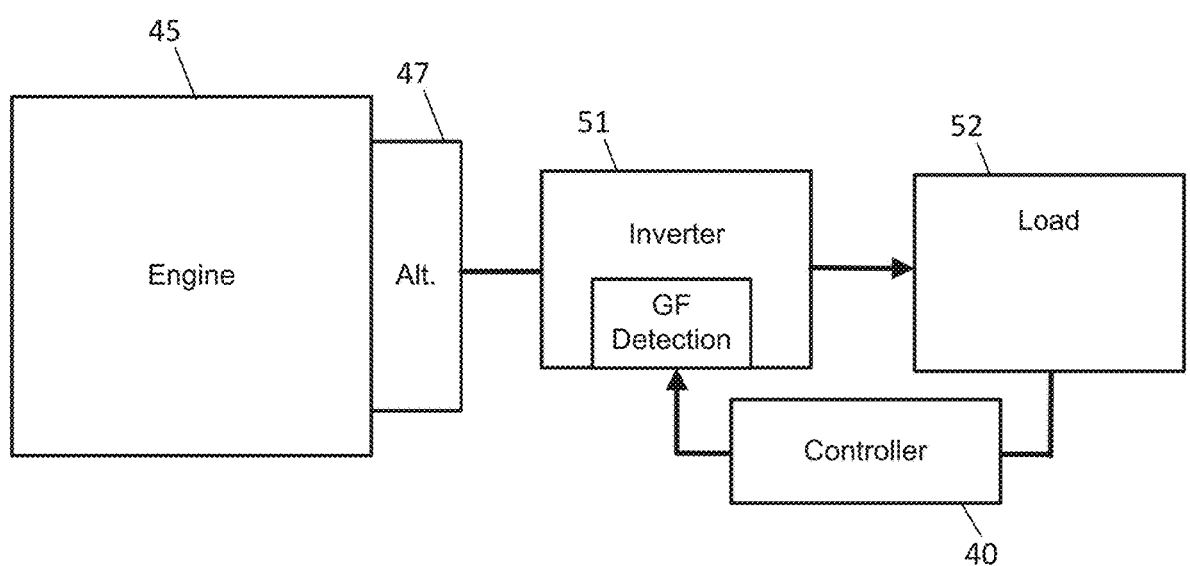
FIG. 37B illustrates an example system with a controller for ground fault detection at an inverter circuit.

FIG. 37B illustrates an example system with a controller 40 for ground fault detection at an inverter circuit 51. The controller 40 may receive sensor data collected at the load circuit 52 and process the sensor data for analysis at the inverter 51. For example, the controller 40 may sample the sensor data, average the sensor data, or perform another statistical manipulation of the sensor data and send a value to the inverter circuit 51. The inverter circuit 51 compares the value to a ground fault threshold and identifies the ground fault in response to the value.

The controller 40 in any of these examples may control the inverter switches to discharge one or more active components (e.g., capacitor 21) in the output filter of the inverter circuit.

The controller 40 may calculate a reverse voltage or a reverse current (reverse signal) based on the current state of the inverter switches. For example, the controller 40 may turn the switches on and off to generate the predetermined output. For example, a sinusoidal signal may be generated by applying a positive pair of switches (e.g., SW1 and SW4) in an increasing duration to reach a peak of the sinusoidal signal, then applying a negative pair of switches (e.g., SW2 and SW3) in an increasing during to control the sinusoidal signal from the peak to the trough. As an alternative to this sequence, various implementations are possible to create the output signal based on different combinations of the inverter switches in a sequence. The controller 40 generates the reverse voltage or reverse current according to where in the sequence the controller 40 is currently controlling the switches. The switch sequence may vary with varying load.

In one example, the controller 40 determines whether the negative pair of switches or the positive pair of switches are being energized. When the negative pair of switches is being energized, the controller 40 provides a negative pulse for the reverse signal. When the positive pair of switches is being energized, the controller 40 provides a positive pulse for the reverse signal. In this example, the polarity is changed between the current signal to the inverter switches and the reverse signal for the ground fault.

In another example, the controller 40 determines where the output is on the output cycle. The controller 40 may make this determination based on the slope of the output signal. The slope may be determined by a discrete derivative of the output signal. Thus, in some examples, when the output is falling or rising near zero, the switch signal is not reversed but rather increased. For example, when the slope is negative but the output is positive, the controller 40 provides a negative pulse for the reverse signal. When the slope is positive but the output is negative, the controller 40 provides a positive pulse for the reverse signal. When both the slope and output are positive or both negative, the controller 40 provides the opposite polarity for the reverse signal.

In another example, the controller 40 determines where the output is on the output cycle. The controller 40 may make this determination based on the time of the output signal. The time may be the amount of time since the last zero crossing, positive to negative zero crossing, or negative to positive zero crossing. In one example, when less than a predetermined amount of time has passed since the zero crossing, no reverse signal is provided. Instead, the inverter switches are switched off. In another example, when the ground fault signal is received less than a predetermined time away from a zero crossing, a reduced reversal signal. In another example, when the ground fault signal is received less than a predetermined time away from a negative zero crossing, a positive reverse signal is provided, and when the ground fault signal is received less than a predetermined time away from a positive zero crossing, a negative reverse signal is provided.

In another example, the controller 40 generates the reverse signal based on a trigger from the ground fault and according to a pulse width from the PWM signal. For example, the controller 40 may generate the PWM signal for controlling the output of the inverter circuit such that the PWM signal includes varying sized pulses. Longer pulses increase the stored energy in the output filter, which is reflected in increasing output of the inverter circuit. The ground fault indication may be a trigger identified by the controller 40 to determine the size of the last pulse in the PWM signal. The controller 40 determines a reverse signal that is proportional to the determined last pulse. That is larger recent PWM pulses indicate more energy stored in the output filter and accordingly a reverse signal with a larger parameter is used. The parameter for the reverse signal may include any or a combination of amplitude, duration or time. The controller 40 may include a lookup table that associated pulse width values and reverse signal parameters.

The controller 40 may turn off the reverse signal and/or all control signals from the switches in response to the end of the determined duration of the reverse signal. The determined duration may be set by a predetermined time such as a quarter wavelength of the output of the circuit 11. The determined duration may be set according to a measured electrical parameter at the capacitor 21 or other component of the output filter. The electrical parameter may be voltage, charge, or current.

In addition or in the alternative, the controller 40 may send a stop signal to an interrupter device. The interrupter device may be configured to break the path of the DC link 20, which removes the source of the circuit 11. The interrupter device may break the path between the circuit 11 and the load. The interrupter device may disable a boost converter between a battery, fuel cell, or other source and the DC link connected to the circuit 11.

Referring back to FIG. 19, the controller 24 is an example implementation of controller 40 of FIGS. 33, 34, 37A and/or 37B. The controller 24 may include a processor 300, a memory 352, and a communication interface 303. The controller 24 may be connected to a workstation or another external device (e.g., control panel) and/or a database for receiving user inputs, system characteristics, and any of the values described herein. Optionally, the controller 24 may include an input device 304 and/or a sensor array 311. The sensor array 311 receives sensor measurements from as described above (e.g., load impedance, inverter output, etc.). Additional, different, or fewer components may be included. The processor 300 is configured to perform instructions stored in memory 352 for executing the algorithms described herein. The processor 300 may be compatible with a variety of engine and alternator combination and may identify an engine type, make, or model, and may look up system characteristics, settings, or profiles based on the identified engine type, make, or model. Additional, different, or fewer components may be included.

Figure 38:
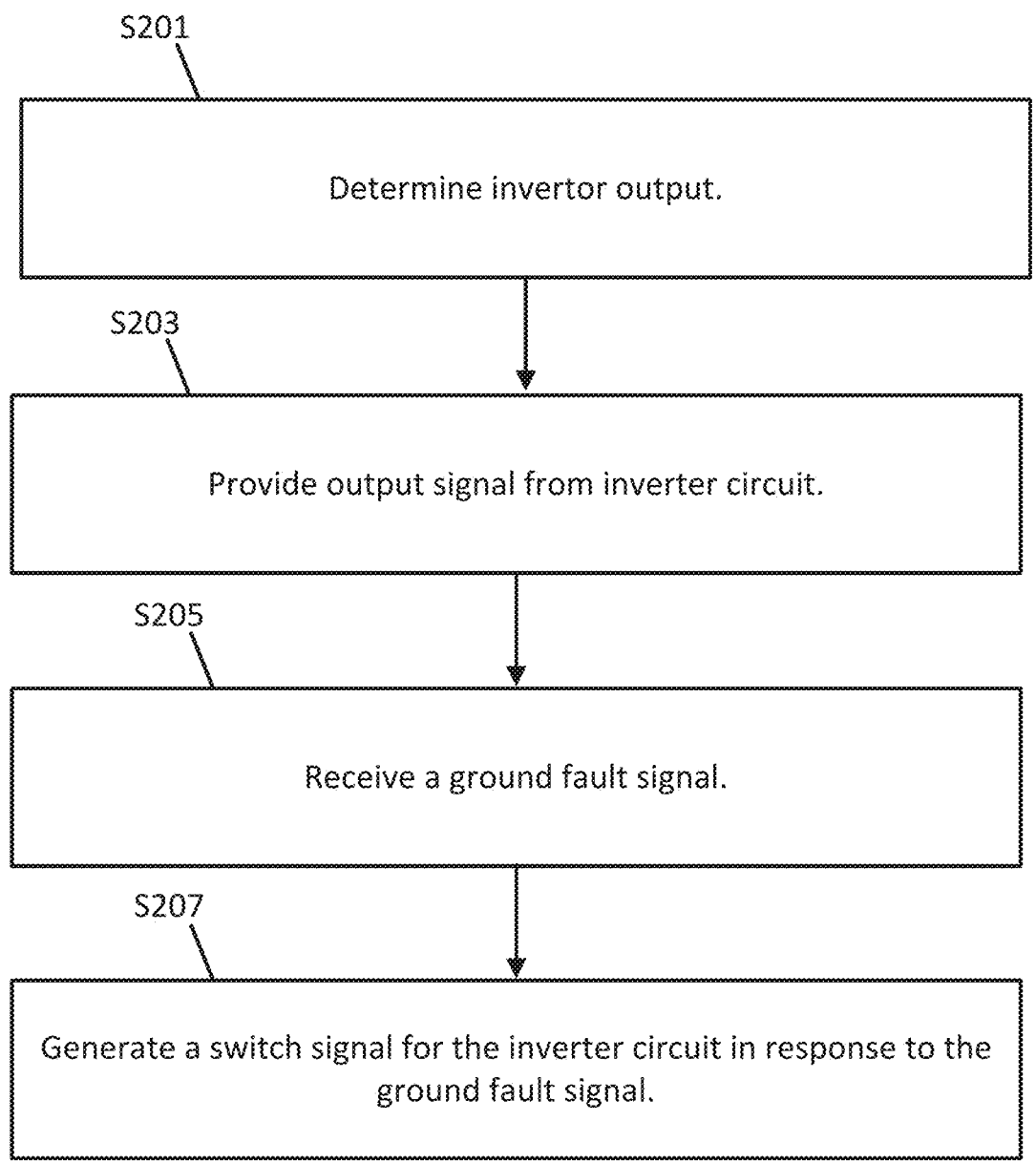
FIG. 38 illustrates an example flow chart for the system for ground fault detection.

FIG. 38 illustrates an example flow chart for the system for ground fault detection. The acts of FIG. 38 may be performed by the inverter circuit 51 for embodiments in which the controller 24 is internal to the inverter circuit 51 or alternatively by an external controller for embodiments in which the controller is external to the inverter circuit 51. Additional, different of fewer acts may be included.

At act S201, the processor 300 determines an inverter output. The processor 300 accesses from memory 352 or from real time measurement (e.g., sensing circuit or sensor array 311), a measured electrical quantity at an inverter output. The inverter output may be an actual power signal applied to a load under a specification. The specification may be a target value for a sinusoidal signal at time intervals. Alternatively, the target value may specify an amplitude range or root mean squared range for the inverter output. The target value may specify a variance or quality (e.g., THD) level for the inverter output.

At act S203, the processor 300 provides the output signal from the inverter circuit 51 to the load circuit 52. The processor 300 may generate a control signal (e.g., PWM signal) for multiple switches. The control signal may include a first PWM signal for a first pair of switches and a second PWM signal for a second pair of switches. The inverter circuit 51, in response to the control signal, defines the electrical parameters of the output signal that is provided to the load circuit 52.

At act S205, the processor 300 receives a ground fault signal. The ground fault signal may be detected at the inverter circuit 51 through a measurement of the load. For example, the controller 24 or a sensor coupled to the controller 24 monitors the impedance seen through the output terminals. The ground fault signal may be detected at an external controller or at the load circuit 52.

At act S207, the processor 300 generates a switch signal for the inverter circuit in response to the ground fault signal. The switch signal includes commands for the inverter switches. In one example, the switch signal includes time duration settings or amplitude settings for two of the switches that form a path through the inverter circuit. In one example, the switch signal includes time duration settings or amplitude settings for all of the switches in the inverter circuit. The switch signal generate in response to the ground fault signal may designate certain switch based on the switch settings before the ground fault. For example, when there are two pairs of switches, if a first pair of switches is energized under normal operation before the ground fault is detected, a second pair of switches is energized by the switch signal in response to the ground fault.

The processor 300 may include a general processor, digital signal processor, an application specific integrated circuit (ASIC), field programmable gate array (FPGA), analog circuit, digital circuit, combinations thereof, or other now known or later developed processor. The processor 300 may be a single device or combinations of devices, such as associated with a network, distributed processing, or cloud computing.

The memory 352 may be a volatile memory or a non-volatile memory. The memory 352 may include one or more of a read only memory (ROM), random access memory (RAM), a flash memory, an electronic erasable program read only memory (EEPROM), or other type of memory. The memory 352 may be removable from the network device, such as a secure digital (SD) memory card.

In addition to ingress ports and egress ports, the communication interface 303 may include any operable connection. An operable connection may be one in which signals, physical communications, and/or logical communications may be sent and/or received. An operable connection may include a physical interface, an electrical interface, and/or a data interface.

The communication interface 303 may be connected to a network. The network may include wired networks (e.g., Ethernet), wireless networks, or combinations thereof. The wireless network may be a cellular telephone network, an 802.11, 802.16, 802.20, or WiMax network. Further, the network may be a public network, such as the Internet, a private network, such as an intranet, or combinations thereof, and may utilize a variety of networking protocols now available or later developed including, but not limited to TCP/IP based networking protocols.

While the computer-readable medium (e.g., memory 352 or database) is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

One or more embodiments may include an inverter comprising: an inverter controller configured to operate a plurality of switches to provide an alternating current to an output; and at least one surge protection device for limiting a voltage on a direct current link of the inverter, the at least one surge protection device comprising: a variable resistance component coupled to the direct current link of the inverter; a sensing resistor selectively connected in parallel to the variable resistance component by a switching component; a detection device configured to measure a parameter of the sensing resistor; and a control circuit including failure sensing logic configured to detect a failure in the variable resistance component in response to information from the variable resistance component and information from the detection device for the parameter of the sensing resistor.

One or more embodiments may include an inverter wherein the variable resistance component is a first variable resistance component, the sensing resistor is a first sensing resistor, the switching component is a first switching component, and the detection device is a first detection device, inverter further comprising: a second variable resistance component coupled to the direct current link of the inverter; a second sensing resistor selectively connected in parallel to the second variable resistance component by a second switching component; and a second detection device configured to measure a voltage across the second sensing resistor.

One or more embodiments may include an inverter, wherein the failure sensing logic analyzes information from the first detection device and the second detection device to determine a conduction voltage for the first variable resistance component and the second variable resistance component. One or more embodiments may include an inverter comprising a direct current link voltage sensor coupled to the direct current link of the inverter. One or more embodiments may include an inverter wherein the failure sensing logic is configured to selectively connect a second switching resistor using the second switching component and calculate a conduction voltage for the first variable resistance component as a difference between the voltage across the second sensing resistor and the output of the direct current link voltage sensor. One or more embodiments may include an inverter, wherein the control circuit is configured to compare the conduction voltage for the first variable resistance component to an open circuit threshold and determine an open variable resistance element or open condition when the conduction voltage exceeds the threshold. One or more embodiments may include an inverter, wherein the control circuit is configured to activate a failure indicator when the conduction voltage exceeds the threshold. One or more embodiments may include an inverter, wherein the control circuit is configured to compare the conduction voltage for the first variable resistance component to a shorted range and determine shorted variable resistance element or open condition when the conduction voltage is within the shorted range. One or more embodiments may include an inverter, wherein the control circuit is configured to activate a failure indicator when the conduction voltage is within the shorted range. One or more embodiments may include an inverter, wherein the failure indicator includes a message to a management device. One or more embodiments may include an inverter comprising a fuse connected to the first variable resistance component, wherein the control circuit is configured to determine the fuse is blown in response to data from the direct current link voltage sensor. One or more embodiments may include an inverter wherein the control circuit is configured to activate a failure indicator when the fuse is blown. One or more embodiments may include an inverter wherein the variable resistance component includes a metal oxide varistor (MOV), a gas discharge tube, or a Zener diode. One or more embodiments may include an inverter, wherein the control circuit generates a control signal for operation of a semiconductor component, in parallel with the variable resistance component, in response to an output of a direct current link voltage sensor.

One or more embodiments may include a method for limiting a voltage on a direct current link of an inverter with a surge suppression device including a variable impedance component and a sensing component, the method comprising: receiving measurement data from a voltage detection device configured to measure a voltage across the sensing component; performing an analysis of the measurement data for the voltage across the sensing component; determining a conduction voltage for the variable impedance component based on the analysis; performing a comparison of the conduction voltage and a threshold; and signaling a failure for the inverter in response to the comparison. The method may include receiving second measurement data for the direct current link of the inverter, wherein the analysis includes the second measurement data.

One or more embodiments may include a system including an inverter controller configured to operate a plurality of switches to provide an alternating current to an output; and a plurality of surge protection devices for limiting a voltage on a direct current link of an inverter, each surge protection device comprising: a plurality of variable impedance components coupled to the direct current link of the inverter; a plurality of sensing components selectively connected in parallel to the plurality of variable impedance components; one or more detection devices configured to measure a parameter of the plurality of sensing components; and a control circuit including failure sensing logic configured to detect a failure in the one of the plurality of variable impedance components in response to information from the one or more detection devices for the parameter. The system may include an indicator configured to provide a user with an indication of the failure, wherein the inverter controller is configured to disconnect the inverter from a power grid in response to the failure and/or wherein the inverter controller is configured to generate a notification to replace one of the plurality of surge protection devices in response to the failure.

One or more embodiments may include an inverter system having an inverter controller and at least one surge protection device. The inverter controller is configured to operate multiple switches to provide an alternating current to an output. The at least one surge protection device is configured to limit a voltage on a direct current link of the inverter. The at least one surge protection device includes a variable resistance component coupled to the direct current link of the inverter, a sensing resistor selectively connected in parallel to the variable resistance component by a switching component, a detection device configured to measure a parameter of the sensing resistor, and a control circuit including failure sensing logic configured to detect a failure in the variable resistance component in response to information from the variable resistance component and information from the detection device for the parameter of the sensing resistor.

One or more embodiments may include a circuit for minimizing energy provided to a ground fault, the circuit comprising: a source; a plurality of switches including a first side pair of switches and a second side pair of switches configured to provide an output signal based on the source; an output filter including one or more energy storage elements coupled to the first side pair of switches or the second side pair of switches; and a controller configured to receive a ground fault signal that indicates a fault has occurred and configured to generate a switch signal for the plurality of switches for a minimum energy state of the output filter and in response to the ground fault signal. The one or more energy storage elements includes: a first inductor coupled to at least the first side pair of switches of the plurality of switches, a second inductor coupled to at least the second side pair of switches of the plurality of switches, and at least one capacitor coupled to the first inductor and the second inductor for an output of the circuit for ground fault correction, wherein the switch signal in response to the ground fault signal changes a state of at least one of the plurality of switches, wherein the at least one of the plurality of switches includes the first side pair of switches and the second side pair of switches, and/or wherein the switch signal in response to the ground fault signal reverses a plurality of the outputs of the circuit for ground fault correction. The ground fault signal may be generated by an external ground fault detector and/or detected from an impedance from the output filter to ground, wherein the impedance is a capacitive impedance or a resistive impedance. The switch signal may be configured to change the plurality of switches to control the output signal to zero voltage, wherein a time elapsed between a receipt of the ground fault signal at the output signal reaching substantially zero voltage is less than a quarter cycle of the output signal. The switch signal may include a first pulse width modulated signal for the first side pair of switches and a second pulse width modulated signal for the second side pair of switches, wherein energy is actively removed from the output filter and stored internal to an inverter including the circuit after a ground fault signal is received.

One or more embodiments may include a method for ground fault correction comprising: providing an output signal via a plurality of switches including a first side pair of switches coupled to a first inductor and a second side pair of switches coupled to a second inductor; receiving, at a controller, a ground fault signal that indicates a fault has occurred; and generating a switch signal for the plurality of switches in response to the ground fault signal, the switch signal actively controlling the output signal to a threshold, wherein the output signal is a voltage and the threshold is zero, and/or wherein the switch signal in response to the ground fault signal reverses a plurality of the outputs for ground fault correction. The ground fault signal may be generated by an external ground fault detector and/or detected from an impendence from an output filter to ground.

One or more embodiments may include an inverter circuit including an input and an output; a ground fault sensor coupled to the inverter circuit and configured to generate a fault signal that indicates a ground fault has occurred; a controller configured to receive the ground fault signal and generate a reverse signal for operation of the inverter circuit that reverses energy from the output of the inverter circuit to the input of the inverter circuit, and a plurality of switches in the inverter circuit including a first side pair of switches and a second side pair of switches configured to provide the output, wherein the reverse signal changes a state of the first side pair of switches or the second side pair of switches.

One or more embodiments may include a circuit for minimizing energy provided to a ground fault includes a source, a multiple switches, an output filter, and a controller. The switches include a first side pair of switches and a second side pair of switches configured to provide an output signal based on the source. The output filter includes one or more energy storage elements coupled to the first side pair of switches or the second side pair of switches. The controller is configured to receive a ground fault signal that indicates a fault has occurred and configured to generate a switch signal for the switches for a minimum energy state of the output filter and in response to the ground fault signal.

We claim:

1. An apparatus for the suppression of energy to a fault, the apparatus comprising:
   an inverter including a direct current link;
   a voltage detection device configured to monitor at least one sensing resistor selectively connected to the inverter;
   a direct current link voltage sensor coupled to the direct current link of the inverter; and
   a controller configured to receive first measurement data from the direct current link voltage sensor of the inverter and second measurement data from the voltage detection device and determine a conduction voltage based on the first measurement data and the second measurement data.

2. The apparatus of claim 1, further comprising:
   at least one variable resistance component coupled to the at least one sensing resistor, wherein the controller determines the conduction voltage for the at least one variable resistance component.

3. The apparatus of claim 2, wherein the at least one variable resistance component includes a first variable resistance component coupled to a positive node of the direct current link of the inverter and a second variable resistance component coupled to a negative node of the direct current link of the inverter.

4. The apparatus of claim 1, wherein the controller performs a comparison of the conduction voltage to a threshold.

5. The apparatus of claim 4, wherein the threshold is an open condition threshold.

6. The apparatus of claim 4, wherein the threshold is a shorted condition threshold.

7. The apparatus of claim 1, wherein the controller detects a failure in at least one variable resistance component in response to information from the at least one variable resistance component and information from the voltage detection device for the sensing resistor.

8. The apparatus of claim 1, wherein the controller generates a signal indicative of a failure of the inverter in response to the comparison.

9. The apparatus purge suppression of claim 8, wherein the signal includes a message to disconnect the inverter from a power grid in response to the failure.

10. The apparatus of claim 8, wherein the signal includes a message to a management device that monitors surge suppression modules across multiple systems.

11. The apparatus of claim 1, wherein the direct current link voltage sensor is integrated into the controller.

12. A method for the suppression of energy to a fault, the method comprising:
    receiving first measurement data from a direct current link voltage sensor of an inverter;
    receiving second measurement data from a voltage detection device configured to measure a parameter at a sensing resistor selectively coupled to the inverter;
    performing an analysis of the first measurement data from the direct current link voltage sensor and the second measurement data for the voltage across the sensing resistor;
    determining a conduction voltage for at least one variable resistance component based on the analysis;
    performing a comparison of the conduction voltage and a threshold; and
    detecting a failure in the at least one variable resistance component in response to the comparison.

13. The method of claim 12, further comprising:
    signaling the failure in the variable resistance component.

14. The method of claim 13, wherein the signaling includes a communication message for another device.

15. The method of claim 14, wherein the communication message instructs an inverter controller to disconnect the inverter from a power grid in response to the failure.

16. The method of claim 14, wherein the communication message is sent to a management device that monitors the inverter.

17. The method of claim 14, wherein the communication message is sent to a manufacturer device for logging errors that occur in the installed systems.

18. The method of claim 14, wherein the at least one variable resistance component includes a first variable resistance components coupled to a positive node of the direct current link of the inverter and a second variable resistance component coupled to a negative node of the direct current link of the inverter.

19. The method of claim 14, wherein the threshold is an open condition threshold or a shorted condition threshold.

20. A method comprising:
receiving first measurement data from a direct current link voltage sensor of an inverter;
receiving second measurement data from a voltage detection device configured to measure a parameter at a sensing resistor selectively coupled to the inverter; and
detecting a failure in a variable resistance component based on analysis of the first measurement data from the direct current link voltage sensor and the second measurement data for the voltage across the sensing resistor.

* * * * *

UNITED STATES PATENT AND TRADEMARK OFFICE
CERTIFICATE OF CORRECTION

| | |
|---|---|
| PATENT NO. | : 11,600,988 B2 |
| APPLICATION NO. | : 16/925251 |
| DATED | : March 7, 2023 |
| INVENTOR(S) | : Isaac S. Frampton et al. |

It is certified that error appears in the above-identified patent and that said Letters Patent is hereby corrected as shown below:

In the Claims

Column 36:
Line 24 Claim 9, delete "surge suppression".

Signed and Sealed this
Eighteenth Day of April, 2023

Katherine Kelly Vidal
Director of the United States Patent and Trademark Office